United States Patent [19]

Shibata et al.

[11] Patent Number: 5,587,668
[45] Date of Patent: Dec. 24, 1996

[54] SEMICONDUCTOR DEVICES UTILIZING NEURON MOS TRANSISTORS

[76] Inventors: Tadashi Shibata, 5-2, Nihondaira, Taihaku-ku, Sendai-shi, Miyagi-ken 980, Japan; Tadahiro Ohmi, 1-17-301, Komega bukuro 2-chome, Aoba-ku, Sendai-shi, Miyagi-ken 980, Japan

[21] Appl. No.: 119,157
[22] PCT Filed: Mar. 21, 1993
[86] PCT No.: PCT/JP92/00347
§ 371 Date: Sep. 20, 1993
§ 102(e) Date: Sep. 20, 1993
[87] PCT Pub. No.: WO92/16971
PCT Pub. Date: Oct. 1, 1992

[30] Foreign Application Priority Data

Mar. 21, 1991 [JP] Japan .................... 3-083152

[51] Int. Cl.[6] .................................... H03K 19/017
[52] U.S. Cl. ................... 326/36; 326/119; 326/83
[58] Field of Search ................... 326/119, 121, 326/83, 36

[56] References Cited

U.S. PATENT DOCUMENTS

| 4,950,917 | 8/1990 | Holler et al. . |
| 4,951,239 | 8/1990 | Andes et al. . |
| 4,961,002 | 10/1990 | Tam et al. . |
| 4,999,525 | 3/1991 | Park et al. . |
| 5,021,693 | 6/1991 | Shima . |
| 5,028,810 | 7/1991 | Castro et al. . |
| 5,258,657 | 11/1993 | Shibata ................... 326/35 |

FOREIGN PATENT DOCUMENTS

| 59-175770 | 10/1984 | Japan . |
| 3-6679 | 1/1991 | Japan . |

*Primary Examiner*—Edward P. Westin
*Assistant Examiner*—Andrew Sanders
*Attorney, Agent, or Firm*—Baker & Daniels

[57] ABSTRACT

A semiconductor device by which a circuit having the same functions as those of the conventional circuit is realized with a very small number of elements, and complex logical functions can be designed simply, and further, its layout is also possible. A semiconductor device made up of at least one neuron MOS transistor having a gate electrode provided in a potentially floating state in a portion for isolating a source and drain region via a first insulation film, and plural control electrodes which are capacitively coupled to the floating gate electrode via a second insulation film, is characterized in that the first signal is inputted to a first control gate electrode of the first neuron MOS transistor, the first signal is inputted to a first inverter comprising one or more stages, and the output of the first inverter is inputted to a second control gate electrode which is one of the plural control gate electrodes other than the first control gate electrode.

36 Claims, 40 Drawing Sheets

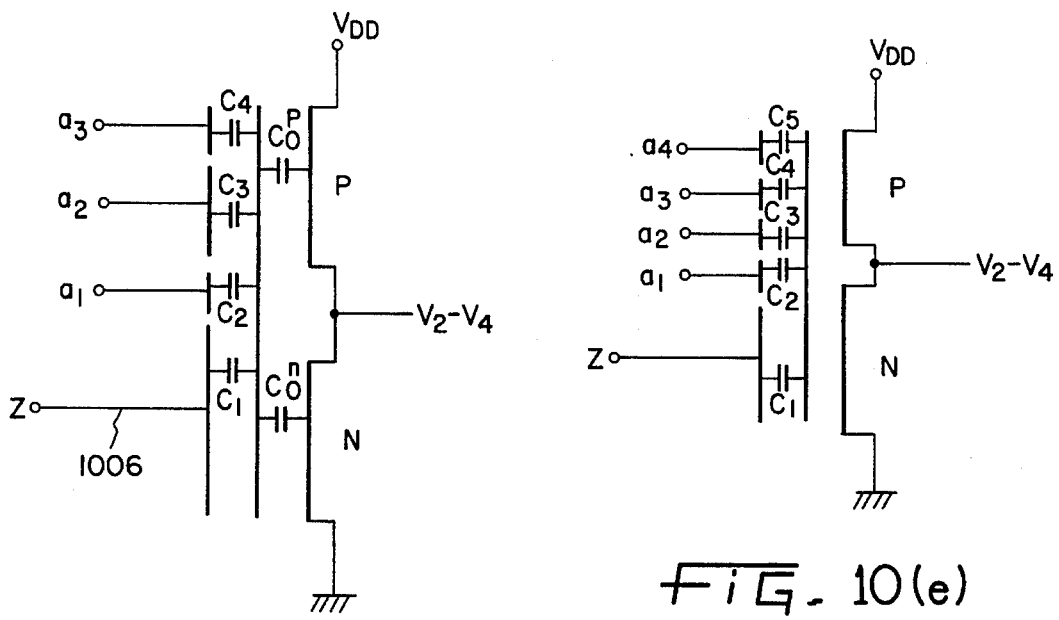
FIG. 10(d)
FIG. 10(e)
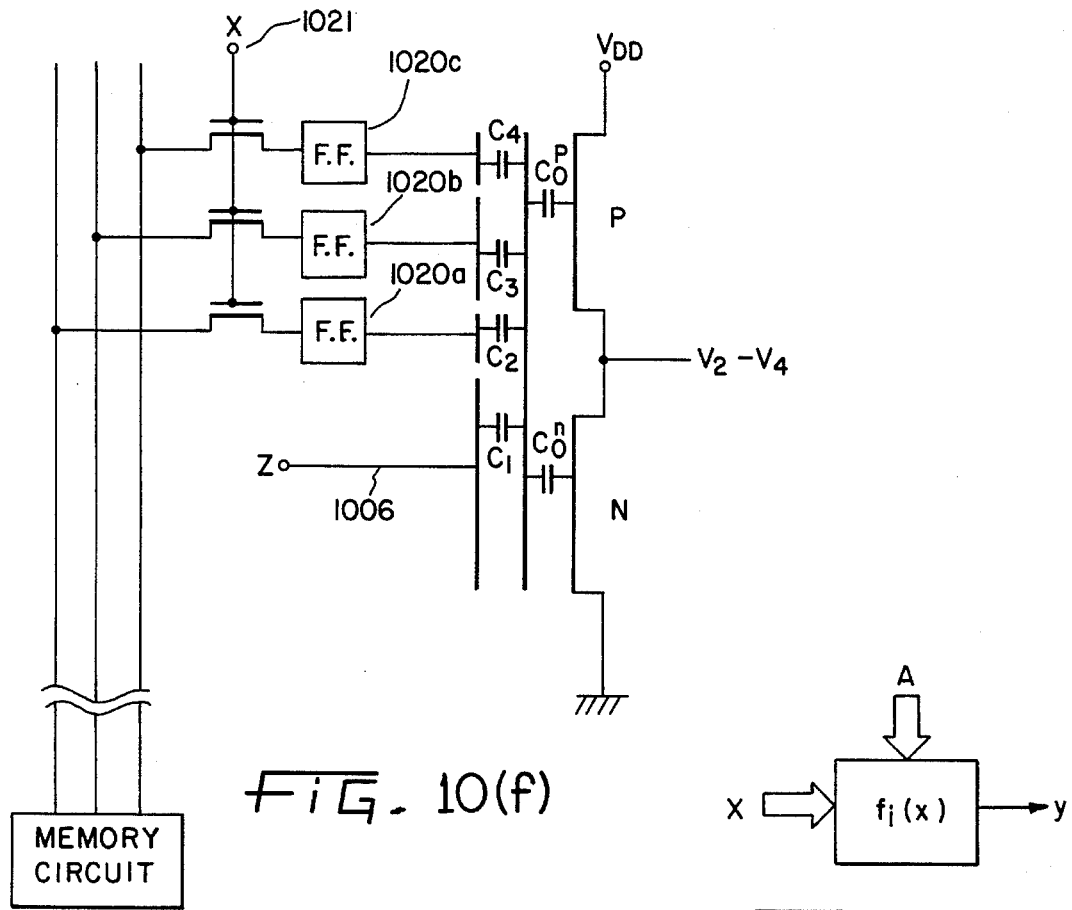
FIG. 10(f)
FIG. 10(g)

$(V_a, V_b, V_c, V_d) = (1,1,1,1)$ $(V_a, V_b, V_c, V_d) = (1,1,1,0)$ $(V_a, V_b, V_c, V_d) = (1,1,0,1)$ $(V_a, V_b, V_c, V_d) = (0,1,1,0)$

SEMICONDUCTOR DEVICES UTILIZING NEURON MOS TRANSISTORS

TECHNICAL FIELD

The present invention relates to a semiconductor integrated circuit device, and in particular, provides a semiconductor integrated circuit device possessing a completely novel architecture in order to realize an ultra-large scale integration and ultra-high function of the semiconductor logical integrated circuit.

BACKGROUND ART

Presently, developments in semiconductor integrated circuit technology are proceeding at an astonishing rate; for example, using the example of dynamic memory, from 4 megabits to 16 megabits are already in production, while the development of ultra-high density memories having a capacity of more than 64 megabits has been completed. In memory chips having a capacity of 64 megabits, in actuality, approximately 120 million MOS transistors are integrated on a silicon chip of at most 1 cm$^2$. The present astonishing progress in LSI technology has been achieved as a result of progress in microstructurization of elements and in microfabrication technology. Accordingly, semiconductor memories, the capacity of which can be expanded simply by the accumulation on a single chip of a great number of memory cells having identical structures, have been attained at a truly astonishing rate of progress.

However, the record progress attained with regard to memory has been unattainable in the case of logical LSI. It is true that high function CPUs from 16 to 32 bit and 64 bit and various types of high function logical LSI have been developed; however, on the threshold of the ultra LSI era, great problems are being confronted in the design and production of logical LSI.

The first problem is that of how to design such chips. Logical LSI chips are configured logically to construct logic with binary signals having a value of 1 or 0 by means of the combination of the MOS transistors which function as switching elements. In this method, because a large number of transistors must be connected to one another in order to configure simple logical functions, there are problems in that:

[1] There is a limit to the increase in the degree of integration.

[2] The layout pattern is complicated,

[3] The number of interconnections increases, and the like. In order to solve the problem of [1] above, it is necessary to be creative in layout and minimize, as much as possible, wasted surface area.

The design of conventional 8 bit microprocessors and the like was diligently conducted by trained personnel; however, with the increase in scale of logical circuits and the increase in the number of elements, the manual design of such logical circuits requires astronomical amounts of time, that it has become, in practice, impossible. In the case of memory LSI, the possibility of layout design by means simply of the repetitive arrangement in a plane of a great number of patterns of sense amplifiers or memory cells having identical structures as is a point which essentially differs from the case of logical LSI. There has been much research and development in the so-called CAD (Computer Aided Design) field, in which computers are used in the circuitry and layout design of logical LSI; however, the present state of such efforts is such that the degree of integration attainable thereby is greatly inferior to the degree of integration obtainable manually. The CAD is presently in wide use to arrange basic gates, such as AND (logical product), OR (logical sum), or XOR (exclusive logical sum) gates, or flip flops or the like as building blocks on a chip, and connecting these building blocks to one another.

It is certain that the amount of time required for design is shortened; however, an increase in the degree of integration cannot be expected. Furthermore, as a huge number of interconnects connecting element to element run vertically and horizontally, the situation becomes such that the delay in signal propagation in the interconnection determines the operational speed of the logical LSI, and the effort to increase the speed is presented with a number of difficulties. The introduction of multivalued logical circuits is effective in solving the problems presented by the increase in interconnection. This means, in other words, the introduction of circuits having not merely the two possible values of "1" or "0", but rather, for example, the four values 0, 1, 2, or 3. It has been discovered that by means of this, it is possible to greatly reduce the number of interconnects in logical LSI.

However, the construction of such multivalued logical circuits by means of the present technology is beset by a number of difficulties; for example, more complex circuitry is necessary, and furthermore, the manufacturing production processes are complex, and the like, so that the practical application thereof is not realizable in the immediate future.

The problems present in the current logical LSI technology will be explained more clearly hereinbelow by the use of an example.

FIGS. 35(a) and 35(b) depict logical circuits which perform, with respect to three binary inputs A, B, and C, the following calculations:

$$Y_1=(A+B+C)\cdot\overline{(A+B+C)}$$

and $$Y_2=A\cdot B\cdot C+\bar{A}\cdot\bar{B}\cdot\bar{C}$$

In the diagrams, reference numerals 3501 and 3502 indicate NOR circuits having, respectively, 3 inputs and 2 inputs, while reference numeral 3503 indicates an inverter. Furthermore, reference numerals 3504 and 3505 indicate NAND circuits, having, respectively, 3 inputs and 2 inputs. If the inverter, the 3 input NOR circuit and the 3 input NAND circuit are constructed utilizing, for example, CMOS technology, the the structure thereof are as shown in FIGS. 35(c), 35(d), and 35(e). The reference N and P in these diagrams indicate an NMOS transistor 3506 and a PMOS transistor 3507.

As is clear from FIGS. 35(a) and 35(b), complicated circuitry is required in order to express a simple logical function. The number of MOS transistors required for these circuits is 22, both in the case of the circuit $Y_1$ and the circuit $Y_2$. The circuit shown in FIG. 36 is a circuit which calculates $Y_2$; the structure thereof is different from that of FIG. 35(b). The AND and NOR functions are expressed by means of a single CMOS gate 3601, and this somewhat simplified structure reduces the number of transistors necessary to 20. In the realization of a circuit for the calculation of $Y_1$ by means of a similar type of structure, the final stage inverter 3402 may be omitted, so that the necessary number of transistors is further reduced to 18. However, the circuit structure is complicated, and the transistors are connected to one another in such a manner that a number of signal interconnects cross, so that it is clear that a number of problems are caused in the course of pattern layout.

Next, a multivalued logical circuit will be discussed.

FIG. 37 (a) shows an example of the characteristics of a binary multiple threshold logical element which performs important functions in multivalued logic, while FIG. 37(b) shows an example of circuitry which realizes such an element. A binary multiple threshold logical element is an element which, as shown in FIG. 37(a), outputs an output voltage of either 0 (OV) or 1 ($V_{DD}$) with respect to an inputted voltage x which varies within a range of from OV to $V_{DD}$ (for example, 5V). In the diagram, references a, b, c, and d indicate input voltages at which the characteristics change from 1 to 0 or from 0 to 1; these have the respective values of (⅕) $V_{DD}$, (⅖) $V_{DD}$, (⅘) $V_{DD}$, and (9/10) $V_{DD}$. The circuitry shown in FIG. 37(b) is used to realize such characteristics.

For the purpose of simplicity, the circuit in FIG. 37(b) is shown as a circuit incorporating NMOS transistors (3701, 3702, 3703, and 3704) and resistor 3705. In place of resistor 3705, it is also possible to use a circuit having an E/D structure utilizing a depression mode MOS transistor as a load element. In the diagram, what is indicated by the formulas $V_{TH}$=a, $V_{TH}$=b, and the like, is the respective threshold values of the driver transistors constructing the inverters. In this case, the inversion voltage of the inverter (the input voltage at which 0 and 1 are inverted) is approximately identical to this threshold value. The operation of the circuit may be easily understood. When conditions are such that 0<X<a, then inverters 3706, 3707, and 3708 are all in an OFF state, and $V_{DD}$ is outputted. Accordingly, transistors 3701 and 3704 are in an ON state, and transistors 3702 and 3703 are in an OFF state, so that y is at a high level and is equal to $V_{DD}$. When conditions change such that a<x<b, transistor 3703 changes to an ON state, so that y becomes equal to 0. When conditions are such that b<x<c, transistor 3704 is in an OFF state, so that y again becomes equal to $V_{DD}$. When conditions are such that c<x<d, transistor 3702 is in an ON state, so that the output becomes equal to 0; however, when d<x, transistor 3701 is an OFF state, and y again becomes equal to $V_{DD}$.

In order to construct the circuit, a total of 13 transistors are necessary; 8 NMOS driver transistors, and 5 load transistors (in the case where an E/D structure is adopted). However, when a E/R structure or a E/D structure is employed, in the case where the inverter is in an ON state, a direct current is caused to flow, and power dissipation is greatly increased, so that such a structure is disadvantageous for ultralarge-scale integration. If the circuit shown in FIG. 37(b) is constructed using CMOS transistors, in order to reduce the power dissipation, the number of PMOS transistors on the load side is increased, and a total of 16 transistors (8 NMOS transistors and 8 PMOS transistors) becomes necessary.

The need to use a large number of transistors represents a disadvantage when the attainment of large scale integration is desired. However, a larger problem lies in the fact that a large number of transistors having different threshold values are needed. For example, in the example shown in the Figure, at least four types of threshold values a, b, c, and d, are necessary. Normally, the adjustment of threshold values is accomplished by using an ion implantation method, introducing impurity ions into the channel region, and varying the concentration thereof; thus, at least four ion implantations are required for threshold value adjustment.

Furthermore, in an CMOS inverter, the inversion voltage of this inverter is determined as a function of the threshold values of both the NMOS transistor and the PMOS transistor, so that it is also necessary to adjust the threshold value of the PMOS transistor. That is to say, it is necessary to precisely control 8 threshold values by means of at least 8 ion implantations. If the threshold value of any one of these transistors deviates from the designed value, the circuit will not be able to operate normally, so that the production process margin is extremely small. In addition to the fact that the production process is extremely long, it also requires an extremely high degree of control, so that little progress has been made in the practical application of multivalued logical circuits.

Furthermore, in order to exchange data between a multivalued logical circuit and a binary logic digital logic circuit which is connected thereto, multivalue-to-binary conversion between binary and multivalued values is necessary. In particular, a A/D converter is necessary for the conversion of multivalued signals to binary signals; however, this necessitates a number of elements, which presents extreme difficulties in the case where high integration is to be attained.

For example, FIG. 38 shows an example of a parallel type high speed A/D converter circuit; this circuit converts an analog signal $V_a$ to a binary signal having the 3 bits $A_2$, $A_1$, and $A_0$. An explanation of the detailed operation of this circuit is omitted here; however, the circuit comprises 7 comparators, 7 registers, and a combined logical circuit, and does not merely require an extremely large number of elements, but also possesses a very large number of interconnects. It is extremely difficult to attain large scale integration of this type of circuit.

As explained above, in order to realize even simple logical functions with logical circuits employing conventional technology, a large number of elements are necessary, and the degree of integration does not increase. Furthermore, because there is no effective process for the simple design and layout of a complicated logical circuit, a large amount of time is necessary for the design of a large scale logical circuit. CAD, which utilizes a computer, employs a building block method, so that the complicated interconnection limits the increase in the degree of integration and the operation speed. With respect to multivalued logical LSI, which has attracted attention as a method which is extremely effective in the reduction of the number of interconnects, to the extent that conventional element technology or circuit technology is employed, the cicuitry is complicated, and the manufacturing process is extremely burdensome, so that in the present state of affairs, practical application presents extreme difficulties.

In addition to this, the present state of affairs is such that the advent of logical LSI having a completely new architecture which differs from conventional logical circuit structure has been greatly desired. The reason for this is that the hardware of current LSI cannot be altered once it has been produced, and a variety of calculations are executed by means of alterations in data or programs which are applied to the circuit. On the brink of the ultra-LSI age, a new breakthrough capable of solving these various problems has been strongly desired.

The present invention was designed in order to solve the problems described above; it provides a semiconductor device which realizes a circuit possessing functions identical to those of conventional circuits by the use of an extremely small number of elements, and which permits simple design and layout of complicated logical functions.

DISCLOSURE OF THE INVENTION

The semiconductor device of the present invention is composed of at least one neuron MOS transistor comprising a semiconductor region of one conductivity type on a substrate, a source region and a drain region of the opposite conductivity type provided in the semiconductor region, a floating gate electrode in a potentially floating state provided in the portion which isolates the source region and the drain region via a first insulation film, and a plurality of control gate electrodes which are capacitively coupled to the floating gate electrode via a second insulation film, wherein a first signal is inputted to a first control gate electrode of the first neuron MOS transistor, the first signal is inputted into a first inverter comprising at least one stage, and the output thereof is inputted into a second control gate electrode, which is one of the control gate electrodes other than the first control gate electrode.

Function

The semiconductor device in accordance with the present invention makes possible the realization of logical LSI by means of a number of elements which is extremely small in comparison with the number required in the conventional technology, makes possible ultralarge-scale integration, and furthermore, makes it possible to attain a high circuit speed by means of the reduction of the number of interconnects. Furthermore, the design of a circuit which realizes complex logical functions can be conducted extremely easily, so that it is possible to shorten the amount of time necessary for design, and adaptation to automatic design is easily accomplished. Furthermore, it is possible to attain a logical circuit structure having a completely new concept according to which the functions of the circuit can be freely altered simply by altering the control signals which are applied to the circuit, without changing the hardware structure, and by means of this, new architectural development of logical LSI becomes possible. Furthermore, the conversion of signals between a multivalued logic circuit and a binary logic circuit can be freely accomplished.

BRIEF DESCRIPTION OF THE DRAWINGS

FIG. 1(d) is a diagram of the relationship between the output (Vout) and input (Vin) of inverter 106a.

FIG. 8(d) is a drawing showing explanatory notes for the materials in FIG. 8(c).

FIG. 10(d) is a circuit diagram showing the case in which all controls are conducted by means of binary signals.

FIG. 10(e) is a circuit diagram showing another case in which all controls are conducted by means of binary signals.

FIG. 10(f) is a circuit diagram showing a case in which the outputs of the flip flops are directly connected, data is incorporated by means of control signals, and thereby, control is conducted.

FIG. 10(g) is a diagram expressing the function in the case in which an inversion voltage-variable inverter is used in FIG. 10(a).

$$Y_1 = (A+B+C) \cdot (\bar{A}+\bar{B}+\bar{C})$$

Figure 35A:
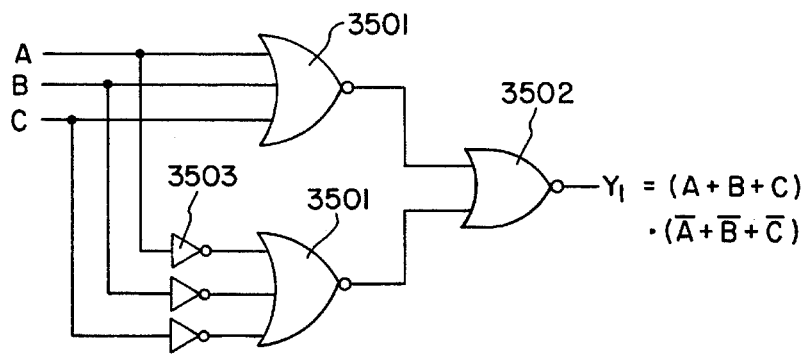
FIG. 35(a) is a diagram of a logical circuit which, with respect to 3 binary inputs A, B, and C, solves the following equation.
Figure 35B:
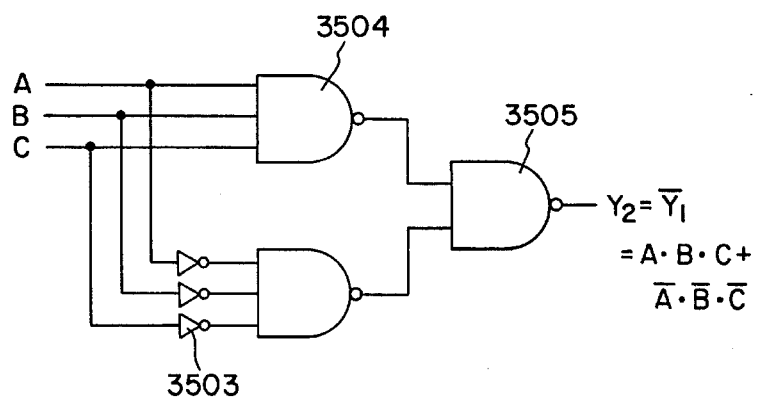

FIG. 35(b) is a diagram of a logical circuit which, with respect to 3 binary inputs A, B, and C, solves the following equation:

$$Y_2 = A \cdot B \cdot C + \bar{A} \cdot \bar{B} \cdot \bar{C}$$

Figure 35C:
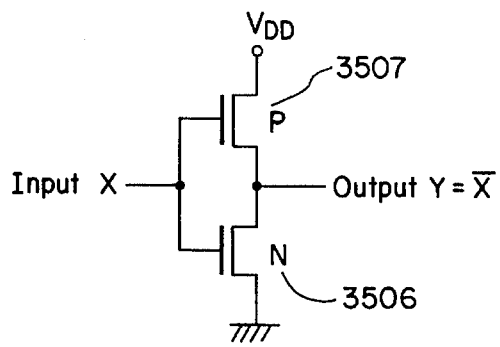

FIG. 35(c) is a block diagram of an inverter circuit in CMOS technology.

Figure 35D:
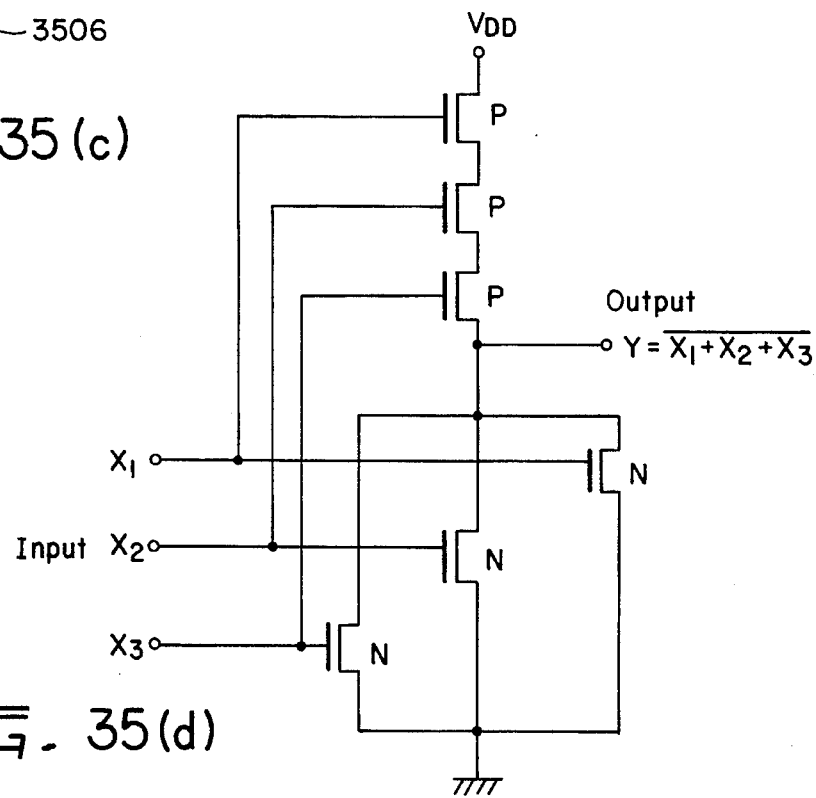

FIG. 35(d) is a block diagram of a 3-input NOR circuit in CMOS technology.

Figure 35E:
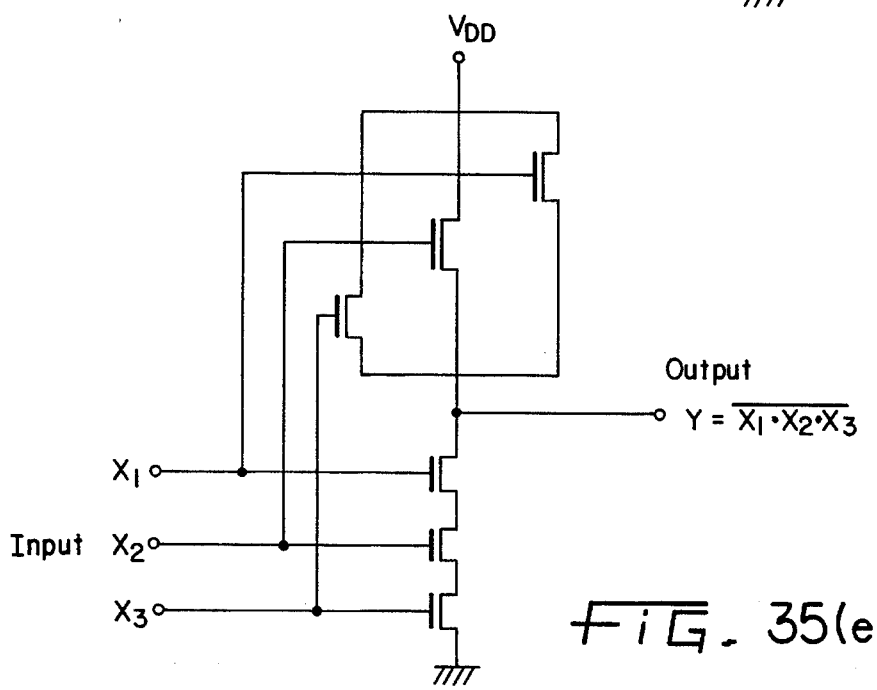

FIG. 35(e) is a block diagram of a 3-input NAND circuit in CMOS technology.

Figure 36:
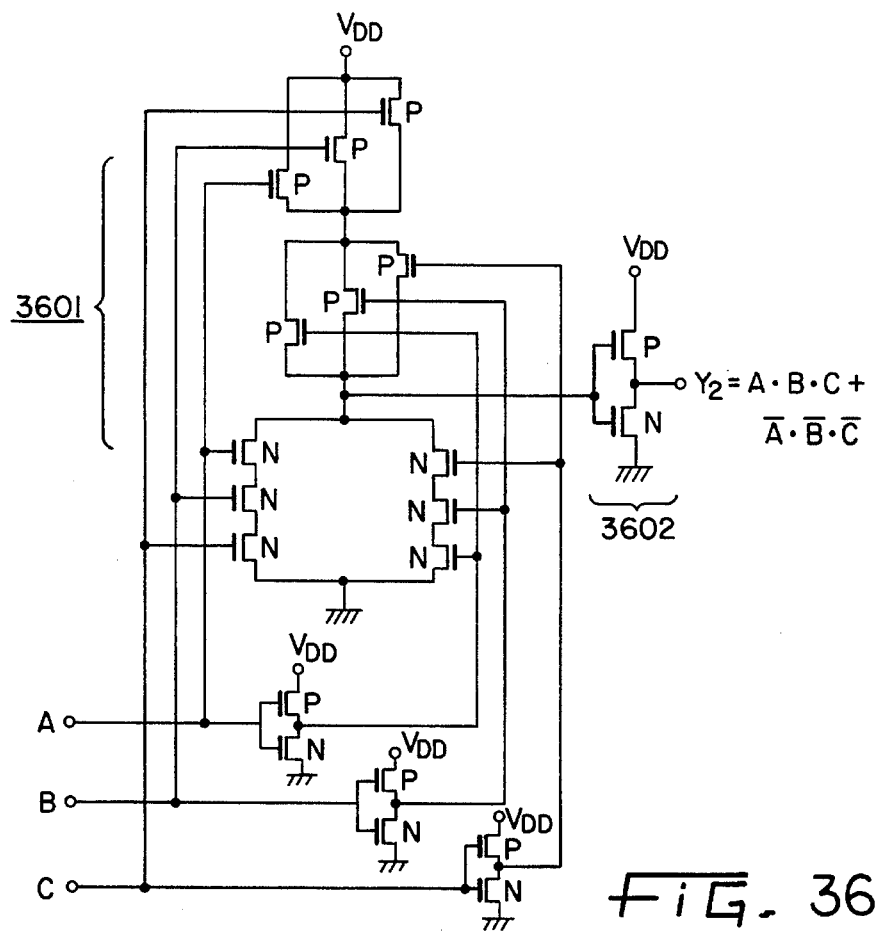

FIG. 36 is a diagram of a circuit which calculates $Y_2$ and which has a structure different from that of FIG. 35(b).

Figure 37A:
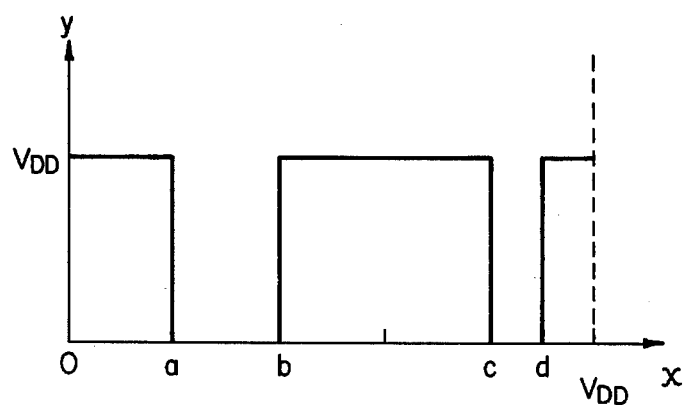

FIG. 37(a) is a diagram showing an example of the characteristics of a binary multiple threshold logical element.

Figure 37B:
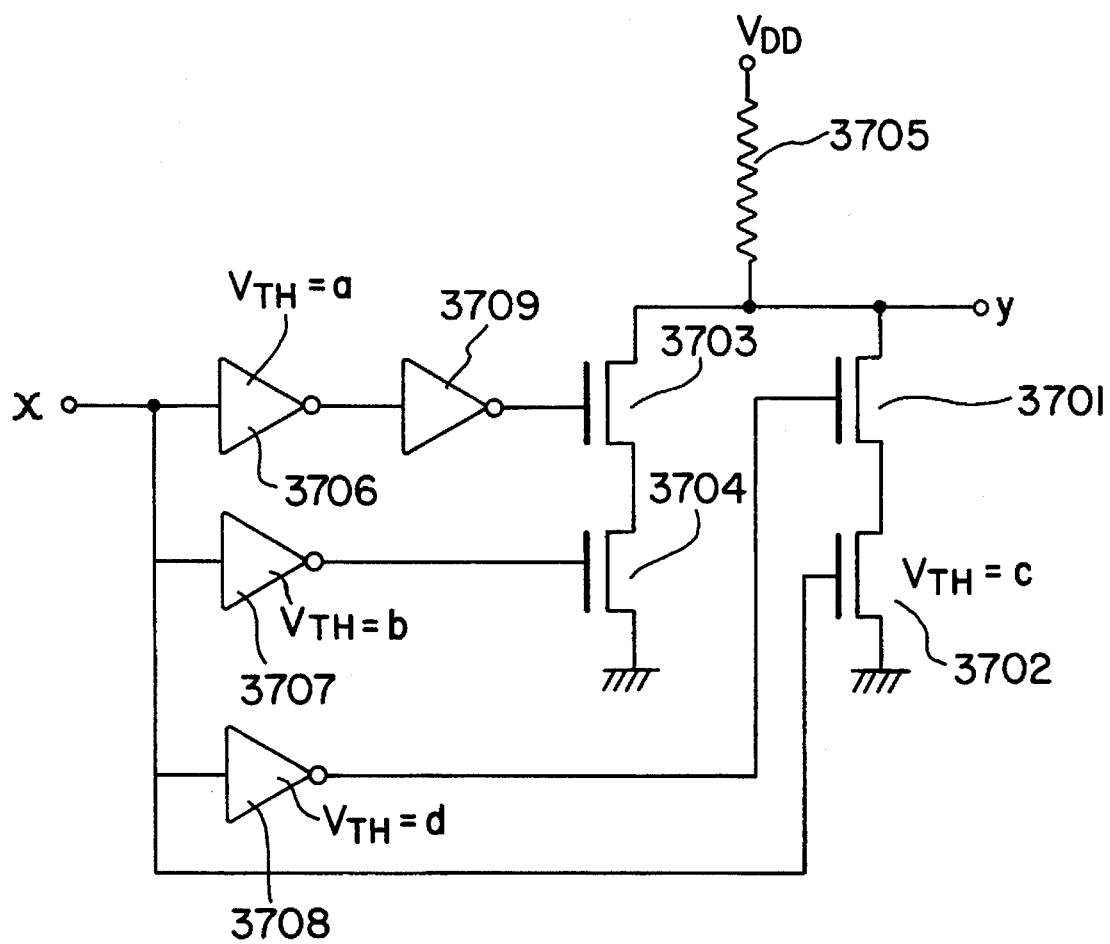

FIG. 37(b) shows an example of a circuit which realizes the characteristics of FIG. 37(a).

Figure 38:
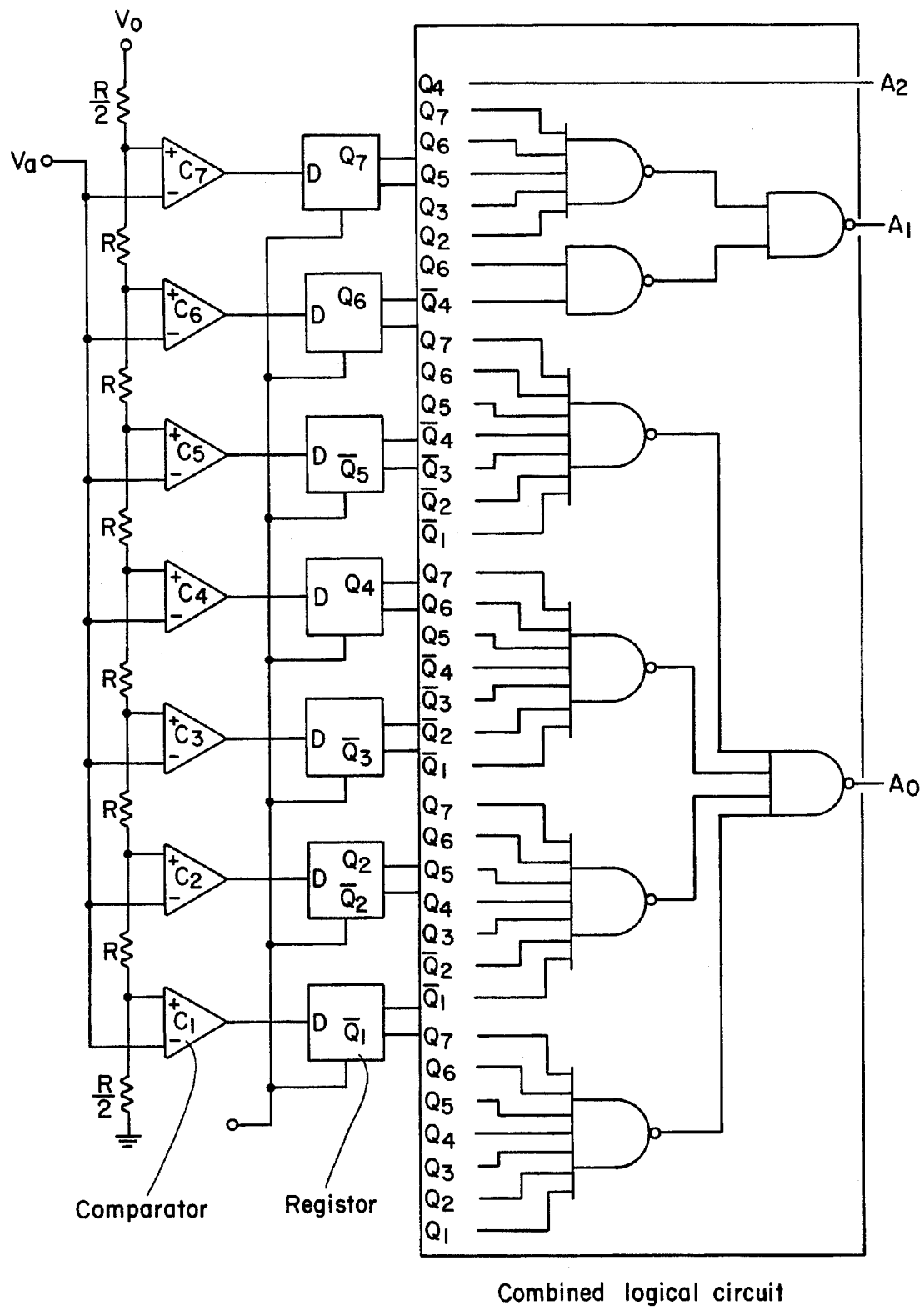

FIG. 38 is a circuit diagram of a parallel type high speed A/D converter.

DESCRIPTION OF THE REFERENCES

101 N channel neuron MOS transistor
101a drain 101b source
102 floating gate
103a, 103b, 103c control gate electrodes
104 load resistor ($R_1$)
105, 106 inverters
106a NMOS transistor
107 D/A converter
108 N channel ν MOS transistor
109 resistor ($R_2$)
111a, 111b, 111c, 111d control gate electrodes
112 output terminal

BEST MODE FOR CARRYING OUT THE INVENTION (First Embodiment)

Figure 1A:
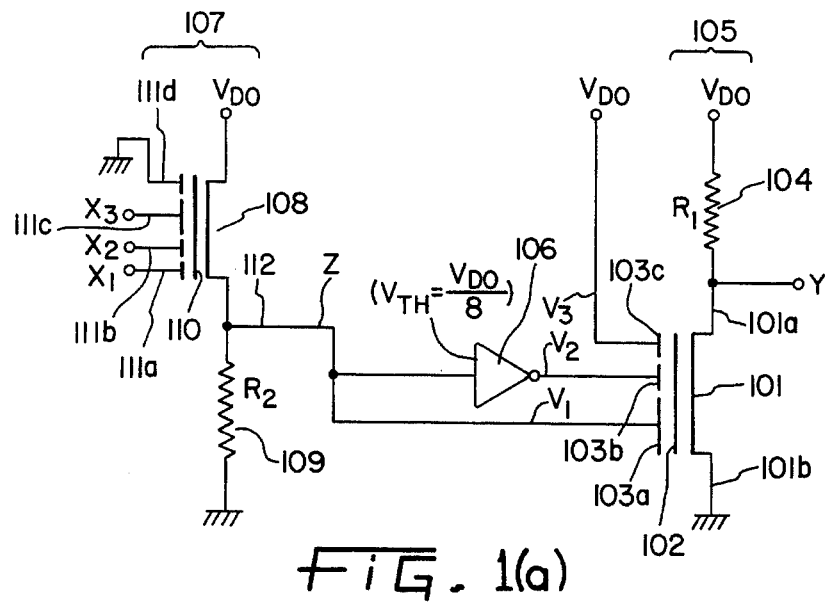
FIG. 1(a) is a block diagram of a circuit showing the first embodiment of the present invention.

FIG. 1(a) is a block diagram of a circuit showing the first embodiment of the present invention; this circuit calculates the $Y_1$ of FIG. 35(a) with respect to three binary signal inputs bits $X_1$, $X_2$, and $X_3$. In other words, this is expressed by the following formula:

$$Y=(X_1+X_2+X_3)\cdot(\overline{X}_1+\overline{X}_2+\overline{X}_3).$$

The relationship between the input signals and the output is shown in Table 1.

In the diagram, reference numeral 101 indicates a N channel neuron MOS transistor, reference numeral 102 indicates a floating gate, and reference numerals 103a, 103b, and 103c indicate 3 control gate electrodes. Neuron MOS transistors have a function similar to that of neurons, which are the nerve cells constructing the brain; such transistors are MOS type transistors having a completely novel concept which were invented in order to realize a neural computer (inventors: Tadashi Shibata, Tadahiro Ohmi, Japanese Patent Application, KOKAI(Laid Open), No. 3-6679(1991)). Hereinbelow, such transistors will be referred to as "νMOS transistors."

Figure 1B:
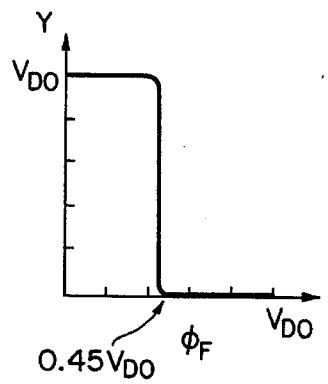
FIG. 1(b) is a diagram of the relationship between the output (Y) of inverter 105 and the floating gate potential $\phi_{F1}$.

Such νMOS transistors have extremely powerful functions, and it is an important characteristic point of the present invention that these νMOS transistors are used as basic elements. The structure and function of νMOS transistors will be explained later on the basis of FIG. 2. The drain 101a of the νMOS transistor 101 is connected to a load resistor ($R_1$) 104, and this constructs a 1-stage inverter 105. The threshold value ($V_{TH1}^*$) of the νMOS transistor 101 as seen from the floating gate is set to 0.45 $V_{DD}$. Here, the meaning of "$V_{TH1}^*$" is identical to that of an ordinary MOS transistor; when the potential of floating gate 102 becomes larger than threshold value $V_{TH1}^*$ with respect to the potential of source 101b, a channel is formed and current can flow between source 101b and drain 101a. If resistance $R_1$ is set to a sufficiently high level in comparison with the channel resistance of the νMOS transistor, then the relationship between the output (Y) of the inverter 105 and the potential $\phi_{F1}$ of the floating gate is approximately as shown in FIG. 1(b).

Figure 1C:
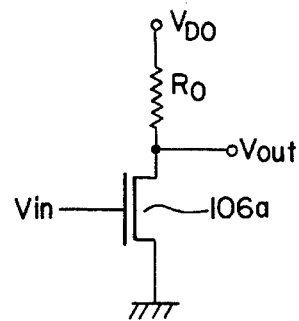
FIG. 1(c) is a block diagram of inverter 106.
Figure 1D:
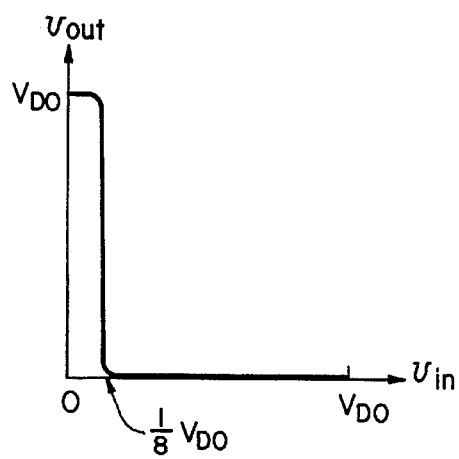

Reference numeral 106 indicates an inverter circuit; the inversion voltage $V_{TH}$ thereof is set to $V_{DD}/8$. Such a circuit can be structured, for example, as shown in FIG. 1(c); the threshold value of NMOS transistor 106a is set to $(\frac{1}{8}) V_{DD}$, and if the resistance value $R_0$ is set to a sufficiently high level in comparison with the ON resistance of the NMOS transistor 106a, the input and output characteristics thereof are as shown in FIG. 1(d). The output of this inverter is connected to control gate 103b of νMOS transistor 101.

Reference number 107 indicates an D/A converter, which converts the three-bit input signals $X_1$, $X_2$, $X_3$ to an analog signal; it comprises a source follower circuit in which an N channel n MOS transistor 108 is connected to a resistor $R_2$(109). Reference number 110 indicates the floating gate of n MOS transistor 108; the threshold value $V_{TH2}^*$, as seen from the floating gate, is set to a value of $-(\frac{1}{16})V_{DD}$. Reference numerals 111a, 111b, 111c, and 111d indicate control gate electrodes; the signals $X_1$, $X_2$, and $X_3$ are inputted into 111a, 111b, and 111c, respectively, and 111d is grounded. If the potential of the output terminal 112 of the D/A converter 107 is represented by Z, then the design is such that $$Z=(V_{DD}/8)(X_1+2X_2+4X_3)+(V_{DD}/16) \quad (1)$$

Figure 1E:
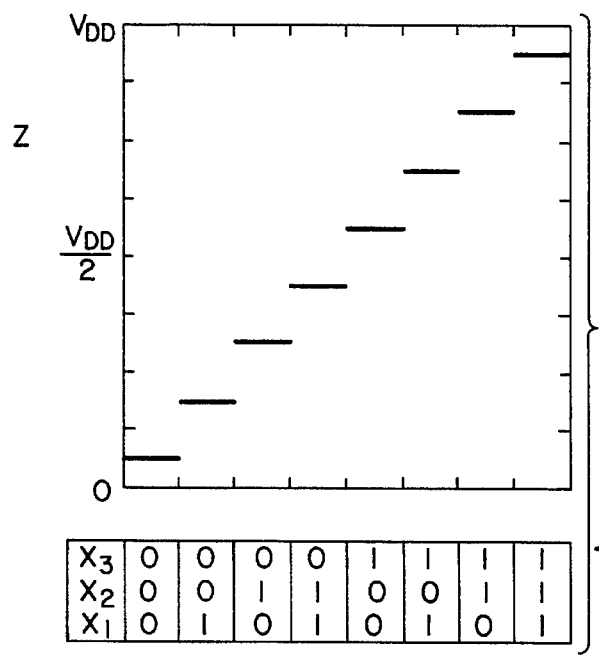
FIG. 1(e) is a diagram showing the input and output characteristics in a D/A converter 107.

Here, $X_1$, $X_2$, and $X_3$ are binary variables; "0" corresponds to 0 V, while "1" corresponds to VDD. The relationship between the values of X1, X2, X3, and Z, is shown in FIG. 1(e). Prior to discussing the design method of the νMOS transistor which allows the transistor to obtain the characteristics represented in formula (1), a brief explanation will be given with respect to the operation of the n MOS transistor itself.

Figure 2A:
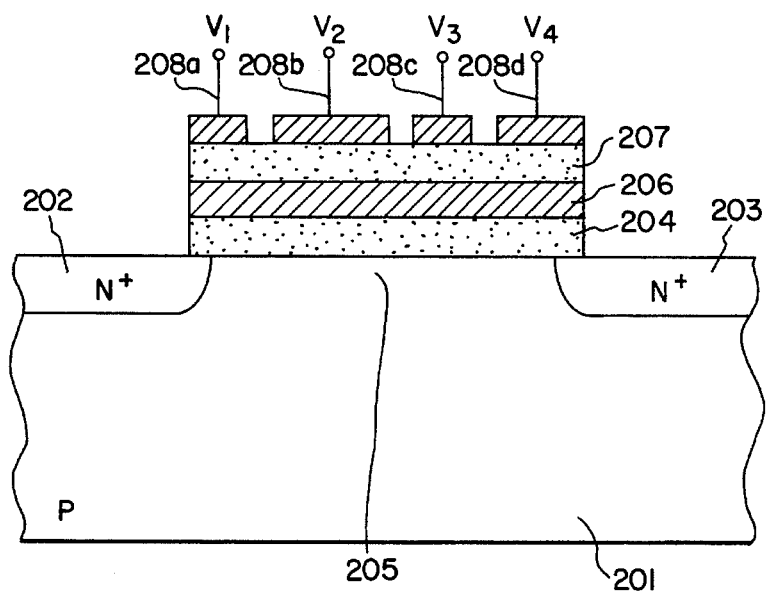
FIG. 2(a) is a diagram showing an example of the cross sectional structure of an N channel vMOS transistor having four inputs.
Figure 2B:
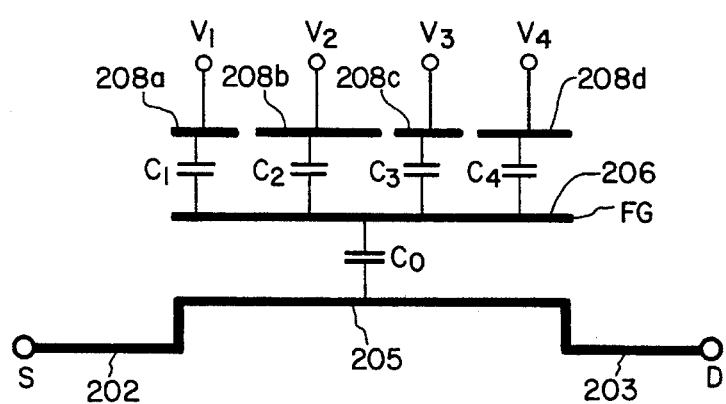
FIG. 2(b) is a diagram showing the operation of a vMOS transistor in a simplified form for the purposes of analysis.

In order to explain the operation of the circuitry of FIG. 1(a), the structure and the operational principle of the νMOS transistor will first be explained. FIG. 2(a) shows an example of the cross sectional structure of a 4-input N channel νMOS transistor; reference numeral 201 indicates, for example, a P type silicon substrate, references 202 and 203 indicate a source and a drain formed by means of $N^+$ diffusion layers, reference numeral 204 indicates a gate insulation film (for example, a $SiO_2$ film) provided on a channel region 205 between the source and drain, reference numeral 206 indicates a floating gate electrode which is electrically insulated and is in a potentially floating state, reference numeral 207 indicates an insulation film comprising, for example $SiO_2$, or the like, and reference numerals 208a, 208b, 208c, and 208d indicate control gate electrodes. FIG. 2(b) is a diagram which is simplified for the purpose of analyzing the operation of an νMOS transistor. If the capacitive coupling coefficient between each control gate electrode and the floating gate is represented by $C_1$, $C_2$, $C_3$ and $C_4$, as shown in the figure, and the capacitive coupling coefficient between the floating gate and the silicon substrate is represented by $C_0$, then the potential $\phi_F$ of the floating gate is given by the following formula.

$$\phi_F=(1/C_{TOT})\ (C_1V_1+C_2V_2+C_3V_3+C_4V_4) \quad (2)$$

Here, $C_{TOT}\equiv C_0+C_1+C_2+C_3+C_4$ $V_1$, $V_2$, $V_3$, and $V_4$ represent the voltages which are applied to voltage gates 208a, 208b, 208c, and 208d, respectively, and the potential of the silicon substrate is 0 V; that is to say, it is earthed.

Now, the potential of source 202 is set to 0 V. That is to say, the potentials of all the electrodes are set to values measured using the source as a standard. By proceeding in this manner, if floating gate 206 is considered to be an ordinary gate electrode, then the νMOS transistor shown in FIG. 2 is identical to an ordinary N channel MOS transistor; when the gate potential $\phi_F$ exceeds the threshold value ($V_{TH}^*$), a channel of election (N channel) is formed in region 205 between source 202 and drain 203, and an electrical connection is established between the source and the drain. That is to say, from formula (2), the νMOS transistor is in a conducting state (an ON state) when the conditions shown in the following formula are fulfilled:

$$(1/C_{TOT})\ (C_1V_1+C_2V_2+C_3V_3+C_4V_4)>V_{TH}^* \quad (3)$$

The foregoing was an explanation of an N channel vMOS transistor; however, devices exist in which, source 202, drain 203 and substrate 201 are of an opposite type of conductivity to those of FIG. 2(a). That is to say, such a transistor is a vMOS transistor in which the substrate is of the N type, while the source and the drain are formed from $P^+$ diffusion layers, and such a transistor is termed a P channel vMOS transistor.

Using the above relationships, the operation of the D/A converter 107 of FIG. 1 will be explained. The potential Z of the output terminal 112 of the circuit is such that $$Z = \phi_F - V_{TH2}^* \quad (4)$$

If the capacitive coupling coefficients between electrodes 111a, 111b, 111c and 111d and the floating gate are represented by $C_1$, $C_2$, $C_3$, and $C_4$, then, using formula (2), the following variables have the values stated in the formulas below;

$$Z = (1/C_{TOT})(C_1V_1 + C_2V_2 + C_3V_3 + C_4V_4) - V_{TH2}^*$$

$$V_1 = X_1 V_{DD},$$

$$V_2 = X_2 V_{DD},$$

$$V_3 = X_3 V_{DD},$$

$$V_4 = 0$$

$$V_{TH2}^* = -(V_{DD}/16)$$

so that Z has the following value:

$$Z = V_{DD}\{(C_1/C_{TOT})X_1 + (C_2/C_{TOT})X_2 + (C_3/C_{TOT})X_3\} + (V_{DD}/16) \quad (5)$$

If the various capacitive coupling coefficients of the vMOS transistor 108 are set as follows:

$$C_1 = (1/8) C_{TOT}$$

$$C_2 = (1/4) C_{TOT}$$

$$C_3 = (1/2) C_{TOT}$$

the following formula results:

$$Z = (V_{DD}/8)(X_1 + 2X_2 + 4X_3) + (V_{DD}/16) \quad (6)$$

so that the results of formula (1) and the characteristics shown in FIG. 1(e) are obtainable.

Here, if the capacitive coupling coefficient $C_0$ between floating gate 110 and the substrate is taken to have a value of, for example, $C_0 = (1/10) C_{TOT}$, then from the formula $C_0 + C_1 + C_2 + C_3 + C_4 = C_{TOT}$, it can be seen that $C_4 = (1/40)C_{TOT}$. The foregoing was an explanation relating to the characteristics and design of a D/A converter circuit.

Next, the operation of the vMOS inverter circuit 105 will be explained. vMOS transistor 101 is a 3 input N channel n MOS transistor. If the capacitive coupling coefficients between the three control gate electrodes 103a, 103b, 103c, and floating gate 102 are represented by $C_1$, $C_2$, and $C_3$, respectively, the voltages inputted into the respective gates are represented by $V_1$, $V_2$, and $V_3$, and the capacitive coupling coefficient between floating gate 102 and the substrate is represented by $C_0$, then the potential $\phi_F$ of the floating gate 102 has the value shown in the formula below:

$$\phi_F = (1/C_{TOT})(C_1V_1 + C_2V_2 + C_3V_3) \quad (7)$$

Here, $C_{TOT} = C_0 + C_1 + C_2 + C_3$. The value of the $C_1$, $C_2$, and $C_3$ of the vMOS transistor is set, for example, as given below.

$$C_1 = (1/2)(C_{TOT} - C_0) \quad (8)$$

$$C_2 = (7/16)(C_{TOT} - C_0) \quad (9)$$

$$C_3 = (1/16)(C_{TOT} - C_0) \quad (10)$$

Furthermore, the threshold value of the n MOS transistor as seen from the floating gate is designed so as to have, for example, the value shown below:

$$V_{TH1}^* = (1/2)V_{DD}((C_{TOT} - C_0)/C_{TOT}) \quad (11)$$

$C_{TOT}$ and $C_0$ have values which are determined by the form of the elements and the oxide film; $V_{TH1}^*$ is determined in accordance with these values. The adjustment of $V_{TH1}^*$ may be accomplished by means of, for example, an ion implantation method. Here, for example, if $C_0 = (1/10) C_{TOT}$, then the following variables have the values shown below:

$$C_1 = 0.9 C_{TOT} \times (1/2) = 0.45 C_{TOT}$$

$$C_2 = 0.9 C_{TOT} \times (7/16) = 0.394 C_{TOT} \quad (12)$$

$$C_3 = 0.9 C_{TOT} \times (1/16) = 0.056 C_{TOT}$$

$$V_{TH1}^* = 0.9 V_{DD} \times (1/2) = 0.45 V_{DD}$$

If formulas (8), (9), and (10) are substituted into formula (7), then the following formula results:

$$\phi_F = \gamma((1/2)V_1 + (7/16)V_2 + (1/16)V_3) \quad (13)$$

$$\gamma \equiv ((C_{TOT} - C_0)/C_{TOT})$$

Figure 3A:
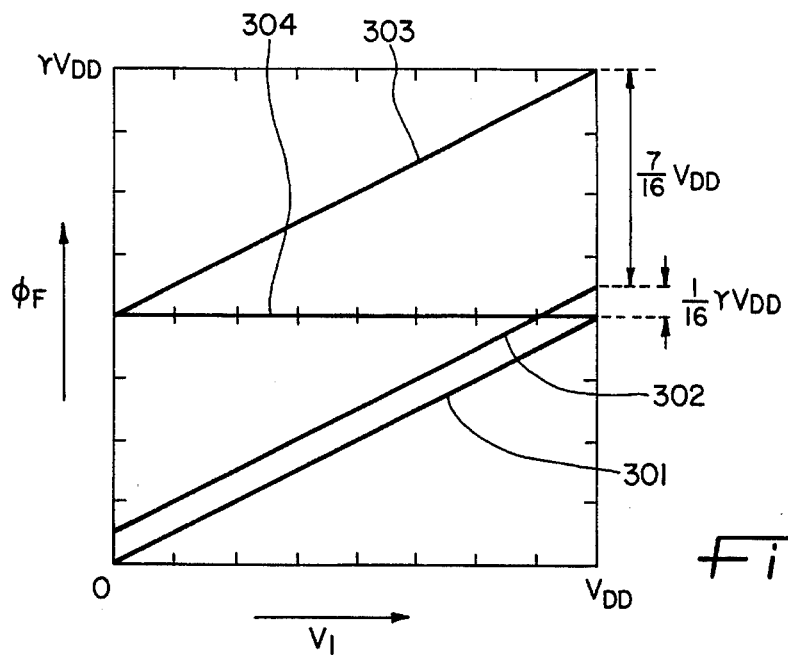
FIG. 3(a) is a diagram showing the relationship between $V_1$ and $\phi_F$ in the first embodiment of the present invention.

Here, the variation in $\phi_F$ when $V_2 = V_3 = 0$ and $V_1$ varies within a range of from 0 to $V_{DD}$ is shown by straight line 301 in FIG. 3(a). In the same figure, straight line 302 indicates the relationship between $\phi_F$ and $V_1$ when $V_2 = 0$ and $V_3 = V_{DD}$; it represents a shifting upwards of straight line 301 by a value of $(1/16)\gamma V_{DD}$.

Figure 3B:
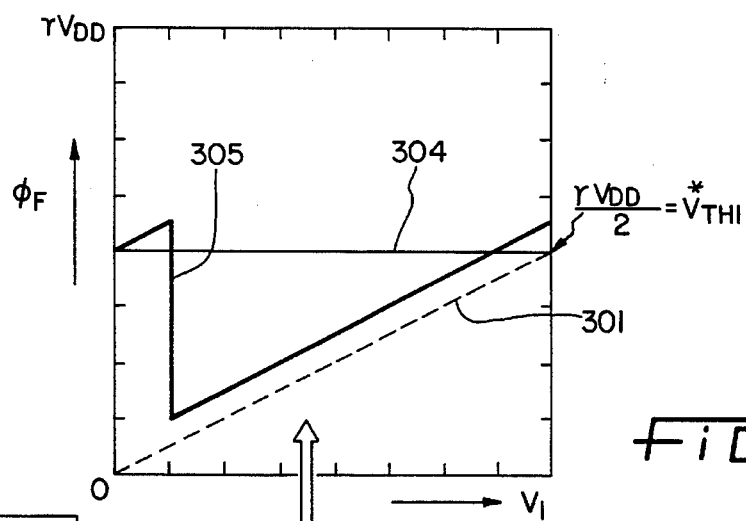
FIG. 3(b) is a diagram showing the relationship between $V_1$ and $\phi_F$ in the first embodiment of the present invention.

Furthermore, reference numeral 303 indicates the relationship when $V_2 = V_3 = V_{DD}$, and this represents a further shifting of $(7/16)\gamma V_{DD}$. Straight line 304 is a horizontal line expressing the level at which $\phi_F = (1/2)\gamma V_{DD}$; it expresses a threshold value of 0.45 $V_{DD}$ as seen from the floating gate. It can be seen from the circuit diagram of FIG. 1(a) that $V_3 = V_{DD}$ (fixed); however, the output voltage of inverter 106 is inputted into $V_2$. That is to say, $V_2$ varies as shown in FIG. 1(d) with respect to $V_1$, so that when conditions are such that $0 \leq V_1 \leq (1/8)V_{DD}$, then $V_2 = V_{DD}$, while when conditions are such $V_1 > (1/8) V_{DD}$, then $V_2 = 0$. That is to say, in the circuit shown in FIG. 1(a), the relationship between $\phi_F$ and $V_1$ is as shown by the solid line 305 in FIG. 3(b).

Horizontal line 304 represents a situation in which $\phi_F = (1/2)\gamma V_{DD}$: it expresses the level of the threshold value $(V_{TH1}^* = 0.45 V)$ of the vMOS transistor 101 as seen from the floating gate. That is to say, in the case in which the solid line 305 is above the horizontal line 304, then $\phi_F > V_{TH1}^*$, vMOS transistor 101 is placed in an ON state, and output voltage Y has a value of 0. In contrast, when solid line 305 is below horizontal line 304, then $\phi_F < V_{TH1}^*$, vMOS transistor 101 is placed in an OFF state, and $Y = V_{DD}$ (see FIG. 1(b)).

Figure 3C:
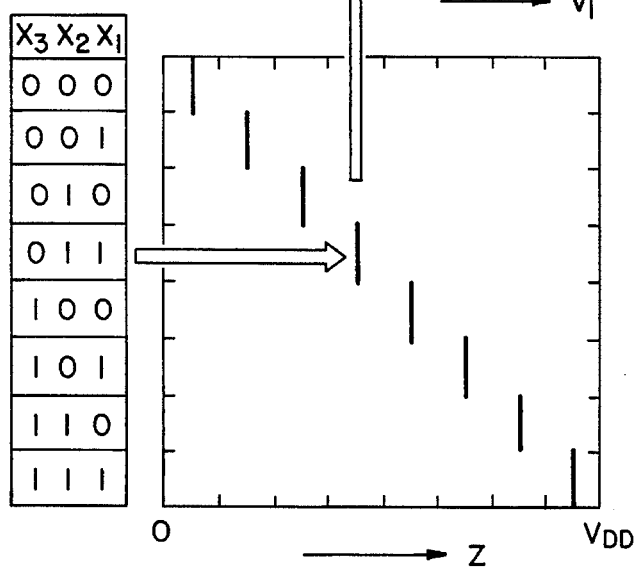
FIG. 3(c) is a diagram in which the axis of the ordinate and the axis of the abscissa in FIG. 1(e) have been exchanged.

FIG. 3(c) is a graph showing the relationship between $V_1$ (=Z) and $X_1$, $X_2$, and $X_3$: herein, the ordinate and abscissa of FIG. 1(e) are interchanged. If FIG. 3(b) and (c) are reviewed together, the relationship between $X_1$, $X_2$, and $X_3$, and Y, can be quickly grasped. For example, when $(X_3, X_2, X_1) = (0, 1, 1)$, then $V_1 = (7/16)V_{DD}$, $\phi_F < V_{TH1}^*$, and Y=1. Y=0 only in those cases in which $\phi_F > V_{TH1}^*$, when $(X_3, X_2, X_1) = (0, 0, 0)$ or $(1, 1, 1)$; it can thus be seen that the circuit shown in FIG. 1(a) is a circuit which accurately calculates function $Y_1$ which is defined, with respect to 3 inputs $X_1$, $X_2$, and $X_3$, as:

$$(X_1+X_2+X_3)\cdot(\bar{X}_1+\bar{X}_2+\bar{X}_3)$$

The circuit comprises two vMOS transistors, one ordinary MOS transistor, and three resistors: it thus comprises a total of 6 elements. In consideration of the fact that a circuit constructed in accordance with the conventional technology (FIG. 35(a)) required a total of 22 MOS transistors, it is clear that the number of elements was reduced to less than one third of that which was conventionally necessary. That is to say, by means of the present invention, it is clear that a high degree of function is realizable with only a small number of elements.

In the above, during the explanation of the first embodiment of the present invention, FIGS. 3(a) and (b), which show the relationship between $V_1$ and $\phi_F$, were employed; however, these diagrams are extremely convenient for the analysis of vMOS operation and the design of vMOS circuitry. Such diagrams are termed floating potential diagrams (FPD), and hereinbelow, other embodiments of the present invention will be explained using such FPDs.

(Second Embodiment)

Figure 4A:
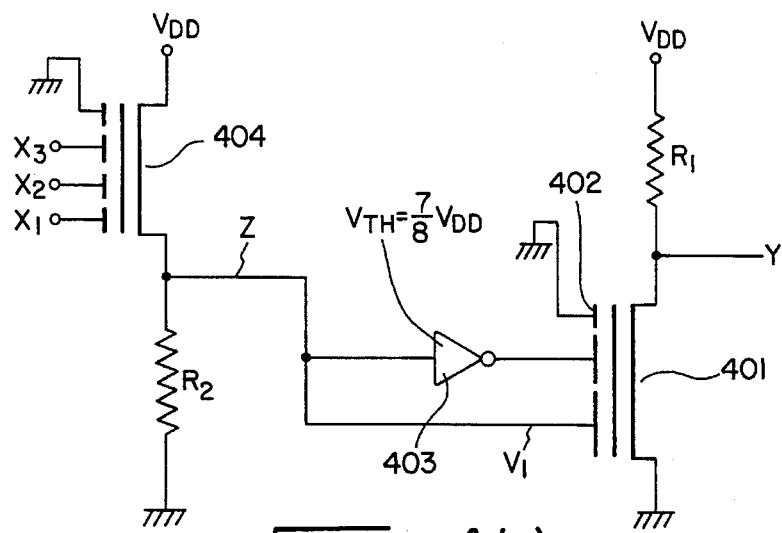
FIG. 4(a) is a circuit diagram showing the second embodiment of the present invention.

A circuit diagram showing the second embodiment of the present invention is shown in FIG. 4(a). This circuit calculates the $Y_2$ of FIG. 35(b) with respect to three inputs $X_1$, $X_2$, and $X_3$. That is to say, this circuit outputs a value $Y_2$ which is expressed by the following formula $$Y=(X_1\cdot X_2\cdot X_3)+\bar{X}_1\cdot\bar{X}_2\cdot\bar{X}_3$$

The sole points of difference between this circuit and the $Y_1$ circuit of FIG. 1(a) lie in that the input into control gate electrode 402 of vMOS transistor 401 is not $V_{Dd}$, but rather 0V, and in that the inversion voltage $V_{TH}$ of inverter circuit 403 is set to $(7/8)V_{DD}$. Apart from this, this circuit is identical to that of FIG. 1(a). That is to say, the values of the capacitive coupling coefficients between each electrode, and the threshold value as seen from the floating gate, in vMOS transistors 401 and 404 are all set to values which are identical to those in the case of circuit shown in FIG. 1(a).

Figure 4B:
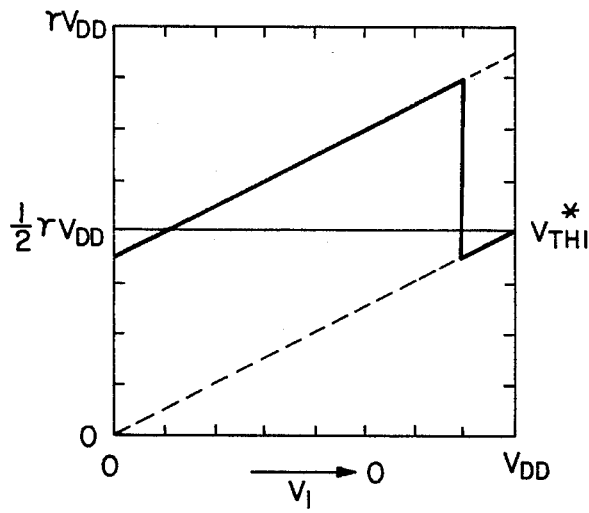
FIG. 4(b) is an FPD diagram of vMOS transistor 401.

FIG. 4(b) shows a FPD (floating potential diagram) of vMOS transistor 401. $\phi_F<V_{TH1}^*$, and Y=1, only when $(X_1, X_2, X_3)=(0,0,0,)$ or $(1,1,1)$, so that this circuit accurately calculates the following formula:

$$Y=(X_1\cdot X_2\cdot X_3)+\bar{X}_1\cdot\bar{X}_2\cdot\bar{X}_3$$

That is to say, by means of the second embodiment of the present invention, the circuit of $Y_2$ of FIG. 35(b) can be realized with only 6 elements, as was the case with the circuit of FIG. 1(a). In comparison with the circuit constructed by means of the conventional technology, which required a total of 22 elements, as shown for example in FIG. 35(b), the circuit of the present embodiment possesses identical functions while using an extremely small number of elements.

Furthermore, FIG. 36 shows another example of a circuit which obtains a value $Y_2$ with respect to three inputs A, B, and C, which is constructed by means of conventional technology and employs 20 MOS transistors: such a circuit is extremely complicated. In particular, in comparison with the first and second embodiments of the present invention, the interconnection is extremely complicated. That is to say, when attempts were made to realize logical functions with the conventional technology, it was not simply the case that the number of elements increased, but rather the number of interconnects connecting element to element also increased, and this caused various problems, such as a limitation in the operational speed of the circuit as a result of the delay in signal propagation in the interconnects, and the occurrence of errors as a result of the cross talk phenomenon. However, in accordance with the present invention, it is not merely the case that the necessary number of elements is reduced, but the interconnection also becomes extremely simple, so that such problems can all be easily solved.

A further important point of the present invention lies in the fact that it is possible to realize completely different circuit functions by means of nearly identical circuit structures. That is to say, the only points of difference between the first and second embodiments of the present invention are the inversion voltage of the inverters (106, 403), and the voltage which is applied to the control gate electrodes (103c, 402). Accordingly, if these are made variable, it is possible to realize different functions with the same circuit. An example of this is given by the third embodiment of the present invention, which is shown in FIG. 5.

(Third Embodiment)

Figure 5A:
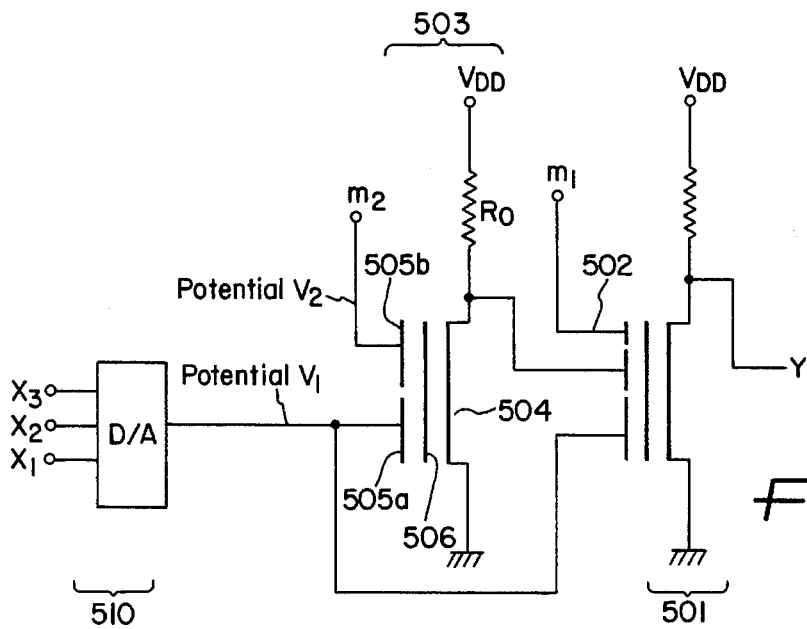
FIG. 5(a) is a circuit diagram showing the third embodiment of the present invention.

In FIG. 5(a), vMOS inverter 501 is identical to inverter 105 of FIG. 1(a): however, the voltage which is applied to control gate 502 is not fixed, but is rather input signal ml. Reference numeral 510 is a D/A converter which is identical to D/A converter 107, so that it is shown in the diagram as a unit.

In this circuit, the main difference from the circuits of FIG. 1(a) or FIG. 4(a) is the use of a vMOS inverter 503 comprising a 2 input N channel vMOS transistor and a resistor $R_0$, in place of the conventional NMOS inverter (see reference numerals 106, 403 and FIG. 1(c)). If the capacities between control gates 505a and 505b and the floating gate are represented by $C_1$ and $C_2$, and the threshold value of vMOS transistor 504 (equal to the inversion voltage of inverter 503) as seen from the floating gate is represented by $V_{TH}^*$, then the vMOS transistor is placed in an ON state when the following conditions are fulfilled:

$$\phi_F=(C_1/C_{TOT})V_1+(C_2/C_{TOT})V_2>V_{TH}^*$$

From this formula, it can be seen that the conditions, with respect to $V_1$, under which the vMOS transistor is in ON state are such that:

$$V_1>(C_{TOT}/C_1)V_{TH}^*-(C_2/C_1)V_2$$

Accordingly, the threshold value $V_{TH}$ (equal to the inversion voltage $V_1$ of inverter 503) of the vMOS transistor 504, as seen from the control gate electrode 505a, is:

$$V_{TH}>(C_{TOT}/C_1)V_{TH}^*-(C_2/C_1)V_2 \qquad (14)$$

Here, for example, if conditions are such that $C_1=C_2$, and $V_{TH}^*$ is set as in Formula (11), that is to say:

$$V_{TH}^*=(1/2)V_{DD}((C_{TOT}-C_0)/C_{TOT}) \qquad (15)$$

then from Formula (14), $$V_1=V_{DD}-V_2 \qquad (16)$$

and the inversion voltage of inverter 503 can easily be varied by means of the value of $V_2$ in accordance with Formula (16).

Accordingly, if $m_2=(7/8)V_{DD}$, then $V_1=(1/8)V_{DD}$. If $m_1$ is set equal to $V_{DD}$, then the circuit shown in FIG. 5(a) is completely identical to the circuit of FIG. 1(a), and is the circuit shown in FIG. 35(a), which outputs $Y_1$. Furthermore, if $m_2$ is set equal to $(\frac{1}{8})V_{DD}$, and $m_1$ is set equal to 0, then this circuit is identical to the circuit shown in FIG. 4(a), and is the circuit shown in FIG. 35(b) which outputs $Y_2$.

That is to say, in accordance with the third embodiment of the present invention, using an identical hardware structure, it is possible to completely alter the functions of the circuit by simply changing the value of control signals $m_1$ and $m_2$. In the conventional technology, for example, in FIG. 35(a) and (b), if the hardware structure itself was not changed, it was impossible to change the functions. Accordingly, this is an epoch-making characteristic of the present invention. Circuits such as that shown in FIG. 5(a), the hardware functions of which can be changed by means of signal voltage, are termed "soft-hardware logic".

Soft-hardware logic will be explained more generally in the seventh embodiment of the present invention. Here, in order to obtain a simple relational formula such as formula (16) for $V_1$, $C_1$ was set equal to $C_2$, and $V_{TH}*$ was set so as to fulfill the conditions of Formula (15); however, this is only one possibility. $V_1$ is given by Formula (14), so that it is also possible that a different value may be used for $V_2$ ($=m_2$) when $C_1 \neq C_2$.

Figure 5B:
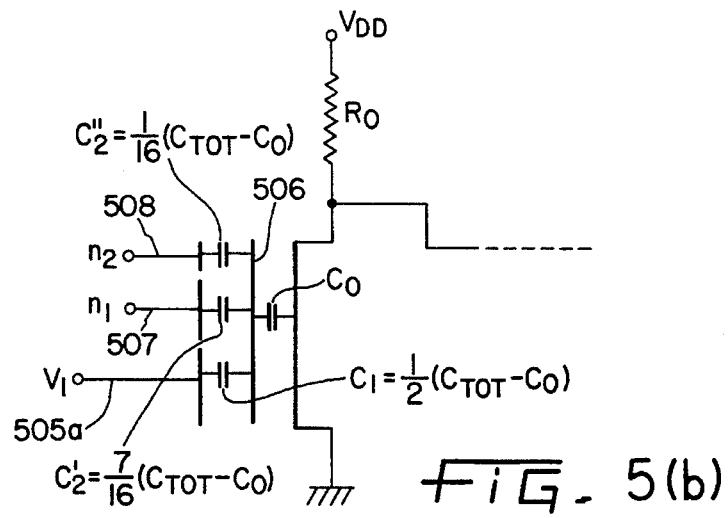
FIG. 5(b) is a block diagram of an inverter in which control gate electrode 505b has been divided into two.

In FIG. 5(a), the second control gate electrode 505b of vMOS transistor 504 was made a single control gate: however, this may, for example, be divided into two to construct an inverter such as that shown in FIG. 5(b), and may be used in place of inverter 503.

In such a case, if the coupling coefficients of control gate electrodes 507 and 508 and floating gate 506 are represented by, for example, $C_2'$, and $C_2''$, respectively, $C_2'$ is given a value of $(\frac{7}{16})(C_{TOT}-C_0)$, and $C_2''$ is given a value of $(\frac{1}{16})(C_{TOT}-C_0)$, then when $n_1=m_1=V_{DD}$, and $n_2=0$, the circuit of FIG. 5(a) is equivalent to the circuit of FIG. 35(a), which outputs $Y_1$, while when $n_1=m_1=0$, and $n_2=V_{DD}$, the circuit is equivalent to the circuit of FIG. 35(b), which outputs $Y_2$.

In the first, second, and third embodiments, the example of a circuit in which an N channel vMOS transistor and a resistor were combined was employed. This was simply for the purpose of explaining in an easily understandable manner the fundamental principle of the present invention. It is possible to use, for example, an N channel depression mode transistor or enhancement mode transistor in place of the resistor. Furthermore, it is also possible the all transisters including the vMOS transistors are substituted for a P channel transistors.

However, in the above described examples, in the case in which any transistor was in an ON state, a direct current flowed from $V_{DD}$ to the earth, so that the power dissipation become undesirably large. That is to say, such a circuit structure is disadvantageous with respect to the achievement of large scale integration in cases where the upper limit of power dissipation is limited.

It is possible to use neuron MOS gates having a CMOS structure in the realization of a high degree of function with a small number of transistors, irrespective of power dissipation.

(Fourth Embodiment)

Figure 6A:
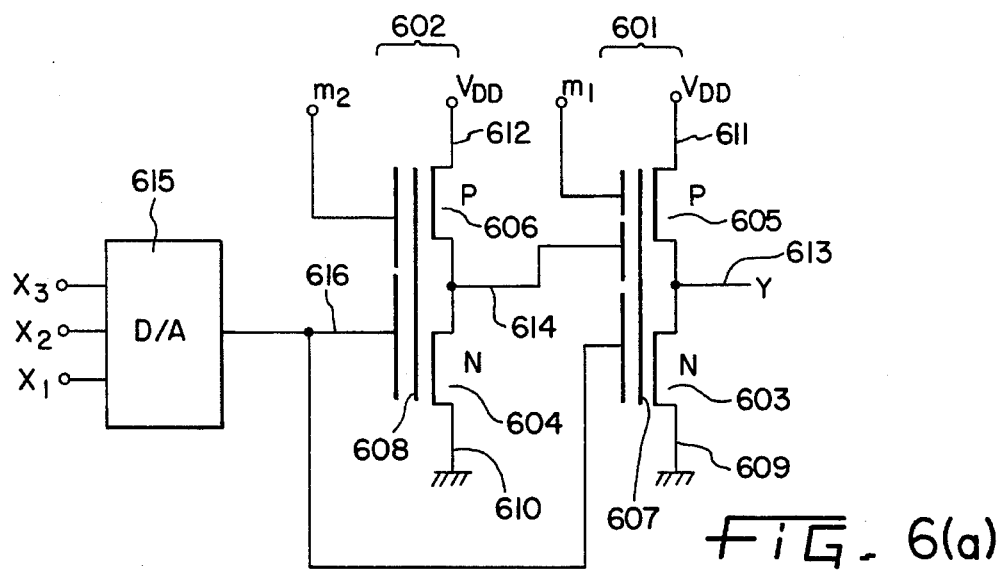
FIG. 6(a) is a circuit diagram showing the fourth embodiment of the present invention.

FIG. 6(a) shows a circuit diagram showing the fourth embodiment of the present invention; in this example, a circuit possessing functions which are identical to those of the third embodiment which is shown in FIG. 5(a) is constructed using neuron MOS gates 601 and 602, which have a CMOS structure. Reference numeral 603 and 604 indicative N channel vMOS transistors, while reference numerals 605 and 606 indicate P channel vMOS transistors; in both inverters 601 and 602, the floating gates of the N channel vMOS transistor and the P channel vMOS transistor are electrically connected.

Furthermore, sources 609 and 610 of the N channel vMOS transistor are connected to the earth, sources 611 and 612 of the P channel vMOS transistor are connected to $V_{DD}$, and furthermore, the drains of the N-vMOS transistor and the P-vMOS transistor are connected, forming output terminals 613 and 614, respectively, of the CMOS neuron MOS gates.

Figure 7:
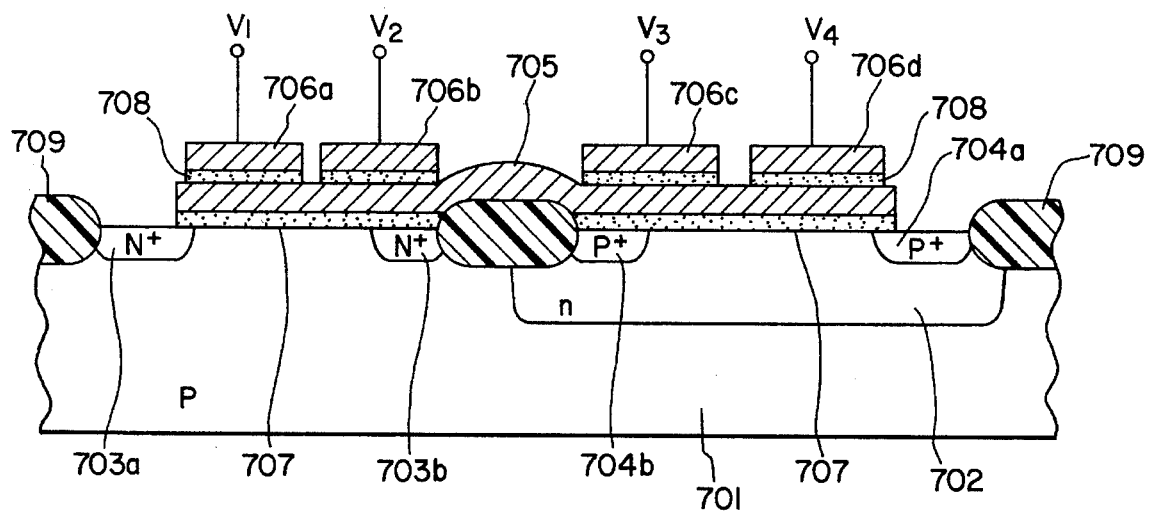
FIG. 7 is a cross-sectional block pattern diagram of a neuron MOS gate having a CMOS structure with 4 inputs.

FIG. 7 shows an example of the cross-sectional structure of a neuron MOS gate having a four-input CMOS structure. Reference numeral 701 indicates a P type silicon substrate, reference numeral 702 indicates a N type well, reference numerals 703a and 703b indicate a N$^+$ type source and drain, respectively, reference numerals 704a and 704b indicate a P$^+$ type source and drain, respectively, reference numeral 705 indicates a floating gate, while reference numerals 706a–d indicate input gate electrodes, respectively. Reference numerals 707 and 708 indicate insulation films comprising, for example, $SiO_2$, while reference numeral 709 indicates a field oxide film.

In FIG. 6(a), the capacitive coupling coefficients between the various control gate electrodes of the vMOS transistor and the floating gate are set to values identical to those in the case of the circuit shown in FIG. 5(a). The capacitive coupling coefficient $C_0$ between the floating gate and the substrate is equal to the sum of the capacitive coupling coefficient $C_0^N$ between the floating gate and the P type substrate and the coupling coefficient $C_0^P$ between the floating gate and the N type substrate. That is to say, $$C_0 = C_0^N + C_0^P \qquad (17)$$

In the inversion voltage (the threshold voltage at which 1 and 0 are inverted) of inverter 601 as seen from floating gate 607 is represented by $V_1*$, then the value of this $V_1*$ is given by the following formula:

$$V_1* = \frac{V_{DD} + \sqrt{\beta_R}\ V_{Tn}* + V_{Tp}*}{\sqrt{\beta_R} + 1} \qquad (18)$$

Herein, $V_{Tn}*$ and $V_{Tp}*$ represent the threshold values of N channel vMOS transistor 603 and P channel vMOS transistor 605, respectively, as seen from floating gate 607, while $\beta_R$ is a b ratio which is given by the following formula.

$$\beta_R = (\beta_{N\ channel}/\beta_{P\ channel}) = ((W/L)_N \mu_e/(W/L)_P \mu_h) \qquad (19)$$

Here, W and L represent channel width and channel length, respectively, while $\mu e$ and $\mu n$ represent the mobility of the electron and hole, respectively.

For example, if $\beta_R$ is set so as to be equal to 1, then formula (18) simplifies to the following:

$$V_1* = (V_{DD}/2) + ((_{Tn}* + V_{Tp}*)/2) \qquad (20)$$

For example, if the inversion voltage $V_1*$ of the inverter 601 is given by formula (11), as in the case of inverter 501, then the following formula results:

$$V_{Tn}* + V_{Tp}* = -(C_0/C_{TOT})V_{DD} \qquad (21)$$

If, in this formula, $C_0$ is set equal to 0.1 $C_{TOT}$, and $V_{DD}$ is set equal to 5 V, then the following results:

$$V_{Tn}* = |V_{Tp}*| - 0.5$$

Accordingly, in the case in which, for example, $V_{Tn}*$ is set equal to 0.5 V, then $V_{Tp}* = -1.0$ V results.

In inverter 602, as well, if $\beta_R = 1$, and the threshold value of the vMOS transistor is set as shown in Formula (21), then the inversion voltage of inverter 602, as seen from control gate electrode 616, becomes $V_1=V_{DD}-m_2$, and the circuit shown in FIG. 6(a) becomes a circuit possessing functions identical to those of the circuit shown in FIG. 5(a). Inverter 602 may be replaced, for example, by an inverter such as that shown in FIG. 6(b). This figure shows a case where the control gate electrode, into which $m_2$ is inputted, of inverter 602 is divided into two; the capacitive coupling coefficients $C_1$, $C_2'$, and $C_2''$ may be set to values identical to those in the case of the circuit shown in FIG. 5(b). The operation of the circuit using this type of inverter is identical to that of the third embodiment.

The characteristic advantage of the fourth embodiment lies in an ability to reduce power dissipation in the extreme. That is to say, in each inverter, only one of the N channel νMOS transistor and the P channel νMOS transistor is in a conductive state, so that direct current is never caused to flow. Even with a CMOS structure, the total number of elements is 6; this number does not differ from that of the first through third embodiments.

In the fourth embodiment in accordance with the present invention, the same circuit as that used in the first through third embodiments was used as D/A converter 615. This circuit comprises, for example. one N channel νMOS transistor 108 and one resistor 109, as in the case of D/A converter 107 in FIG. 1, and in this circuit, a direct current is caused to flow which can be represented by:

$$I=(Z/R_2) \quad (22)$$

(Reference Z indicates the output voltage of the D/A converter). In order to reduce this current and cut power dissipation, $R_2$ may be made sufficiently large. However, the time response of the D/A converter having a large R2 is slow, and high-speed operation may be hindered as a result. A D/A converter using an active load was proposed to solve this problem, and a fifth embodiment of the present invention, which employs such a D/A converter, is explained hereinbelow.

(Fifth Embodiment)

Figure 8A:
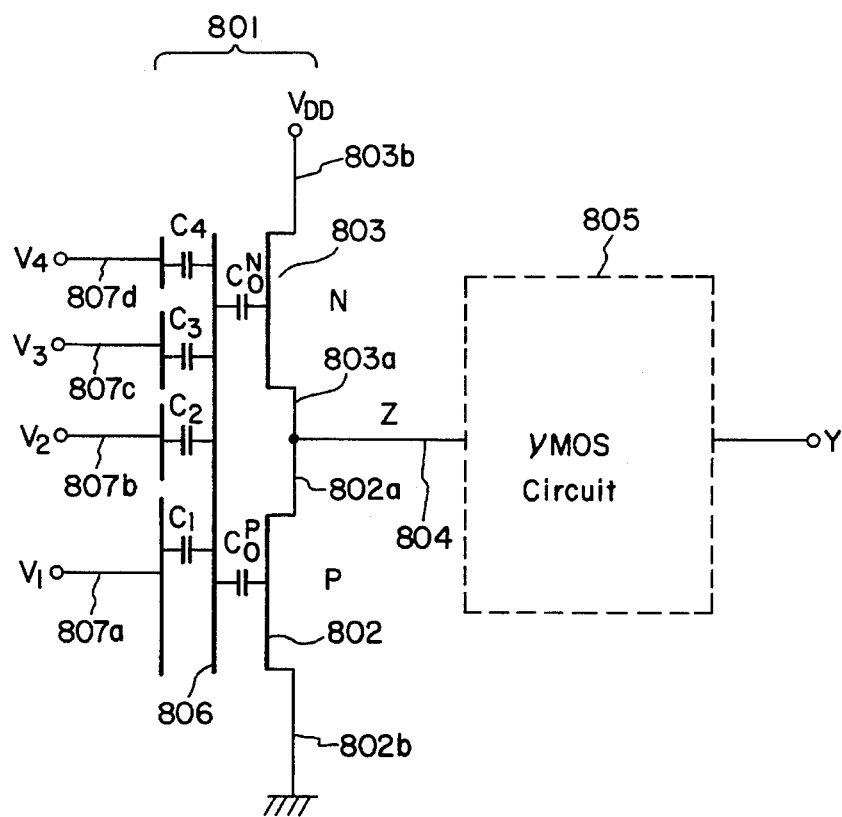
FIG. 8(a) is a circuit diagram showing the fifth embodiment of the present invention.

FIG. 8(a) is a circuit diagram showing the fifth embodiment of the present invention. The characteristic point of the present embodiment lies in the use of a D/A convertor 801 having a small power dissipation, which differs from the first through fourth embodiments. Because the D/A converter causes almost no direct current to flow, it is possible to limit the power dissipation in the extreme, and high speed operations are also possible.

In Figure, reference numerals 802 and 803 indicate a P channel νMOS transistor and a N channel νMOS transistor, respectively; the sources of these two transistors are connected and form output terminal 804. This output is inputted into circuit 805, comprising νMOS transistors. This circuit 805 indicates a circuit such as that used in FIG. 1(a), FIG. 4(a), FIG. 5(a), or FIG. 6(a); any circuit may be used, in so far as it is a circuit in accordance with the present invention which possesses a similar structure.

Reference numeral 806 indicates a floating gate; the floating gate of the N-νMOS transistor and the floating gate of the P-νMOS transistor are electrically connected. Reference numerals 807a, 807b, 807c, and 807d indicate four control gate electrodes; they correspond to reference numerals 111a, 111b, 111c, and 111d in the circuit shown in FIG. 1(a). Here, the circuit is depicted with 4 inputs solely for the purpose of ease of explanation; the number of inputs may be smaller of larger. Reference numerals $V_1$, $V_2$, $V_3$, and $V_4$ indicate input voltages into the control gates, while reference Z indicates the output voltage of the circuit. The capacitive coupling coefficient between electrodes are as shown in the diagram.

First, the relationship between the potential $\phi_F$ of the floating gate and the output voltage Z is determined. In this structure, νMOS transistors 802 and 803 are both operated in the saturation region, and since the current flowing to both transistors becomes equal, the following formula is established.

$$(\tfrac{1}{2})\beta_N\{(\phi_F-Z)-V_{Tn}^*\}^2=(\tfrac{1}{2})\beta_P\{(\phi_F-Z)-V_{Tp}^*\}^2 \quad (23)$$

Here, $$\beta_N=(W/L)C_{OX}\mu_e \quad (24)$$

$$\mu_P=(W/L)C_{OX}\mu_h \quad (25)$$

References W and L indicate the channel width and channel length, respectively, of the transistor, reference $C_{OX}$ indicates the gate oxide film capacity per unit of surface area, and references $\mu_e$ and $\mu_h$ indicate the mobilities of electron and holein the inversion layer. Furthermore, references $V_{Tn}^*$ and $V_{Tp}^*$ indicate the threshold values of N-νMOS transistor 803 and P-νMOS transistor 802, respectively, as seen from floating gate 806. If condition is such that $\beta_R=(\beta_N/\beta_P)$, then the relationships shown in the following formulas are obtained;

$$Z=\phi_F - \frac{\sqrt{\beta_R}\ V_{Tn}^* + V_{Tp}^*}{\sqrt{\beta_R}+1} \quad (26)$$

Now, if $\beta_R$ is set equal to 1 for the purposes of simplicity, then this formula simplifies to:

$$Z=\phi_F-((V_{Tn}^*+V_{Tp}^*)/2) \quad (27)$$

The situation in which $\beta_R$ is set equal to 1 merely represents just one example of such a design; it should be understood that it is also possible to set other values.

Since the potential $\phi_F$ of the floating gate is given by Formula (2), then from Formula (26), the following results:

$$Z = \frac{1}{C_{TOT}}(C_1V_1+C_2V_2+C_3V_3+C_4V_4) - \frac{\sqrt{\beta_R}\ V_{Tn}^*+V_{Tp}^*}{\sqrt{\beta_R}+1}$$

$$= \frac{1}{C_{TOT}}(C_1V_1+C_2V_2+C_3V_3) + \left(\frac{C_4}{C_{TOT}}V_4 - \frac{\sqrt{\beta_R}\ V_{Tn}^*+V_{Tp}^*}{\sqrt{\beta_R}+1}\right) \quad (28)$$

If $V_1$, $V_2$, and $V_3$ are inputted in terms of the binary signals $X_1$, $X_2$, and $X_3$, then the values are such that $V_1=X_1 V_{DD}$, $V_2=X_2 V_{DD}$, and $V_3=X_3 V_{DD}$, and Formula (28) can be transformed to:

$$Z=V_{DD}(C_1X_1/C_{TOT}+C_2X_2/C_{TOT}+C_3X_3/C_{TOT}) + \left(\frac{C_4}{C_{TOT}}V_4 - \frac{\sqrt{\beta_R}\ V_{Tn}^*+V_{Tp}^*}{\sqrt{\beta_R}+1}\right) \quad (29)$$

In order to define output Z in terms of formula (1), or as shown in FIG. 1(e), then the following equivalencies must be established:

$(C_1/C_{TOT})=(\tfrac{1}{8})$, $(C_2/C_{TOT})=(\tfrac{1}{4})$, $(C_3/C_{TOT})=(\tfrac{1}{2})$ and the following formula must hold true:

$$\frac{C_4}{C_{TOT}} V_4 - \frac{\sqrt{\beta_R} \, V_{Tn}^* + V_{Tp}^*}{\sqrt{\beta_R} + 1} = \frac{V_{DD}}{16} \quad (30)$$

Formula (30) may be satisfied by means of appropriately selecting the values of $C_4$ and $V_4$, or appropriately selecting the values of $\beta_R$, $V_{Tn}^*$, and $V_{Tp}^*$. If $V_4$ is set equal to 0 and $\beta_R$ is set equal to 1, yielding the simplest example, then the following formula must be satisfied:

$$V_{Tn}^* + V_{Tp}^* = -(\tfrac{1}{8}) V_{DD} \quad (31)$$

$I_n$ so far as the relationships described above are fulfilled, it is possible to freely select $V_{Tn}^*$ to a certain extent; however, it is necessary to pay attention to the following point.

Figure 8B:
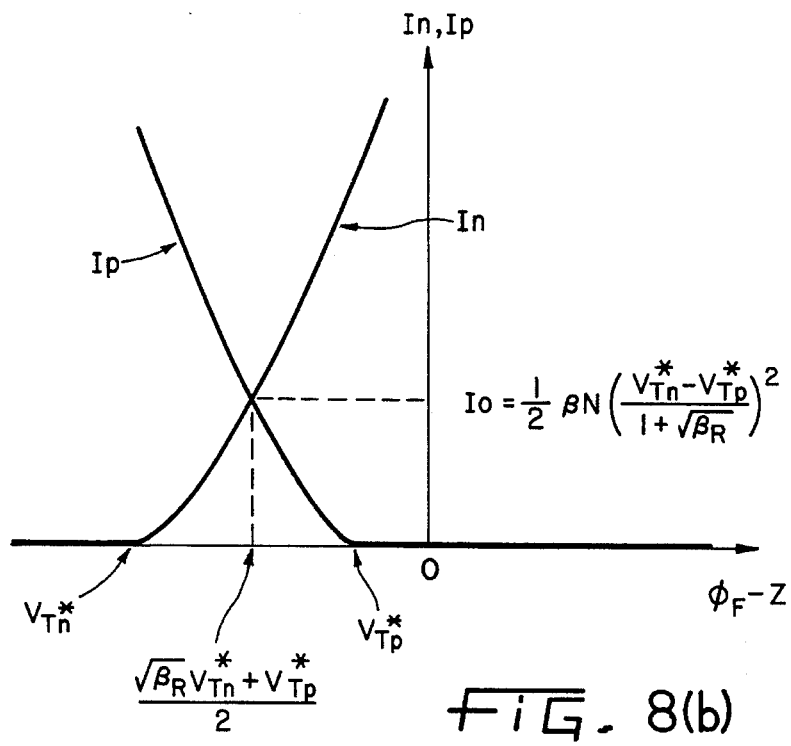
FIG. 8(b) is a diagram showing the currents $I_n$ and $I_p$ flowing in the N-vMOS transistor and the P-vMOS transistor as a function of $\phi_F$ -Z.

FIG. 8(b) is a diagram showing the currents $I_n$ and $I_p$ flowing in the N-vMOS transistor and the P-vMOS transistor as a function of $\phi_F$-Z; the point at which both currents are equal, that is to say, the point of intersection of both characteristics, determines the direct current $I_0$ flowing in the circuit, as well as the output current. In order that the characteristics of $I_n$ and $I_p$ possess a point of intersection, it is necessary to satisfy the following condition:

$$V_{Tn}^* \leq V_{Tp}^* \quad (32)$$

At this time, a direct current which is expressed by the following formula flows in the circuit:

$$I_0 = \frac{1}{2} \beta_N \left( \frac{V_{Tn}^* - V_{Tp}^*}{1 + \sqrt{\beta_R}} \right)^2 \quad (33)$$

Accordingly, if $V_{Tn}^*$ is set equal to $V_{Tp}^*$, then $I_0$ equals 0, and the smallest power dissipation is attained. If $\beta_R$ is set equal to 1 for the purpose of simplicity, then the following formula follows from Formula (31):

$$V_{Tn}^* = V_{Tp}^* = -(\tfrac{1}{16}) V_{DD}$$

and it is clear that the N-vMOS transistor must be made a depression type. However, if in formula (30) $V_4$ is set equal to $V_{DD}$, and $(C_4/C_{TOT}) > (\tfrac{1}{16})$, then the following results:

$$\frac{\sqrt{\beta_R} \, V_{Tn}^* + V_{Tp}^*}{\sqrt{\beta_R} + 1} = \left( \frac{C_4}{C_{TOT}} - \frac{1}{16} \right) V_{DD}$$

and the N-vMOS transistor becomes an enhancement type transistor. Either method is of course possible.

It is also possible to set conditions such that $V_{Tn}^* < V_{Tp}^*$. If this is done, a direct current is caused to flow, in accordance with Formula (33); however, if the value of $V_{Tn}^* - V_{Tp}^*$ is made sufficiently small, than a sufficiently small current value can be attained. In this case, the current driving ability of each transistor 802 and 803 is increased, and it is possible to increase the speed of circuit operations.

On the other hand, although it contradicts Formula (32), it is also possible to set conditions such that $V_{Tn}^* > V_{Tp}^*$. In this case, the output potential may have an uncertain value within a range of $V_{Tp}^* \leq Z \leq V_{Tn}^*$; however, this will present no problems insofar as the value of $V_{Tn}^* - V_{Tp}^*$ is set within the required accuracy. In this case, no direct current flows, and it is possible to realize a circuit which has an extremely low power dissipation.

The D/A converter circuit shown in FIG. 8(a) maintains the output voltage in a state where one of the N-vMOS transistor and P-vMOS transistor is essentially in an OFF state, so that such a circuit reduces power dissipation strikingly in comparison with a conventional source follower circuit (reference numeral 107 in FIG. 1(a)) which employs a resistance load.

Moreover, the circuit operates at a high speed. When the output level increases, the upper N-vMOS transistor 803 enters an ON state, and a current is caused to flow; however, at this time the lower P-vMOS transistor 802 is in an OFF state, so that the entire current is used only to charge output line 804, and the amount of time in which the voltage rises is shortened. In the circuit indicated by reference numeral 107, the current flows to resistor $R_2$, so that the charging current decreases to that extent, and the time required is thus lengthened. Furthermore, in the case in which the output level declines, the lower P-vMOS transistor is in an ON state, and the charge of output line 804 is discharged, so that it is possible to rapidly decrease the level. In the conventional circuit represented by reference numeral 107, discharge is accomplished via resistor $R_2$, so that in order to decrease power dissipation, $R_2$ enlarged, and thereby, the time required for discharge is lengthened, and in particular in the case of the reduction of the level, the response speed becomes slow.

In accordance with the fifth embodiment of the present invention, it is possible to realize a D/A converter circuit which operates at a high speed and has low power dissipation. The circuit represented by reference numeral 801 has a form in which NMOS transistor and an PMOS transistor are interchanged in the CMOS inverter, so that such a structure is termed a reciprocal CMOS transfer amplifier.

Figure 8C:
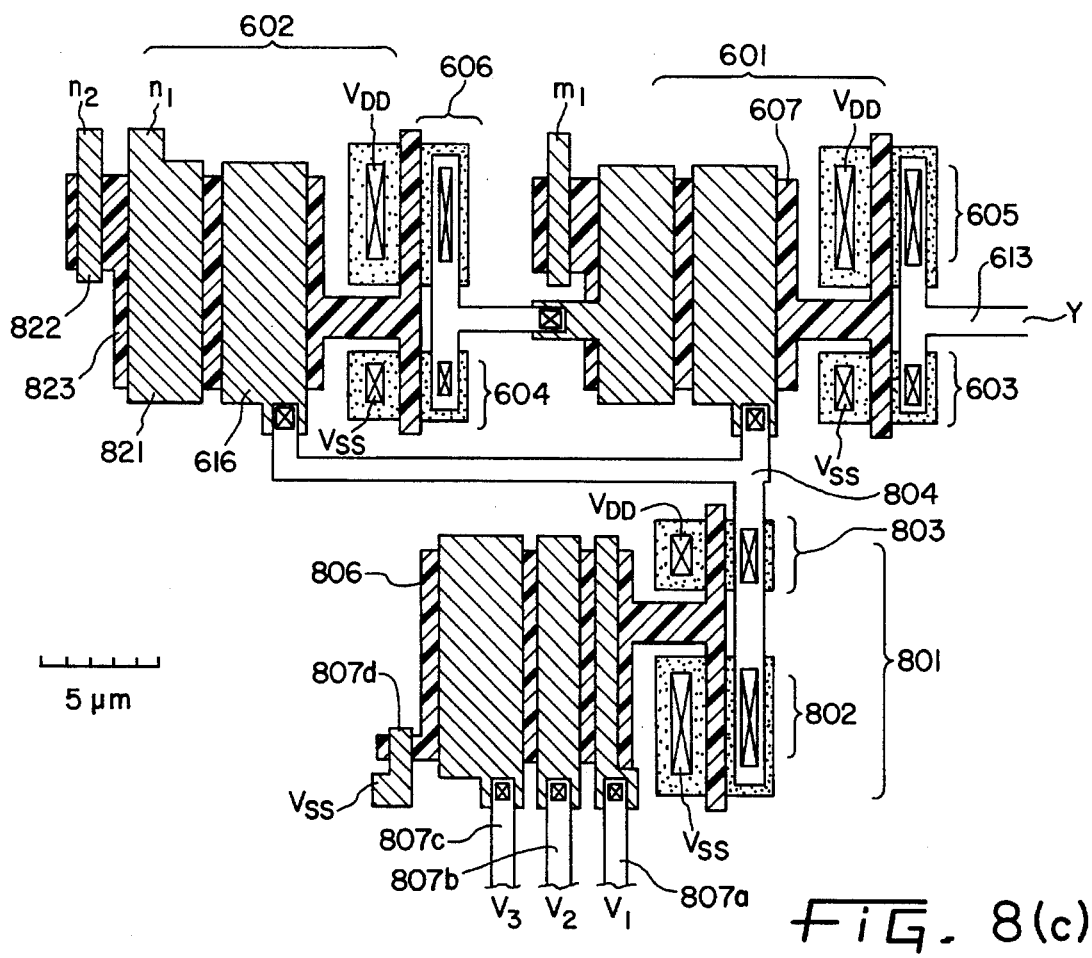
FIG. 8(d) is a design drawing of the layout pattern of FIG. 8(a).
Figure 8D:
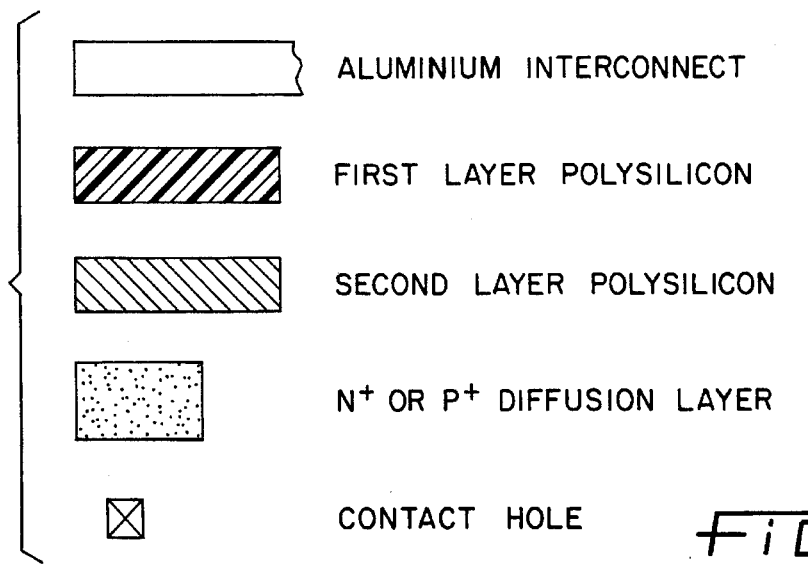

Next, a layout pattern of FIG. 8(a), which shows the fifth embodiment of the present invention, is shown in FIG. 8(c). With respect to the vMOS transistor circuit of reference numeral 805, the circuitry shown in FIG. 6 was used; however, in inverter 602, the circuitry shown in FIG. 6(b), in which the second control gate electrode was divided into two, was used. The reference numeral indicating the various parts in the diagram are identical to those of FIGS. 6 and 8. Furthermore, an explanatory diagram indicating what materials are used for the various patterns of the parts is shown in FIG. 8(d). Furthermore with respect to $V_{DD}$ and $V_{SS}$, the Al interconnection was omitted in order to render the pattern easy to understand. During pattern design, the following is assumed.

It is assumed that $\mu_e = 2\mu_h$, and conditions are set in the N-vMOS transistors such that L=0.8 µm, and W=3 µm, while conditions are set in the P-vMOS transistor such that L=0.8 µm and W=6 µm. Here, $\beta_R = 1$. The gate oxide film thickness is set to 150 Å, and the insulation film on the floating gate is a three layer film comprising, for example, $SiO_2/Si_3N_4/SiO_2$, corresponding to the oxide film of $t_O \times$(thickness)=150 Å. Conditions are set such that $C_0 = C_0^n + C_0^P = (\tfrac{1}{10}) C_{TOT}$. Under these conditions, the results of the pattern design are shown in FIG. 8(c).

In the above example, the case was described in which binary digital signals were inputted into $V_1$, $V_2$, and $V_3$, and weighted by a factor of 1, 4, and 8, respectively, to output a signal to Z; however, where necessary, this weighting may be changed. Furthermore, the inputs into $V_1$, $V_2$, and $V_3$ need not necessarily be binary digital signals; for example, it is also possible to use multivalued logical signals having 3 or 4 values, or the like. For example, if the 3-value signals of the three inputs are designated by $X_1$, $X_2$, and $X_3$, then it is possible to conduct analog conversion of the 3-value signals by weighting by a factor of 1, 3, and 9, respectively. Furthermore, it is clear that it is possible to input a continuous analog signal.

(Sixth Embodiment)

Figure 9A:
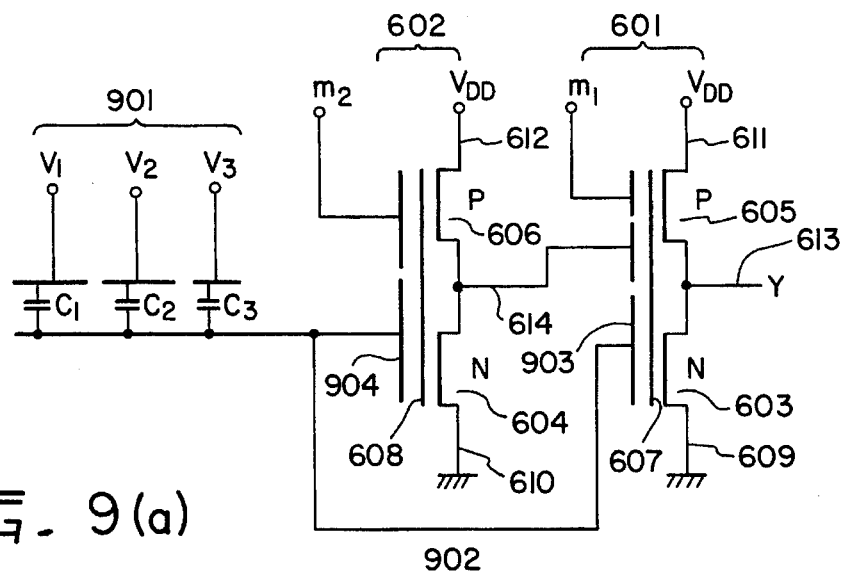
FIG. 9(a) is a circuit diagram showing the sixth embodiment of the present invention.

FIG. 9(a) is a circuit diagram showing the sixth embodiment of the present invention. In this circuit the D/A converter of FIG. 6(a) was replaced by the circuit shown by reference numeral 901, and with the exception of reference numeral 901, all parts are identical to those of the fourth embodiment shown in FIG. 6(a), and have numbers which are identical to those of FIG. 6(a).

Figure 9B:
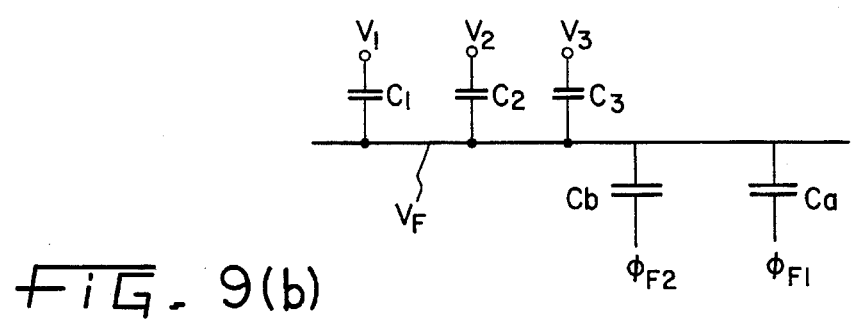
FIG. 9(b) is a diagram simplified for determining the potential $V_F$ of the input line 902.

In the present embodiment, the input line 902 into inverters 601 and 602 is made in potentially floating state, and the input signals $V_1$, $V_2$, and $V_3$ are inputted by means of capacitive coupling. In FIG. 9(b), a simplified diagram for the purpose of determining the potential, in which the potential of the input line 902 is designated by $V_F$, is shown.

In the diagram, references $\phi_{F1}$ and $\phi_{F2}$ represent the potentials of floating gates 607 and 608, while references $C_a$ and $C_b$ represent the capacitive coupling coefficients between control gate electrodes 903, 904 and respective floating gate. The following formula is clear from the diagram:

$$V_F=(1/C_{TOT})(C_1V_1+C_2V_2+C_3V_3+C_a\phi_{F1}+C_b\phi_{F2})$$

It can be seen from this formula that the potential $V_F$ varies as a result not only of $V_1$, $V_2$, and $V_3$, but also as a result of the values of $\phi_{F1}$ and $\phi_{F2}$. Accordingly, variations in the potential of other electrodes exert an effect through $\phi_{F1}$ and $\phi_{F2}$, so that this is not desirable from the point of view of accuracy. In order to prevent this, it is desirable to set $C_1$, $C_2$, and $C_3$, to sufficiently large values in comparison with $C_a$ and $C_b$. That is to say, conditions should be such that $C_1$, $C_2$, $C_3 \gg C_a$ and $C_b$. By proceeding in this manner, the input signals enter the input line directly, rather than via a source follower circuit, so that this is extremely advantageous for an increase in circuit operational speed.

(Seventh Embodiment)

Figure 10A:
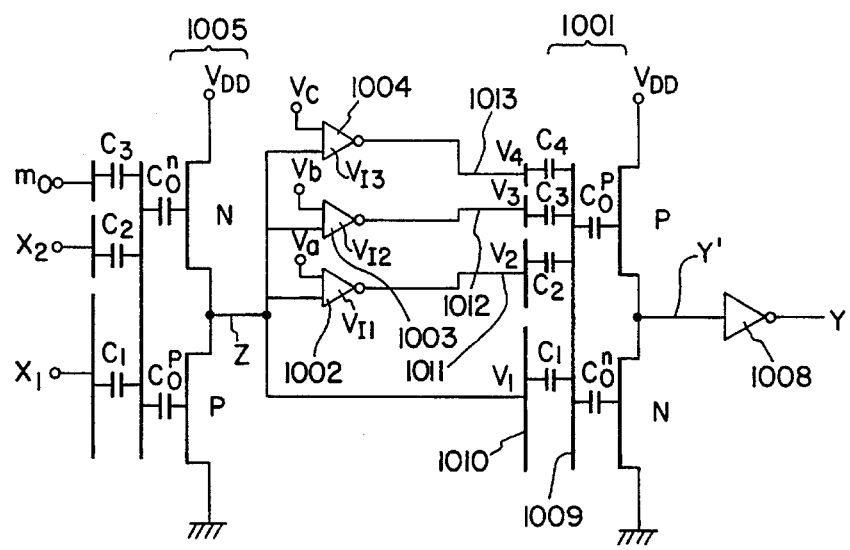
FIG. 10(a) is a circuit diagram showing the seventh embodiment of the present invention.

Next, the seventh embodiment of the present invention is shown in FIG. 10(a). The circuit shown in FIG. 10(a) conducts logical calculations with respect to two binary input signals, and outputs the result of the calculation to Y: however, by means of signals added to the three terminals $V_a$, $V_b$, and $V_c$, this circuit is capable of freely selected logical calculations. For example, if conditions are set such that $V_a=V_b=(¼) V_{DD}$ and $V_c=V_{DD}$, then $$Y=(X_1 \oplus X_2),$$

that is to say, the XOR is outputted, and when conditions are set such that $V_a=V_c=V_{DD}$, and $V_b=0$, then $Y=X_1 \cdot X_2$; that is to say, the circuit is an AND circuit. That is to say, the circuit of the present embodiment is capable of conducting all types of logical calculations with respect to 2 bit input signals using the same hardware. Functions may be changed by merely altering the values of the control signals $V_a$, $V_b$, and $V_c$. That is to say, this circuit is a soft-hardware logic circuit having extremely high function.

Table 2 shows a chart of all existing functions with respect to two binary inputs $X_1$ and $X_2$; there are 16 functions $f_0$–$f_{15}$. Function $f_1$ is termed an AND function, function $f_{14}$ is termed an NAND function, function $f_7$ is termed an OR function, function $f_8$ is termed a NOR function, function $f_6$ is termed an XOR function, and function $f_9$ is termed an XNOR function.

Table 3 shows the values of the control signals $V_a$, $V_b$, and $V_c$ which are necessary in order to realize these functions. In the table, values 0 and 1 represent 0V and $V_{DD}$, respectively, while values (¼), (½), and (¾) represent (¼)$V_{DD}$, and (½)$V_{DD}$, (¾)$V_{DD}$, respectively.

In the circuit shown in FIG. 10(a), reference numeral 1001 indicates a vMOS inverter gate having a CMOS structure, while reference numerals 1002, 1003, and 1004 indicate inverters which have variable inversion voltages. These inverters have inversion voltages $V_{11}$, $V_{12}$, and $V_{13}$, respectively, and the values thereof are controlled by means of $V_a$, $V_b$, and $V_c$. Reference numeral 1005 indicates the D/A converter which is depicted in FIG. 8. D/A converter 1005 may be designed, for example, in the following manner.

$$C_1=(¼)C_{TOT}$$

$$C_2=(½)C_{TOT}$$

$$C_3+C_0^n+C_0^p=(¼)C_{TOT}$$

$$m_0=0$$

$$V_{Tn}^*+V_{Tp}^*=-(1¼)V_{DD}$$

$$\beta_R=1$$

If these design values are inputted into formula (29), then the following formula results:

$$Z=V_{DD}\{(¼)X_1+(½)X_2\}+(V_{DD}/8) \quad (34)$$

Figure 10B:
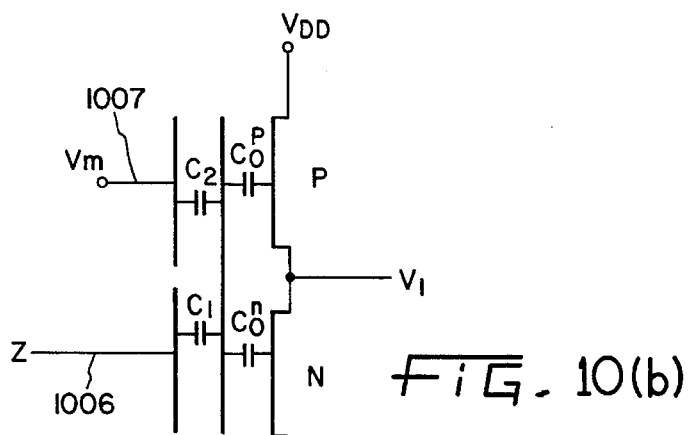
FIG. 10(b) is a block diagram of a vMOS gate.
Figure 10C:
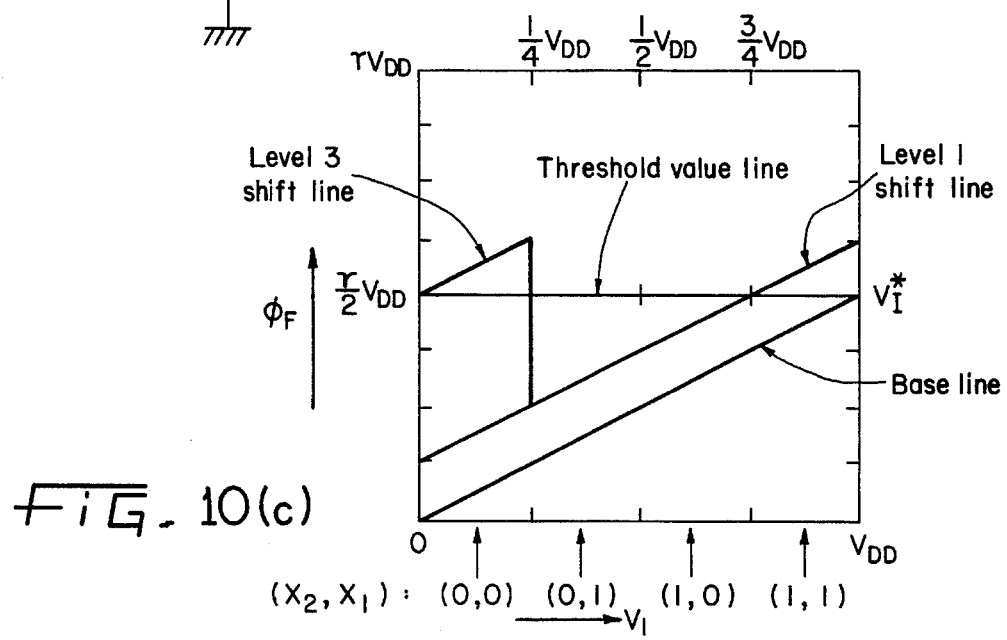
FIG. 10(c) is a diagram showing the relationship between the potential $\phi_F$ of floating gate 1009 and the potential $V_1$ of control gate electrode 1010 in an example of FPD.

The relationship between the combination of $X_1$ and $X_2$ and the output voltage Z (or $V_1$) of the circuit 1005 is shown on the horizontal axis of the FPD (floating potential diagram) of FIG. 10(c). That is to say, with respect to conditions such that $(X_2, X_1)=(0, 0), (0, 1), (1, 0),$ and $(1, 1)$, the following values result: $Z=V_1=(⅛)C_{DD}, (⅜)V_{DD}, (⅝)V_{DD},$ and (⅞)$V_{DD}$.

Variable threshold inverters 1002, 1003, and 1004 may be, for example, circuits such as that shown in FIG. 10(b). The design of such circuits is conducted, for example, in the following manner.

$$C_1=C_2 \quad (34)$$

$$V_{Tn}^*+V_{Tp}^*=-(C_0/C_{TOT})V_{DD} \quad (35)$$

$$(C_0=C_0^n+C_0^p, \ C_{TOT}=C_0+C_1+C_2)$$

$$\beta_R=1$$

If formula (35) is substituted into Formula (20), then the following formula results:

$$V_1^*=(C_1/C_{TOT})V_{DD} \quad (36)$$

If formulas (34) and (36) are substituted into formula (14), then the following formula results:

$$V_1=V_{DD}-V_m \quad (37)$$

$V_1$ indicates the inversion voltage of the inverter as seen from control gate electrode 1006; this can be controlled by means of the amplitude of the voltage Vm which is inputted into another control gate electrode 1007. Accordingly, the inversion voltages of inverters 1002, 1003, and 1004, are given by the following formulas, respectively.

$$V_{11}=V_{DD}-V_a \quad (38)$$

$$V_{12}=V_{DD}-V_b \quad (39)$$

$$V_{13}=V_{DD}-V_c \quad (40)$$

Next, the neuron gate 1001 having a CMOS structure which conducts calculations will be discussed. The design of neuron gate 1001 may be carried out, for example, in the following manner.

$$C_1 = (1/2)(C_{TOT} - C_0) \quad (41)$$

$$C_2 = (1/4)(C_{TOT} - C_0) \quad (42)$$

$$C_3 = C_4 = (1/8)(C_{TOT} - C_0) \quad (43)$$

$$V_{Tn}^* + V_{Tp}^* = -(C_0/C_{TOT})V_{DD} \quad (44)$$

$$\beta_R = 1 \quad (45)$$

Reference numeral 1008 indicates an ordinary inverter. This inverter is placed in the circuit in order to form the output signal vMOS gate 1001; it is not absolutely necessary. It may be omitted, as is the case in the first through sixth embodiments. However, by means of incorporating this inverter, it is possible to increase the accuracy of the output of 1 and 0.

Next, it will be explained that the circuit depicted in FIG. 10(a) is capable of realizing all the functions shown in Table 2. In the explanation, an FPD is used, so that the method of reading and FPD will be explained here once again. FIG. 10 (c) shows an example of an FPD; the ordinate indicates the potential $\phi_F$ of floating gate 1009, while the horizontal axis indicates the potential $V_1$ of control gate 1010. The values of $V_1$ corresponding to values $X_1$ and $X_2$ are also indicated by means of arrows on the abscissa. The horizontal line is termed a threshold value line, indicating the inversion voltage of inverter 1001 as seen from floating gate 1009. If Formula (44) is substituted into Formula (20), then the following formula results.

$$V_1^* = (1/2)((C_{TOT} - C_0)/C_{TOT})V_{DD} \quad (46)$$

In the diagram, the threshold value line is drawn at the point at which $\phi_F = (1/2)\gamma V_{DD}$. Here, $\gamma = (C_{TOT} - C_0)/C_{TOT}$.

The base line indicates the relationship between $\phi_F$ and $V_1$ in the case in which $V_2 = V_3 = V_4 = 0$. The other sloping lines indicate cases in which the input of $V_{DD}$ was added to one of the other control gate electrodes 1011, 1012, and 1013; it can be seen that $\phi_F$ is shifted upward from the baseline by a specified value. The amount of this shift will be explained using $(1/8)\gamma V_{DD}$ as a standard. In other words, a shift of $(1/8)\gamma V_{DD}$ will be termed a level 1 shift, while a shift of $(2/8)\gamma V_{DD}$ will be termed a level 2 shift. In the diagram, a level 1 and a level 3 shift are placed above the base line.

However, the level 3 shift line ends at a point where $V_1 = (1/4)V_{DD}$. In this FPD, in the region where the value of $\phi_F$ exceeds the threshold value line, the output of gate 1001 becomes 0. Accordingly, the value of Y, which is the value passed through a one stage inverter, becomes 1.

That is to say, in the case where $\phi_F$ exceeds the threshold value line, a value of 1 is outputted.

In the example shown in the figure, the value of 1 is outputted when $(X_2, X_1) = (0, 0)$ or $(1, 1)$, and the circuit shown in FIG. 10(a) calculated XNOR, that is to say, calculates the function $f_9$. This is the manner in which the FPD is to be read.

Hereinbelow, a design method for soft-hardware logic having two binary inputs will be explained using an FPD, and by means of this, the operation of the circuit shown in FIG. 10(a) will be explained.

Figure 11A:
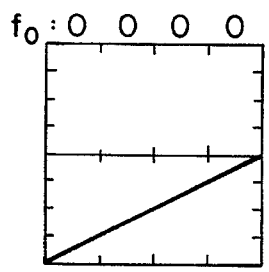
FIGS. 11(a)–(p) are FPD diagrams corresponding to the functions shown in Table 2.
Figure 11B:
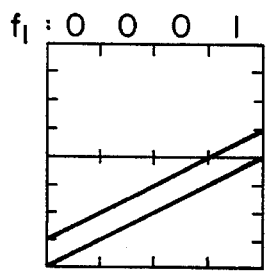
Figure 11C:
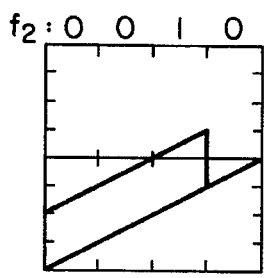
Figure 11D:
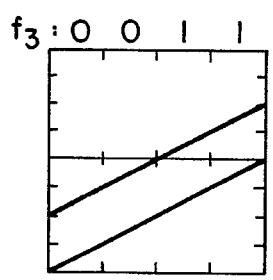
Figure 11E:
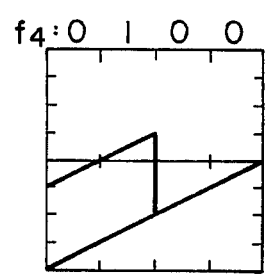
Figure 11F:
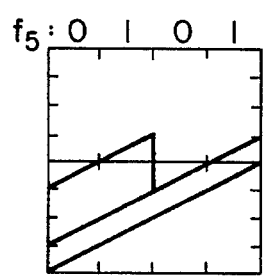
Figure 11G:
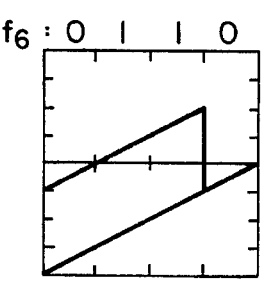
Figure 11H:
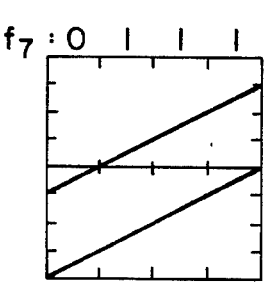
Figure 11I:
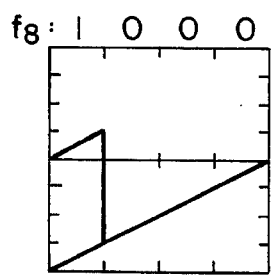
Figure 11M:
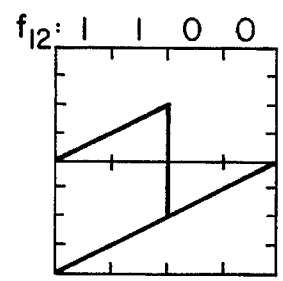
Figure 11J:
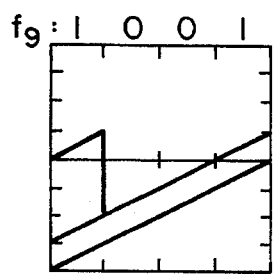
Figure 11N:
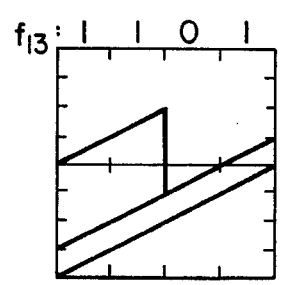
Figure 11K:
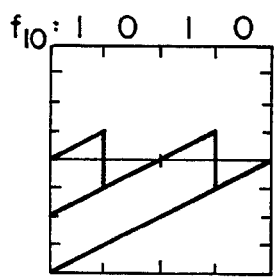
Figure 11O:
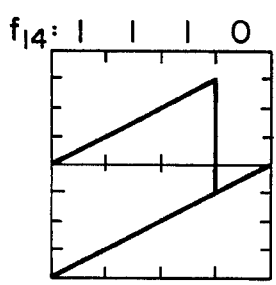
Figure 11L:
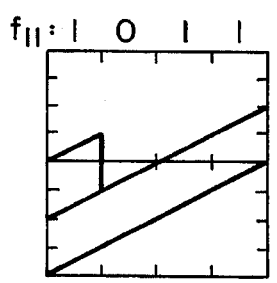
Figure 11P:
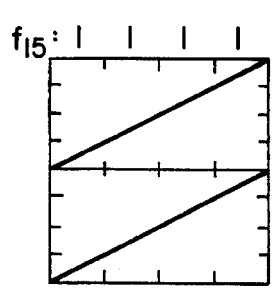

FIGS. 11(a) to (p) are FPDs corresponding to all of the functions shown in Table 2. The relationship of $\phi_F$ and $V_1$ which permits the realization of various functions is shown. The combination of signal levels necessary to produce the signal waveform of $\phi_F$ is shown below.

| Level 0 | ($f_0$) |
| Level 1 | ($f_1$) |
| Level 2 | ($f_2, f_3$) |
| Level 3 | ($f_4, f_6, f_7$) |
| Level 2+Level 1 | ($f_5$) |
| Level 4 | ($f_8, f_{12}, f_{14}, f_{15}$) |
| Level 3+Level 1 | ($f_9, f_{13}$) |
| Level 2+Level 2 | ($f_{10}, f_{11}$) |

As can be seen from the above classification, all signal levels 1, 2, 3, and 4 are necessary. However, in the case of a 2 input FPD, a maximum shift is 4 level. By preparing two level 1 signals and one level 2 signal, it is possible to deal with all cases. Level 3 may be obtained by adding level 1 and level 2, while level 4 may be obtained by adding all levels. To explain more concretely, FIG. 11(g) shows a case in which, for example, in order to realize function $f_6$(XOR), a level 1 signal and a level 2 signal, within a range of $V_1 = 0 \neq (3/4)V_{DD}$, may be added to $\phi_F$.

In order to place a level 2 signal on $\phi_F$, conditions may be set so that, for example, in gate 1001 in FIG. 10, $C_2 = (1/8)(C_{TOT} - C_0) \times 2$, and $V_2 = V_{DD}$. The design value of $C_2$ of formula (42) is determined in this manner. When $V_1 \geq (3/4)V_{DD}$, then $V_2$ must be set equal to 0, so it is necessary that the inversion voltage $V_{11}$ of inverter 1002 be set equal to a value of $(3/4) V_{DD}$. Accordingly, from Formula (38), the following follows:

$$V_a = (1/4)V_{DD} \quad (47)$$

Furthermore, in order to place a level 1 signal on $\phi_F$, in gate 1001 of FIG. 10, conditions may be set such that $C_3 = (1/8)(C_{TOT} - C_0)$, and $V_3 = V_{DD}$. The value of $C_3$ of Formula (43) is determined in this manner. $C_4$ is determined in an identical manner. The level 1 signal must be cut at a point at which $V_1 \geq (3/4) V_{DD}$, so that $V_{12} = (3/4) V_{DD}$, so that is to say, from Formula (38);

$$V_b = (1/4)V_{DD} \quad (48)$$

The other level 1 signal must never be cut, so that $V_{13} = 0$; that is to say;

$$V_c = V_{DD} \quad (49)$$

The results of Formulas (47), (48), and (49) are entered into the function $f_6$ column of Table 3. It is possible to determine the values $V_a$, $V_b$, and $V_c$ with respect to the other functions by means of the same concept.

The circuit shown in FIG. 10(a) comprises 10 vMOS transistors and 2 ordinary MOS transistors, for a total of 12 elements, which is an extremely small number. Despite this, this circuit is able to realize all logical calculations, including AND, OR, NAND, NOR, XOR, XNOR, with respect to a two binary signals.

In the conventional technology, when a 2-input XNOR circuit was constructed using CMOS circuitry, such as that shown, for example, in FIG. 36, 14 MOS transistors were necessary. Moreover, in order to change the function, it was necessary to completely rebuild all the hardware. That is to say, in order to realize 16 functions, 16 separate circuits were necessary, and the required switching circuitry was also necessary, so that it was completely impossible to realize all functions by means of simple circuitry, as is the case with the present invention. This is possible for the first time by means of the present invention.

In the circuit shown in FIG. 10(a), the vMOS gates of inverters 1002, 1003, and 1004 all are one stage; however, for example, ordinary inverters of one stage or more may be added.

That is to say, for example, the output of 1002 may be inputted into a conventional inverter, and the output thereof may be added to control gate 1011. Furthermore, the inverter may of 2 or more stages may be added. By proceeding in this manner, it is possible to form the output wave form of the inverter accurately so as to have a value of 1 or 0. In the same manner, it should be clear that one or more stages may be added to inverter 1008.

Two-input νMOS gates such as that shown in FIG. 10(*b*) were used for variable threshold inverters 1002–1004. In this case, by means of changing the amplitude of the signal added to control gate 1007 to one of the 5 values 0, (¼)$V_{DD}$, (½)$V_{DD}$, (¾)$V_{DD}$, and $V_{DD}$, it was possible to change the inversion voltage $V_I$, as seen from another control gate 1006, to a value of $V_{DD}$, (¾)$V_{DD}$, (½)$V_{DD}$, (¼)$V_{DD}$, and 0, respectively (Formulas (38)–(40)). That is to say, 5-value input signals are necessary for the variation of the function of the circuit shown in FIG. 10(*a*). In the case where all controls are conducted by means of binary signals, a circuit such as that shown, for example, in FIG. 10(*d*) may be used in place of the circuit shown in FIG. 10(*b*).

In the diagram, if the following conditions are established:

$$C_1 = (½) (C_{TOT} - C_0)$$

$$C_2 = (⅛) (C_{TOT} - C_0)$$

$$C_3 = (¼) (C_{TOT} - C_0)$$

$$C_4 = (⅛) (C_{TOT} - C_0)$$

$$V_{Tn}^* + V_{Tp}^* = -(C_0/C_{TOT})V_{DD}$$

$$\beta_R = 1$$

then from Formulas (20) and (14), the following formula is obtained:

$$V_I = V_{DD} - (¼)(a_1 + 2a_2 + a_3)$$

accordingly, it is possible to set all necessary values of VI by means of setting the variables $a_1$, $a_2$, and $a_3$, to a value of 0 V or $V_{DD}$.

In addition, it is possible to use a circuit such as that shown in FIG. 10(*e*). In this case, if conditions are established such that $C_1 = (½) (C_{TOT} - C_0)$, and $C_2 = C_3 = C_4 = C_5 = (⅛) (C_{TOT} - C_0)$, then the following formula results:

$$V_I = V_{DD} - (¼)(a_1 + a_2 + a_3 + a_4)$$

and if the number of inputs, among the 4 inputs $a_1$–$a_4$, having a level of $V_{DD}$ is represented by n, then $V_I = (1 - (n/4))V_{DD}$, and the value of VI can be set by means of the number n.

In these embodiments, it is possible to supply the binary signals $a_1$, $a_2$, $a_3$, $a_4$, and the like, directly via a signal line; however, as shown in FIG. 10(*f*), it is also possible to directly connect the outputs of flipflops 1020*a*, 1020*b*, and 1020*c*, and to control by incorporating data in these flipflops by means of a control signal X(1021). The incorporated data may be, where necessary, stored in a memory or the like.

(Eighth Embodiment)

The νMOS logical circuits shown in FIGS. 1(*a*), 4(*a*), 5(*a*), 6(*a*), 8(*a*), and 10(*a*) are all constructed so as to be provided with a D/A converter in the input stage. However, it is possible to construct a logical circuit possessing identical functions even if such a D/A converter is omitted.

Figure 12A:
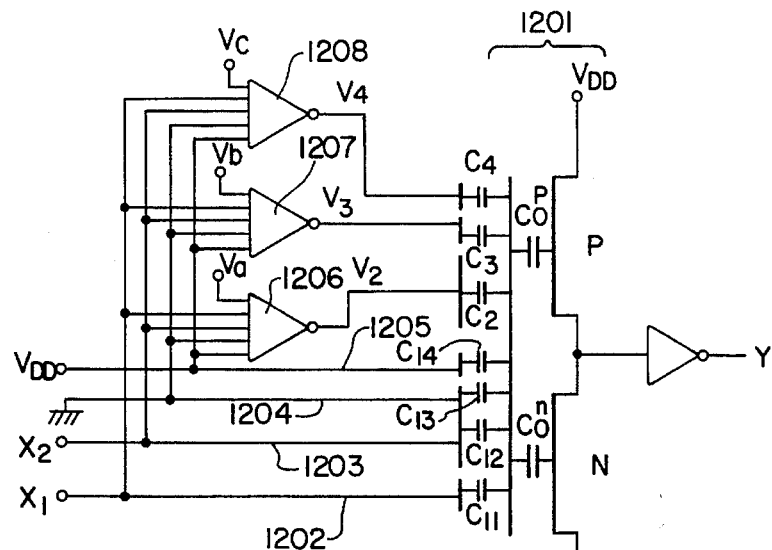
FIG. 12(a) is a circuit diagram showing the eighth embodiment of the present invention.
Figure 12B:
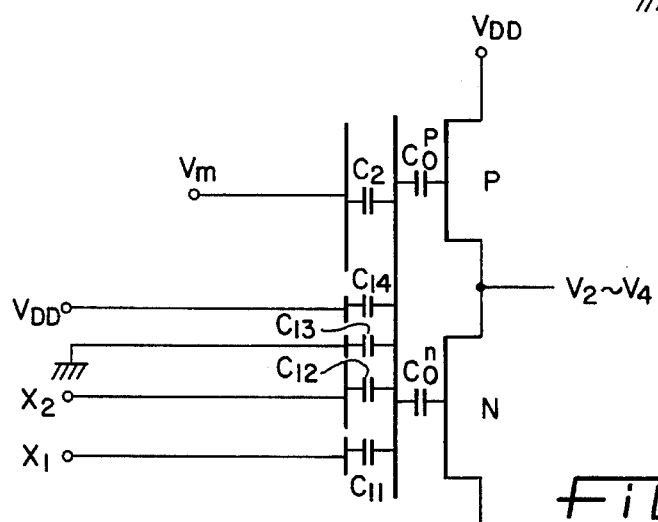
FIG. 12(b) is a circuit diagram showing a variable threshold inverter of the present embodiment.

An example of an νMOS logical circuit constructed without the use of a D/A converter is shown in FIG. 12(*a*) as the eighth embodiment of the present invention. This circuit is functionally completely identical to the 2 bit soft-hardware logic circuit shown in FIG. 10(*a*). The D/A converter 1005 depicted in FIG. 10(*a*) is omitted, and the two binary figures $X_1$ and $X_2$ are directly inputted into the control gate 1202 and 1203 of νMOS inverter 1201. Furthermore, a fixed bias of 0 V and $V_{DD}$ is applied to input gates 1204 and 1205, respectively. The capacitive coupling coefficients between these input gates and the floating gate are given by the following formulas.

$$C_{11} = (⅛) (C_{TOT} - C_0) \tag{50}$$

$$C_{12} = (¼) (C_{TOT} - C_0) \tag{51}$$

$$C_{13} = (1/16) (C_{TOT} - C_0) \tag{52}$$

$$C_{14} = (1/16) (C_{TOT} - C_0) \tag{53}$$

Here, $C_0 = C_0^n + C_0^p$.

With respect to νMOS inverter 1201, the other design parameters may be identical to those of inverter 1001 of FIG. 10(*a*). That is to say, the values of $C_2$, $C_3$, and $C_4$ can be given by Formulas (42) and (43), while the threshold value and $\beta_R$ of each νMOS may be given by formulas (44) and (45), respectively.

When conditions are set such that $V_2 = V_3 = V_4 = 0$, then the potential $\phi_F$ of the floating gate of 1201 is given by the following formula:

$$\phi_F = V_{DD}\{(½) X_1 + (¼) X_2 + 1/16\}$$

so that the FPD is identical to that of FIG. 10(*c*).

The sum of the capacitive coupling coefficients of input gates 1202, 1203, 1204, and 1205 is equal to the sum of the capacitive coupling coefficients of the other input gates. That is to say, $$C_{11} + C_{12} + C_{13} + C_{14} = C_2 + C_3 + C_4 = (½) (C_{TOT} - C_0)$$

With respect to variable threshold inverters 1206, 1207, and 1208, as well, in place of the conventional one input (Z in FIG. 10(*a*)), four inputs are used. The structure of the input gates is shown in FIG. 12(*b*). References $C_{11}$–$C_{14}$ are identical to the inputs of inverter 1201, and are given by formulas (50)–(53), respectively. $C_2$ is identical to that shown in FIG. 10(*b*), and is given by the following formula:

$$C_2 = (½) (C_{TOT} - C_0)$$

When the circuit of FIG. 12(*a*) is compared with the circuit of FIG. 10(*a*), it becomes clear that because the D/A converter can be omitted, the number of elements is further reduced. In addition, because the input signals are inputted directly into the νMOS converters, the calculation speed is increased. In FIG. 10(*a*) a single signal line Z was sufficient; however, as the number was increased to 4 in the present embodiment, the interconnection increases. However, as shown hereinbelow in FIG. 14 as the tenth embodiment, as a result of skillful layout, this does not present a problem.

(Ninth Embodiment)

In FIG. 13(*a*), a logical circuit is shown which constitutes the ninth embodiment of the present invention. The functions of this circuit are identical in every respect to those of the circuits shown in FIG. 10(*a*) and FIG. 12(*a*); this circuit is a soft-hardware logic circuit operating with respect to 2 inputs $X_1$ and $X_2$. In comparison with the eighth embodiment shown in FIG. 12(*a*), the only differences lie in that the input lines for 0 V and $V_{DD}$ (input lines 1204 and 1205, respectively) are omitted, and only 2 lines 1302 and 1303, for the purpose of inputs $X_1$ and $X_2$ exist; that is to say, the structure is simplified to this extent.

The design values of the vMOS inverter 1301 are as given below:

$$C_{11}=(1/7)(C_{TOT}-C_0) \quad (54)$$

$$C_{12}=(2/7)(C_{TOT}-C_0) \quad (55)$$

$$C_2=(2/7)(C_{TOT}-C_0) \quad (56)$$

$$C_3=(1/7)(C_{TOT}-C_0) \quad (57)$$

$$C_4=(1/7)(C_{TOT}-C_0) \quad (58)$$

The other design values are identical to those of 1001 in FIG. 10(a). Furthermore, the variable threshold inverters 1304–1306 have the structure shown in FIG. 13(b). With respect to the design parameters, $C_{11}$ and $C_{12}$ are identical to those of 1301, and have values given by (54) and (55). Furthermore, the value of $C_2$ is given by the following formula:

$$C_2=(4/7)(C_{TOT}-C_0) \quad (59)$$

Of course, the variable threshold inverters may have other structures, that is to say, structures such as those shown in FIG. 10(d), (e), (f), and the like. At this time, the input signals ($V_1$ or Z) comprise 2 inputs $X_1$ and $X_2$.

Figure 13A:
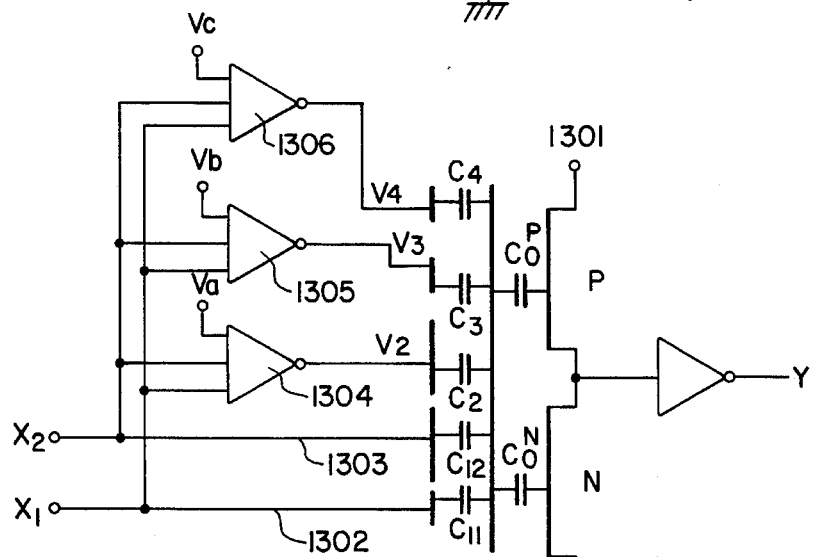
FIG. 13(a) is a circuit diagram showing the ninth embodiment of the present invention.
Figure 13B:
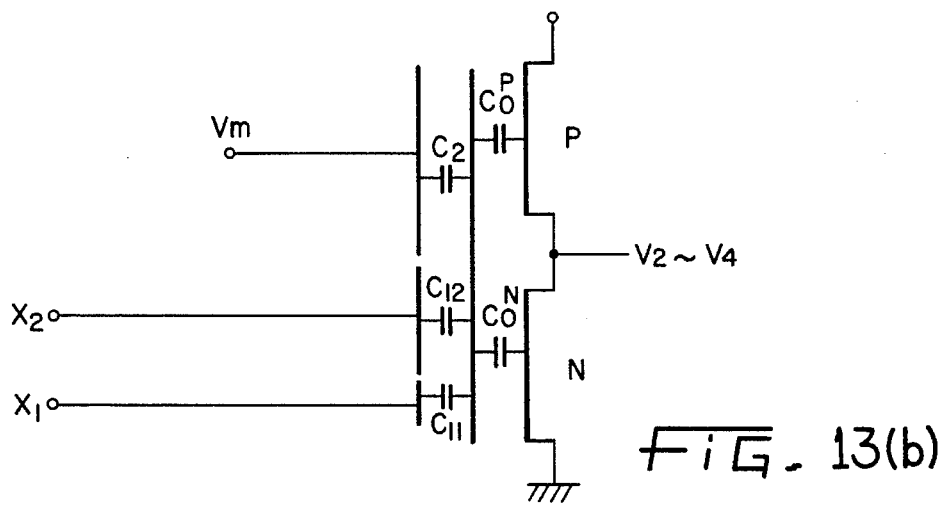
FIG. 13(b) is a circuit diagram showing a variable threshold inverter of the present embodiment.
Figure 13C:
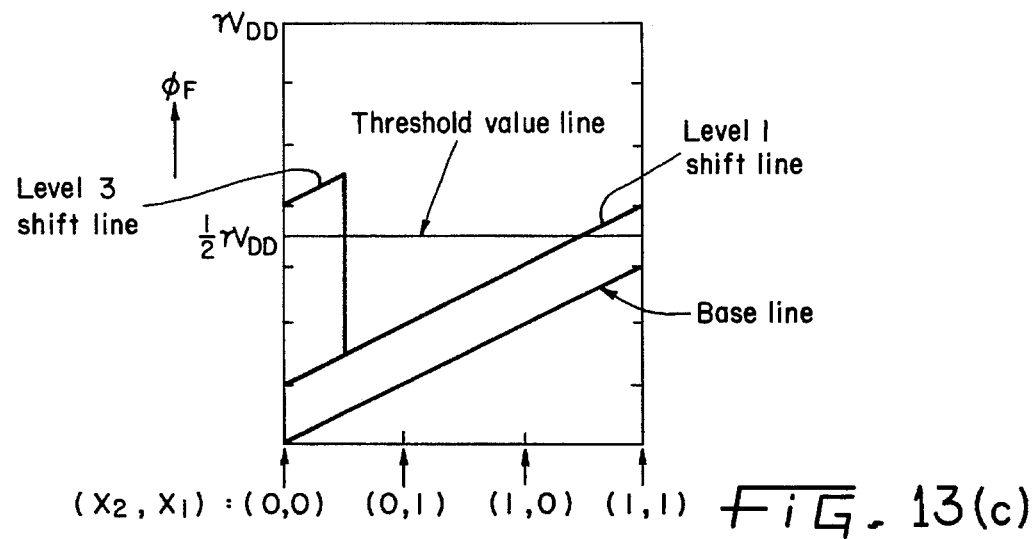
FIG. 13(c) is an FPD diagram of inverter 1301.

The floating potential diagram (FPD) of the inverter 1301 is shown in FIG. 13(c). In comparison with the FPD of FIG. 10(c), the position of the base line and the positions on the abscissa corresponding to combinations of ($X_2$, $X_1$) differ. This FPD represents a circuit which outputs a value 1 only during periods in which ($X_2$, $X_1$) is (0, 0) or (1, 1); that is to say, this diagram represents an XNOR circuit. In order to obtain this function, conditions may be set such that $V_a=V_b=$ (3/4)$V_{DD}$, and $V_c=0$; this is completely identical to the case shown in FIG. 10(a). That is to say, if the circuit shown in FIG. 13(a) uses the values of Table 3 as the values of $V_a$, $V_b$, and $V_c$, this circuit is capable of expressing all Boolean functions with respect to 2 input binary digital signals, in a manner identical to that of the circuit shown in FIG. 10(a).

As shown in the eighth and ninth embodiments above, it is possible to construct a vMOS logical circuit in a simple manner, even if a D/A converter is not used. By omitting a D/A converter, it is possible to further reduce the number of elements and increase the operational speed.

(Tenth Embodiment)

Figure 14:
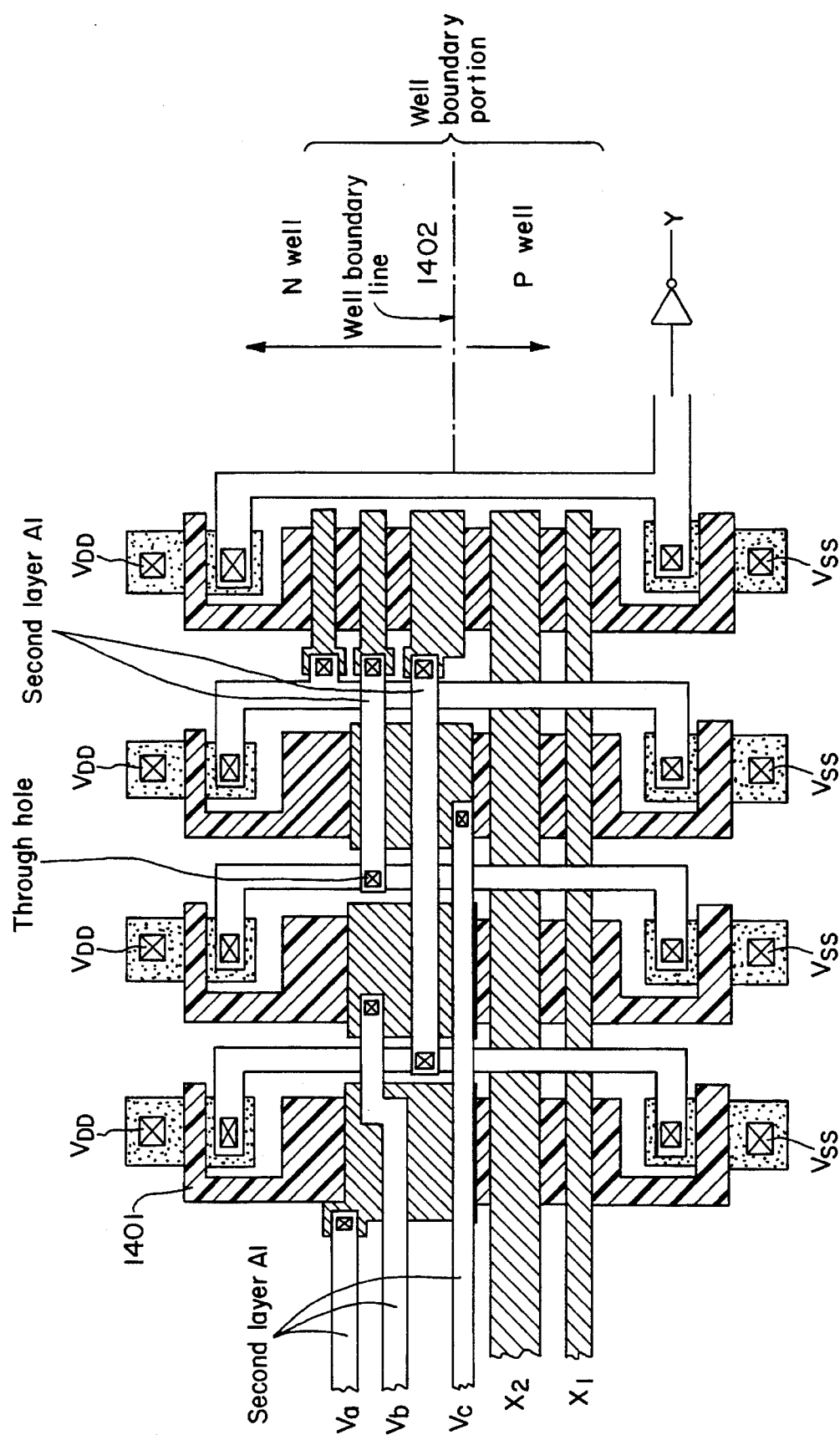
FIG. 14 is a layout pattern drawing of the circuitry of FIG. 13(a).

In FIG. 14, the tenth embodiment of the present invention is shown. The figure shows an example of a pattern in which the layout of the circuit of FIG. 13(a) is conducted by means of a CMOS structure. The symbol of each part is identical to that used in FIG. 8(d). The second layer Al interconnects and the through holes connecting the first layer and second layer Al interconnects, which were not contained in FIG. 8(d), are indicated directly in the figure.

The capacitive coupling portions of the floating gate 1401 and each input gate ($V_a$, $V_b$, $V_c$, $X_1$, $X_2$) are provided in the vicinity of the boundary line 1402 between the N well and the P well, that is to say, on the field oxide film on the well boundary portion.

Normally, since the transistor is formed at a sufficient distance from the well boundary line 1402 in order to prevent latch-up, if a capacitive coupling portion is disposed in this region, it is not necessary to provide excess surface area on the chip, which is advantageous for the attainment of large scale integration.

Furthermore, signals of $X_1$ and $X_2$ are transmitted through the direct capacitive coupling between the second layer polysilicon and the floating gate; a silicide having a lower resistance may be used therefor. Alternatively, counter measures such as making the second layer Al interconnects run parallel, providing contacts at certain spots, effectively reducing the resistance, are effective in increasing the speed.

In the eighth, ninth and tenth embodiments of the present invention, because the D/A converter at the input stage was omitted, 2 signal lines $X_1$ and $X_2$ were needed to transmit the input signals, in comparison with the one signal line which was conventionally necessary. However, as is clear from the layout shown in FIG. 14, signal lines $X_1$ and $X_2$ run in a completely parallel manner over the entire device, so that they do not cross. Accordingly, problems such as the increasing complexity of the layout pattern do not occur. That is to say, a logical circuit in which the initial stage D/A converter has been omitted is superior with respect to speed as well as with respect to an increase in large scale integration.

(Eleventh Embodiment)

Using an variable threshold inverter such as that shown in FIG. 10(f), the circuit shown in FIG. 10(a), and the circuits of the eighth, ninth, and tenth embodiments of the present invention, are capable of expressing functions by means of symbols such as those shown in FIG. 10(g). That is to say, such circuits perform logical calculations with respect to the binary input signal $$\mathbb{X}=(X_1, X_2, \ldots)$$

and output the calculation result $$Y=f_i(\mathbb{X})$$

which has a value of 1 or 0. What type of calculation is conducted is determined by means of the control signals:

$$\mathbb{A}=(a_1, a_2, a_3, \ldots)$$

Figure 15A:
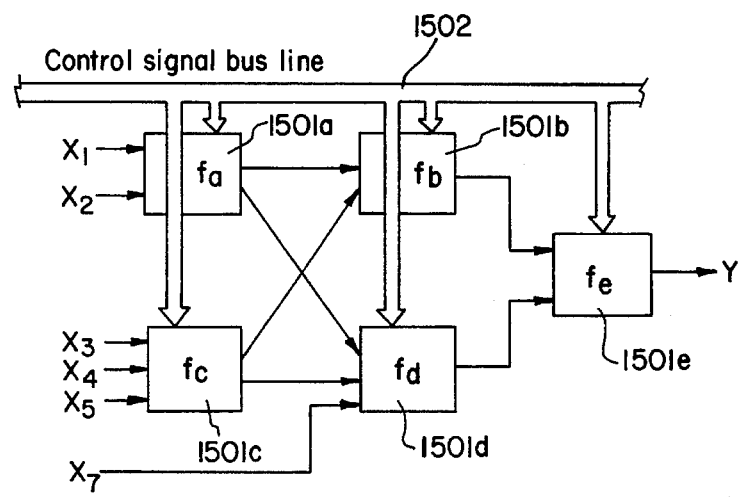
FIG. 15(a) is a circuit diagram showing the eleventh embodiment of the present invention.

A soft-hardware logic circuit in which a plurality of circuits shown in FIG. 10(g) are assembled as building blocks is shown in FIG. 15(a). This is a block diagram which shows the eleventh embodiment of the present invention.

References 1501a, 1501b and 1501e indicate 2 input soft-hardware circuits; these circuits have the structures shown in the seventh embodiment of the present invention. References 1501c and 1501d indicate soft hardware having 3 bit inputs; circuits such as those explained in the ninth embodiment may be used.

A signal of 1 or 0 is sent from the control signal bus line 1502 to each block, to set the circuit the function. This data may be sent, for example, from a memory circuit to each block; for example, the data may be latched in flipflops 1020a–1020c of a circuit such as that shown in FIG. 10(f). That is to say, by suitably altering the signal which is latched in each block, the circuit shown in FIG. 15(a) is capable of altering, in a freely transformable manner, the functions thereof.

Figure 15B:
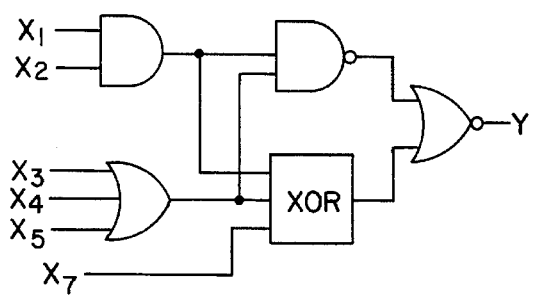
FIG. 15(b) is a logic diagram showing a function implemented using the present embodiment.
Figure 15C:
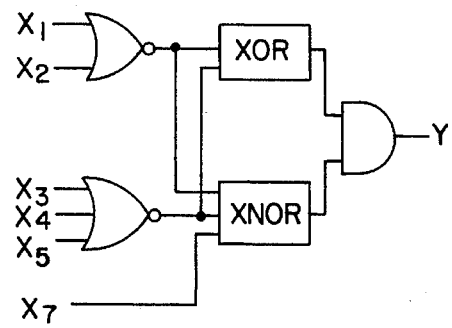
FIG. 15(c) is a logic diagram showing a second function implemented using the present embodiment.
Figure 15D:
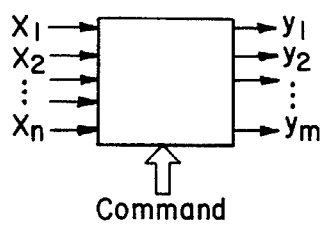
FIG. 15(d) is a conceptual diagram of a logic circuit utilizing the present embodiment.

FIGS. 15(b) and (c) show two such examples. That is to say, the logical LSI using the present invention is conceptually shown in FIG. 15(d). This circuit, while possessing the same hardware, is capable of freely altering the calculation function by means of external commands, just as if the hardware were being changed. This is a completely new concept in logical circuit construction and is an important invention which enables the construction of new computer architecture. The influence of this invention on the future development of logical circuitry cannot be measured.

(Twelfth Embodiment)

Figure 16:
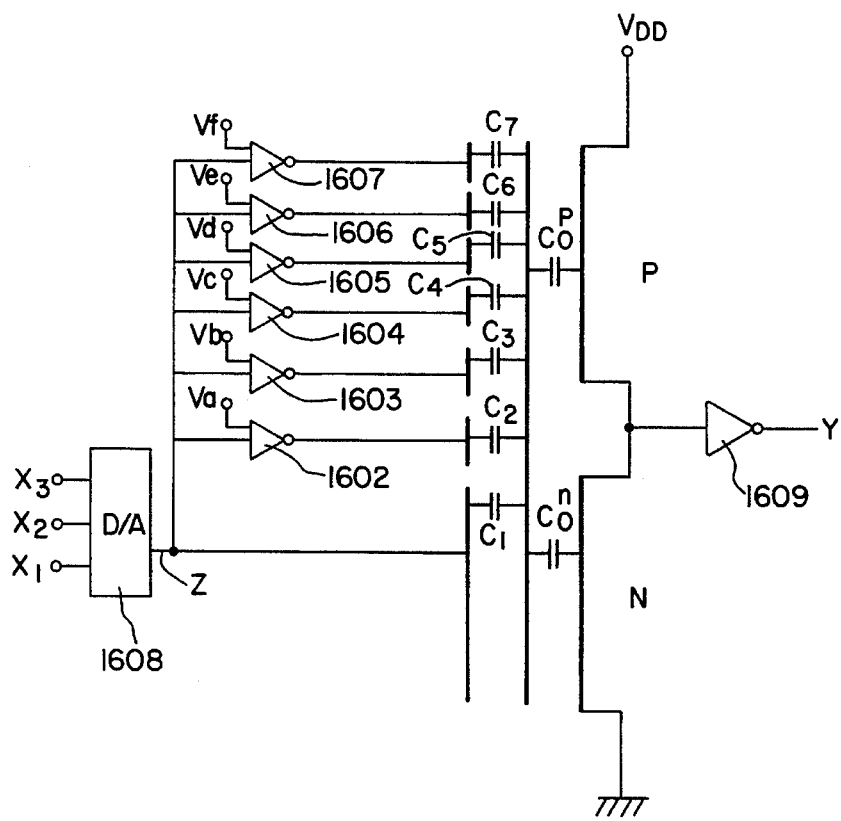
FIG. 16 is a circuit diagram of the twelfth embodiment of the present invention.

FIG. 16 is a circuit diagram showing the twelfth embodiment of the present invention; this circuit is capable of executing all logical calculations with respect to three binary signal inputs $X_1$, $X_2$ and $X_3$. The circuit structure is identical to that shown in the seventh embodiment in FIG. 10(a); it comprises as main components a seven-input vMOS gate 1601, 6 variable threshold inverters (1602–1607), and a 3-bit D/A converter 1608. Reference numeral 1609 indicates an inverter for output waveform rectification.

The vMOS inverter gate 1601 having an CMOS structure present circuit is designed, for example, in the following manner.

$$C_1 = (1/2)(C_{TOT} - C_0) \quad (60)$$

$$C_2 = C_3 = (1/8)(C_{TOT} - C_0) \quad (61)$$

$$C_4 = C_5 = C_6 = C_7 = (1/16)(C_{TOT} - C_0) \quad (62)$$

$$V_{Tn}^* + V_{Tp}^* = -(C_0/C_{TOT})V_{DD} \quad (63)$$

$$\beta_R = 1$$

As a result of an FPD analysis similar to that shown in FIG. 11, it was determined that all functions could be expressed by means of two level 2 signal inputs and four level 1 signal inputs.

Inverters 1602–1607 control the ON and OFF states of these signals; the inversion voltage of each inverter is controlled in accordance with Formula (37) by means of the input voltage $V_a$, $V_b$, $V_c$, ... $V_f$ or the like. These inverters may employ, for example, the circuitry shown in FIG. 10(b).

In this case, by setting the values of $V_a$, $V_b$, $V_c$, ... $V_f$ to one of the values expressed by $(V_{DD}/8) \times n$ (n represents an integer within a range of 0–8), all 256 functions can be expressed. A detailed table of the values is not given here; however, using the FPD method explained in FIG. 11, such a table could be easily created.

This circuit is accomplished by using not only soft-hardware logic but a fixed function circuit. At such a time, the voltage which is applied to the terminals $V_a$–$V_f$ may be such that the potential generated, for example, by resistance division, is applied to each terminal. Only a direct current potential is applied, and the input impedance has a value of infinity (∞) so that by using a sufficiently large resistance, it is possible to reduce the power dissipation to a sufficiently low level. By proceeding in this manner, a circuit is constructed by means of the repetition of an identical pattern, and only those patterns which determine the terminal voltages of $V_a$–$V_f$ need be subjected to pattern variation, where necessary, so that circuit pattern design becomes extremely simple.

Pattern design using a computer (CAD) can be conducted systematically and simply. If resistance division is employed in determining the potential of $V_a$–$V_f$, then the overall power dissipation increases. In order to prevent this, circuits such as shown, for example, in FIGS. 10(d) and (e) are used as the inverters 1602–1607, and where necessary, $a_1$, $a_2$, $a_3$, $a_4$, and the like may be connected to $V_{DD}$ or $V_{SS}$. It is possible to design a logical circuit simply by means of this type of interconnection. If this is applied to a gate array, a high degree of logical functions can be selected at each unit element, so that design becomes simple, and the degree of integration of the functions is considerably increased. It is also possible to employ an inverter such as that shown in FIG. 6(b). The inversion voltage $V_I$ as seen from terminal $V_I$ is given by the following formula:

$$V_I = V_{DD} - ((C_2'/C_1)n_1 + (C_2''/C_1)n_2)$$

The value of $C_1$ is given by the following formula:

$$C_1 = C_2' + C_2''$$

so that, for example, if $n_1$ and $n_2$ are defined as follows, $$n_1 = V_{DD}, n_2 = 0$$

then the following formula results:

$$V_1 = V_{DD} - (C_2'/C_1)n_1 \quad (64)$$

and by varying the value of $C_2'$, it is possible to set the value of $V_I$ to predetermined values. This is realized by changing the overlapping surface area of control gate electrodes 821 and 822 and floating gate electrode 823 in a layout such as that, for example, shown in FIG. 8(c). That is to say, it is possible to freely set the inversion voltage of the inverter and the threshold value of the transistor simply by means of pattern design.

In a conventional circuit such as that shown in FIG. 37(b), it was necessary to adjust the threshold value of each transistor separately by means of adjusting the dose amount of the ion implantation; however, in the elements in accordance with the present invention, only pattern design must be dealt with, so all problems which were conventionally present, such as the complexity of the process, the lack of a production margin in the process, leading to defects, and the like, are solved.

In other words, the present invention, in addition to the breakthrough characteristic of realizing soft-hardware logic in a simple manner, is also capable of realizing circuits possessing fixed functions by means of a simple process, and moreover, the automation of circuit design can be conducted extremely easily, so that the present invention possesses a number of advantageous characteristics.

Furthermore, if reference Z is considered to be an input signal, the circuit shown in FIG. 16 is a binary multiple threshold logical element such as that shown in FIG. 37(a); it can thus be seen that the element which functions as the basis of a multivalued logical circuit can be realized in a simple manner.

(Thirteenth Embodiment)

Figure 17A:
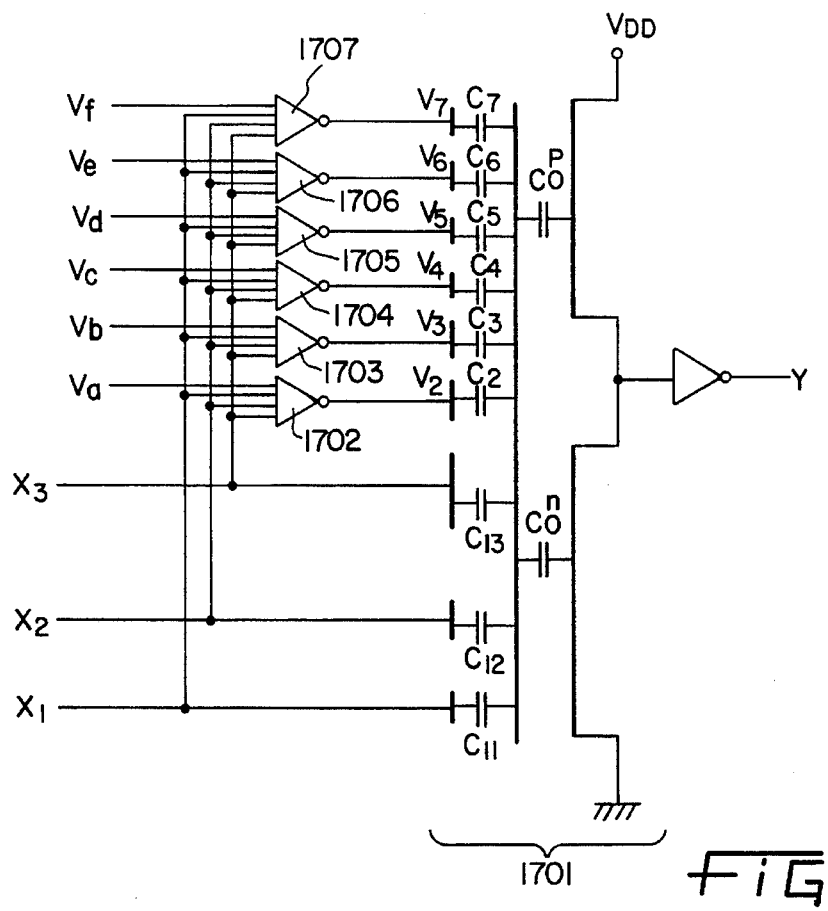
FIG. 17(a) is a circuit diagram showing the thirteenth embodiment of the present invention.

The circuit shown in FIG. 16 has a structure in which a D/A converter 1608 is provided in the input stage; however, the converter can be omitted. That is to say, as in the ninth embodiment (FIG. 13(a)) of the present invention, in place of the one signal line Z, three signal lines $X_1$, $X_2$, and $X_3$, may be connected to vMOS inverter 1601, as well as into variable threshold inverters 1602–1607. An example of this type of circuit is shown in FIG. 17(a). This represents the thirteenth embodiment of the present invention.

Reference numeral 1701 indicates a nine-input vMOS inverter, while reference numerals 1702–1707 indicate variable threshold inverters. The design of inverter 1701 is carried out under conditions such that:

$$C_{11} = (1/15)(C_{TOT} - C_0) \quad (65)$$

$$C_{12} = (2/15)(C_{TOT} - C_0) \quad (66)$$

$$C_{13} = (4/15)(C_{TOT} - C_0) \quad (67)$$

$$C_2 = C_3 = (2/15)(C_{TOT} - C_0) \quad (68)$$

$$C_4 = C_5 = C_6 = C_7 = (1/15)(C_{TOT} - C_0) \quad (69)$$

Here, $C_0 = C_0^n + C_0^p$.

Figure 17B:
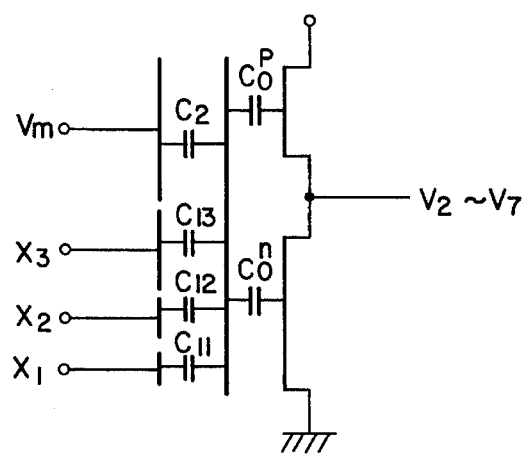
FIG. 17(b) is a circuit diagram of a variable threshold inverter of the present embodiment.

Furthermore, an example of the structure of an variable threshold inverter is shown in FIG. 17(b). Here, the values of $C_{11}$, $C_{12}$, and $C_{13}$ are given by Formulas (65), (66), and (67). Furthermore, the value of $C_2$ is given by the following formula:

$$C_2 = (8/15)(C_{TOT} - C_0)$$

Of course, the variable threshold inverters may have other forms; that is to say, it is also possible to use the structures shown in FIGS. 10(d), (e), and (f). In such cases, it is clear that the input signals ($V_1$ or $Z$) would have 3 inputs.

In the thirteenth embodiment, a circuit was discussed which was identical to that of the ninth embodiment, so that there were 3 input signal lines. It should be understood that a circuit such as that discussed in the eighth embodiment, that is to say, a circuit having lines connected to an earth line and $V_{DD}$, in addition to $X_1$, $X_2$, and $X_3$, is also acceptable.

In the present embodiment, as the input stage D/A converter was omitted, in place of a single signal line which was conventionally required to transmit input signal, the three signal lines $X_1$, $X_2$, and $X_3$ are necessary. However, by means of conducting the layout in a manner identical to that shown in FIG. 14, the signal lines $X_1$, $X_2$, and $X_3$ run parallel over the entire device, so that there are no points of intersection, and thus problems such as the increase in complexity of the layout do not occur. That is to say, a logical circuit in which the input stage D/A converter is omitted has superior speed, as well as being superior with respect to an increase in large scale integration.

In the eighth, ninth, tenth, and thirteenth embodiments described above, methods were described in which D/A converters were omitted with respect to soft hardware logic circuits possessing variable threshold inverters; however, this is not necessarily so limited. It should be understood that such methods may be applied to all vMOS logical circuits possessing fixed logical functions.

(Fourteenth Embodiment)

Figure 18A:
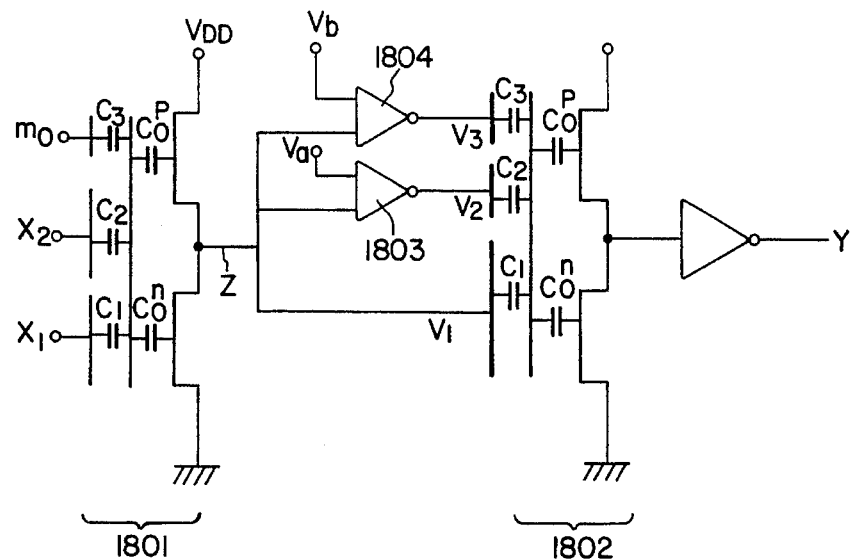
FIG. 18(a) is a circuit diagram showing the fourteenth embodiment of the present invention.

In the above embodiments, all input signals were weighted and inputted into the vMOS. For example, in the circuit shown in FIG. 10(a), $C_1$ and $C_2$ were such that $C_1 = (1/4) C_{TOT}$, and $C_2 = (1/2) C_{TOT}$, and a 1:2 weighting ratio was applied to $X_1$ and $X_2$, respectively. However, the same weight may be applied to 2 signals by setting $C_1 = C_2$ for example. A fourteenth embodiment of the present invention, in which $C_1 = C_2$, is shown in FIG. 18(a). The design of the input stage D/A converter 1801 is as shown below.

$$C_1 = C_2 = (1/3) C_{TOT} \quad (70)$$

$$C_3 + C_0^n + C_0^p = (1/3) C_{TOT} \quad (71)$$

$$V_{Tp}^* + V_{Tn}^* = -(1/3) V_{DD} \quad (72)$$

$$\beta_R = 1 \quad (73)$$

$$m_0 = 0 \quad (74)$$

If Formulas (70)~(74) are substituted into Formula (27), then the output $Z$ of the A/D converter is given by the following formula:

$$Z = V_{DD}((1/3)X_1 + (1/3)X_2) + V_{DD}/6 \quad (75)$$

Furthermore, the design of the vMOS inverter 1802 is such that:

$$C_1 = (1/2) (C_{TOT} - C_0) \quad (76)$$

$$C_2 = (1/3) (C_{TOT} - C_0) \quad (77)$$

$$C_3 = (1/6) (C_{TOT} - C_0) \quad (78)$$

The other design parameters are identical to those in the case of the vMOS inverter 101 shown in FIG. 10(a). Reference numerals 1803 and 1804 indicate variable threshold inverters; the structure shown in, for example, FIGS. 10(b), (d), or (e) may be used for these inverters. If a 2-input gate vMOS inverter such as that shown in FIG. 10(b) is used as these variable threshold inverters, and a voltage of (2/3) $V_{DD}$ and 0 is applied to the control signal input terminals $V_a$ and $V_b$, respectively, then the threshold values of inverters 1803 and 1804 are (1/3) $V_{DD}$, and $V_{DD}$, from Formulas (38) and (39). Accordingly, the change in the floating gate potential of vMOS inverter 1802 is as shown in the FPD shown in FIG. 18(b). At this time, the circuit outputs a value $Y = 1$ only when both $X_1$ and $X_2$ have a value of "0" or "1"; that is to say, this circuit is an XNOR circuit. It should be clear that if the values of $V_a$ and $V_b$ are altered, this circuit is capable of functioning as a soft hardware logical circuit capable of carrying out other functions with respect to $X_1$ and $X_2$.

However, since the weight is identical with respect to $X_1$ and $X_2$, functions which do not change as a result of the interchanging of $X_1$ and $X_2$, that is, only functions which are symmetrical with respect to $X_1$ and $X_2$, can be realized. In Table 2, these include functions $f_0$, $f_1$, $f_6$, $f_7$, $f_8$, $f_9$, $f_{14}$, and $f_{15}$.

These functions represent almost all of the logical functions which are actually used, so that even if a circuit in accordance with the fourteenth embodiment of the present invention is used, it is clear that it is possible to construct a logical circuit having the new architecture shown in FIG. 15.

Figure 18B:
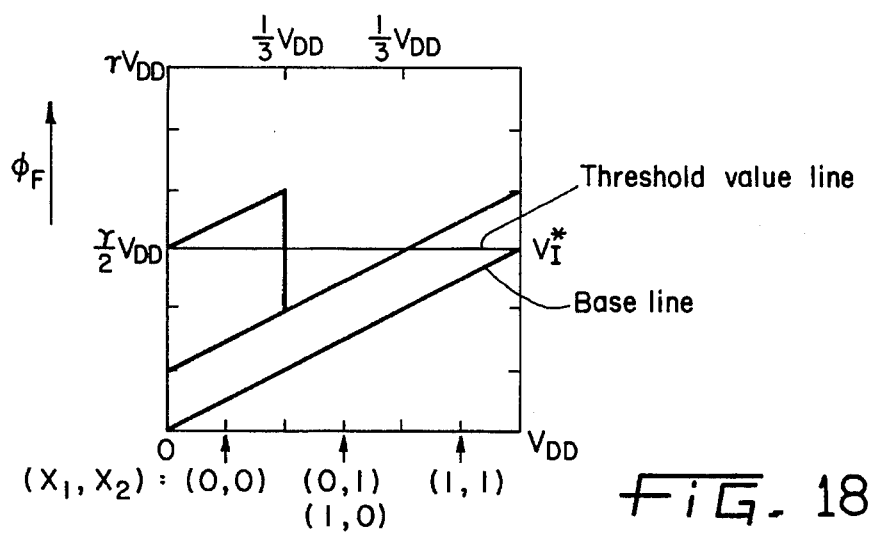
FIG. 18(b) is an FPD of inverter 1802.

The circuit shown in FIG. 18(a) has one fewer variable threshold inverter than the circuit shown in FIG. 10(a), and is simplified to that extent. Furthermore, as is clear if the FPDs of FIG. 10(c) and FIG. 18(b) are compared, in terms of the signal levels which are to be distinguished, the former has 4 levels, while the latter has 3 levels. Thus, this circuit has the characteristic of having an enlarged noise margin to this extent.

(Fifteenth Embodiment)

FIG. 19 is a circuit diagram showing the fifteenth embodiment of the present invention.

The present embodiment is a circuit having functions identical to those of the fourteenth embodiment (FIG. 18(a)); however, the input stage D/A converter is omitted. That is to say, the two inputs $X_1$ and $X_2$ are inputted directly into input gates 1902 and 1903 of vMOS inverter 1901. The capacitive coupling coefficients of vMOS inverter 1901 are such that:

$$C_{11} = C_{12} = (1/5)(C_{TOT} - C_0) \quad (79)$$

$$C_2 = (2/5)(C_{TOT} - C_0) \quad (80)$$

$$C_3 = (1/5)(C_{TOT} - C_0) \quad (81)$$

Figure 19A:
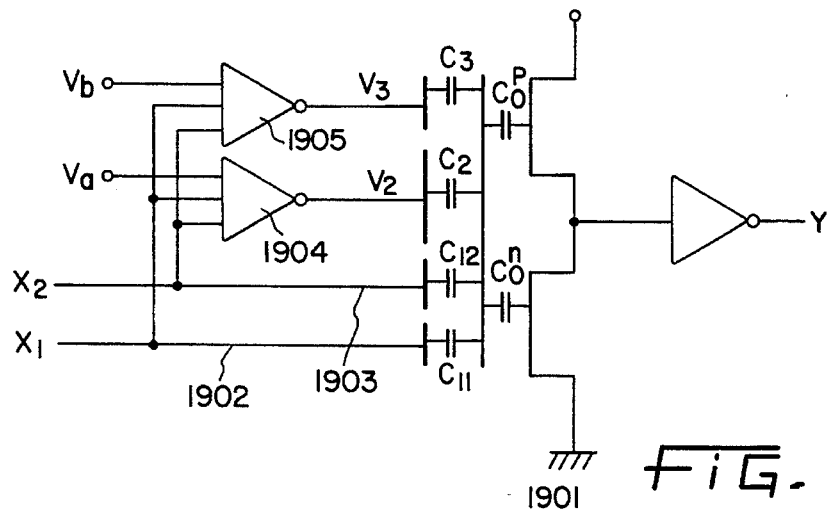
FIG. 19(a) is a circuit diagram showing the fifteenth embodiment of the present invention.
Figure 19B:
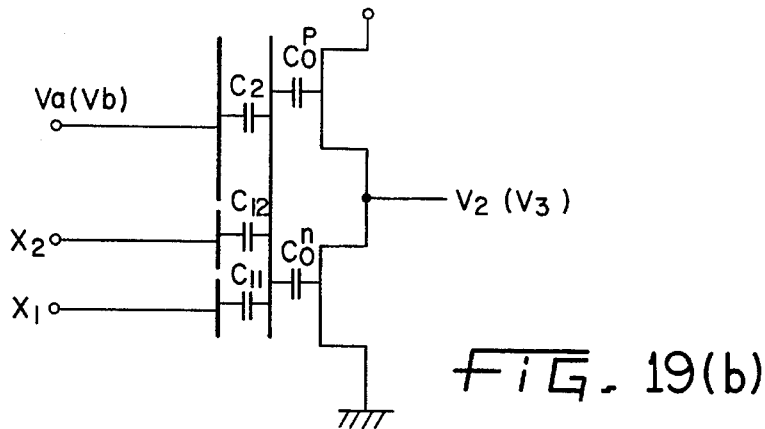
FIG. 19(b) is a circuit diagram of a variable threshold inverter of the present embodiment.

Furthermore, variable threshold inverters 1904 and 1905 may have the structure shown, for example, in FIG. 19(b). In FIG. 19(b), conditions are such that:

$$C_{12} = C_{11} = (1/5) (C_{TOT} - C_0)$$

$$C_2 = (2/5)(C_{TOT} - C_0)$$

Figure 19C:
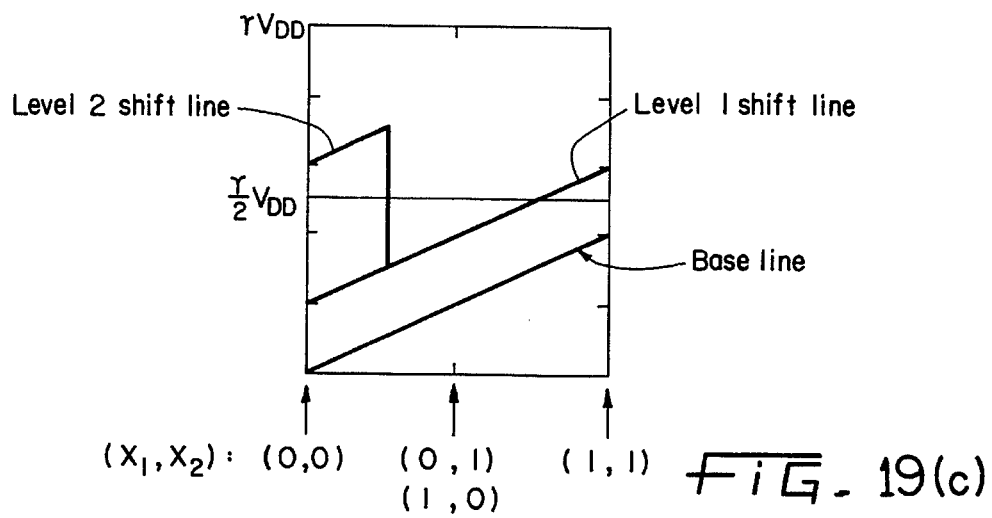
FIG. 19(c) is an FPD of inverter 1901.

If values of (2/3) $V_{DD}$ and 0 are inputted into the control signal input terminals $V_a$ and $V_b$, respectively, of the variable threshold inverter, then the FPD of vMOS inverter 1901 is as shown in FIG. 19(c). At this time, the circuit outputs a value of $Y = 1$ when both $X_1$ and $X_2$ have a value of "0" or "1", so that this circuit is an XNOR circuit. The circuit is a soft-hardware logic circuit which enables the realization of all functions with respect to the two inputs $X_1$ and $X_2$ merely by altering the value of $V_a$ and $V_b$.

The circuit shown in FIG. 19(a) has a reduced number of elements and the operational speed thereof thus increases, in comparison with the circuit shown in FIG. 18(a) as a result of the omission of the input stage of the D/A converter.

In the fourteenth and fifteenth embodiments, soft-hardware logic circuits were described which realized 2-input symmetrical functions; however, it is of course the case that the number of inputs may be increased. At this time, the gates into which each signal is inputted may have equal capacitive coupling coefficients.

(Sixteenth Embodiment)

Figure 20A:
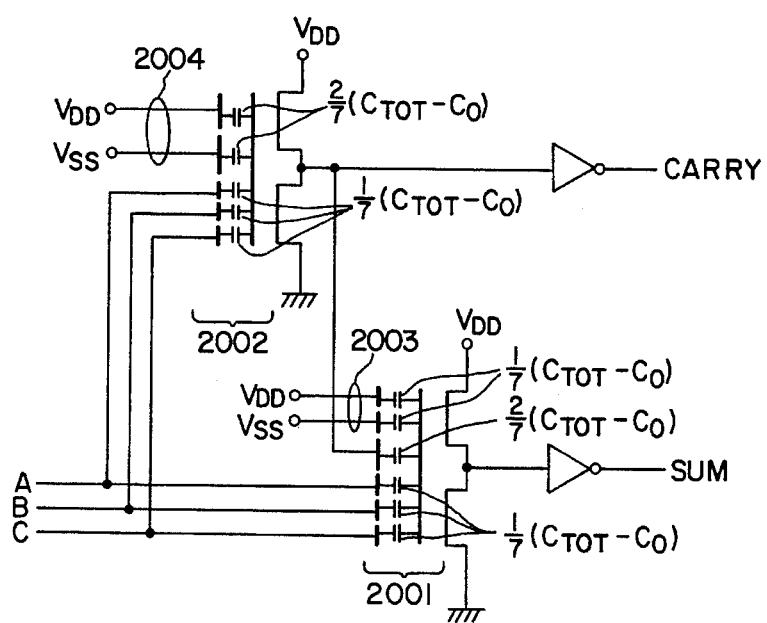
FIG. 20(a) is a circuit diagram showing the sixteenth embodiment of the present invention.

Next, the structure of a so-called full adder circuit will be discussed as an example of a symmetrical type logical function (fixed logical function) operating with respect to three input variables. FIG. 20(a) shows a full adder circuit constructed using νMOS transistors, explaining a the sixteenth embodiment of the present invention.

Figure 20B:
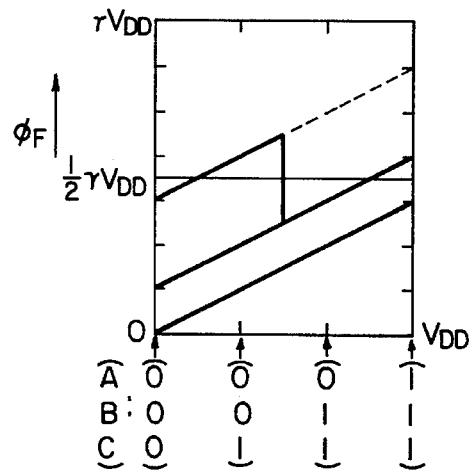
FIGS. 20(b) and 20(c) are FPDs of inverters 2001 and 2002.
Figure 20C:
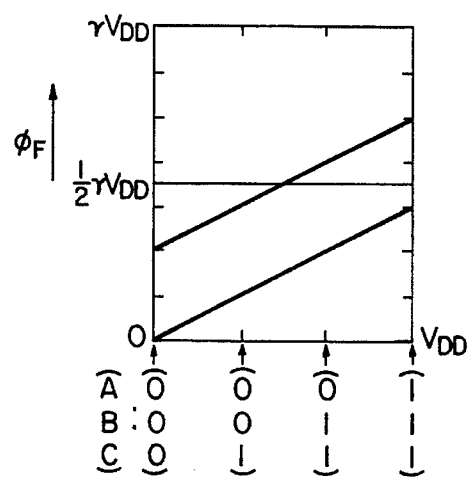

This circuit calculates the summation of two binary signals A and B and a carry signal C, and outputs a SUM and a CARRY. SUM outputs a value of 1 if one of the numbers of A, B, and C is odd, and outputs a value of 0 if even. Furthermore, CARRY outputs a value of 1 if one of the numbers of A, B, and C is 2 or greater, and outputs a value of 0 if one or less. The capacitive coupling coefficients of each νMOS inverter 2001 and 2002 are as shown in the diagram. Furthermore, the FPDs of inverters 2001 and 2002 are shown in FIGS. 20(b) and (c), respectively.

The present embodiment shows a structure in which the input stage D/A converter is not present; however, a D/A converter may be used, as in the case shown in FIG. 18(a).

(Seventeenth Embodiment)

Figure 21A:
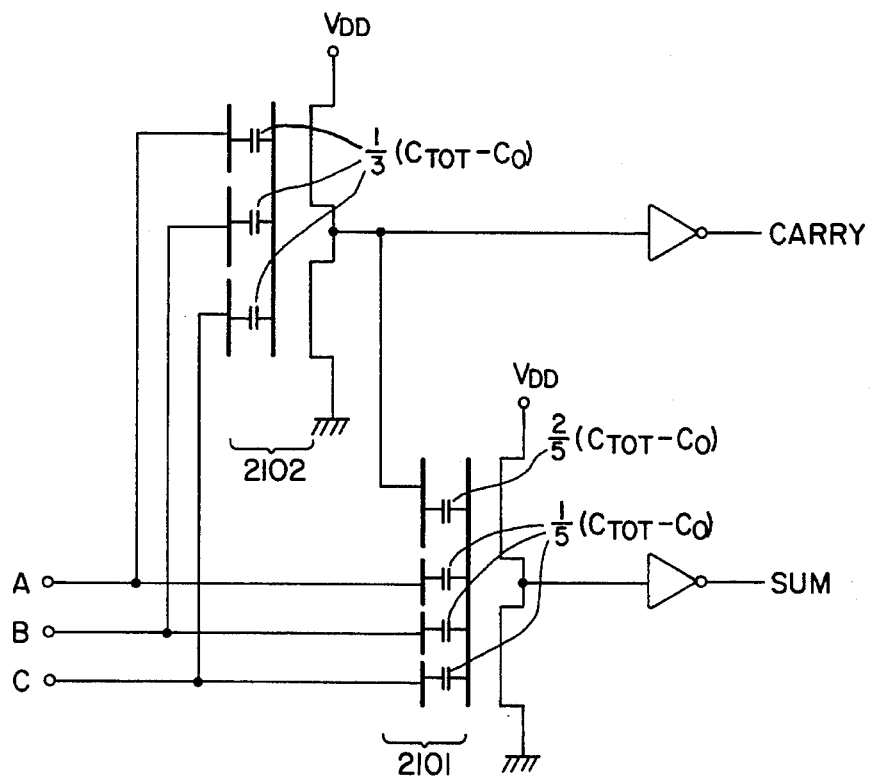
FIG. 21(a) is a circuit diagram showing the seventeenth embodiment of the present invention.
Figure 21B:
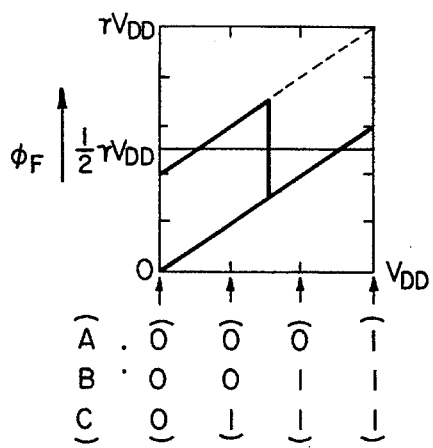
FIGS. 21(b) and 21(c) are FPDs of inverters 2101 and 2102.
Figure 21C:
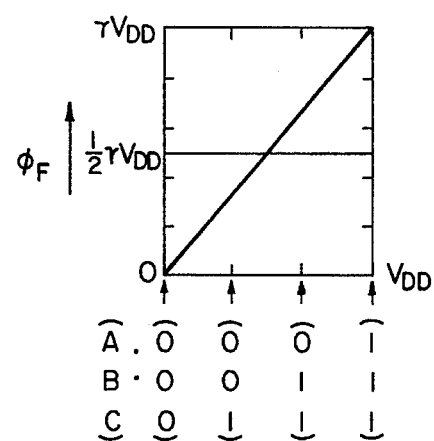

FIG. 21(a) is a circuit diagram showing the seventeenth embodiment of the present invention; this circuit is a full adder circuit like that shown in FIG. 20(a). The values of the capacitive coupling coefficients of νMOS inverters 2101 and 2102 are as shown in the diagram, and the FPDs thereof are shown in FIGS. 21(b) and (c), respectively. The difference between the seventeenth embodiment and the sixteenth embodiment lies in the fact that in the sixteenth embodiment, fixed bias inputs 2003 and 2004 of $V_{DD}$ and $V_{SS}$ (0 volt) were provided, whereas in the seventeenth embodiment, these are omitted. As a result, the inclination of the base line in the FPDs is greater in the seventeenth embodiment than in the sixteenth embodiment. This inclination of the base line expresses the size of the change in $\phi_F$ in response to the change in the data input, so that the greater the inclination, the greater the noise margin. Accordingly, in comparison with the sixteenth embodiment, it is a characteristic of the seventeenth embodiment that it enables a large noise margin.

By varying the values of $V_a$, $V_b$, and $V_c$ in the soft-hardware logic circuit shown, for example, in FIG. 10(a), it is possible to execute 16 types of functions. Five types of values, 0, (¼) $V_{DD}$, (¾) $V_{DD}$, (¾) $V_{DD}$, and $V_{DD}$, can be selected for each of $V_a$, $V_b$, and $V_c$, so that the possible combinations of $V_a$, $V_b$, and $V_c$ total $5^3=125$. That is to say, the combination of functions and $V_a$, $V_b$, and $V_c$ is not limited to the relationship shown in Table 3; identical functions can be executed by means of a variety of other combinations. That is to say, the above circuit possesses a degree of redundancy with respect to the expression of functions. This redundancy is important. That is to say, if $V_a$, $V_b$, and $V_c$ are considered to be an aggregation of data, it is possible to assign logical function possessing the same function to various aggregation, and thus to use this in aggregate logical calculations.

(Eighteenth Embodiment)

Figure 22A:
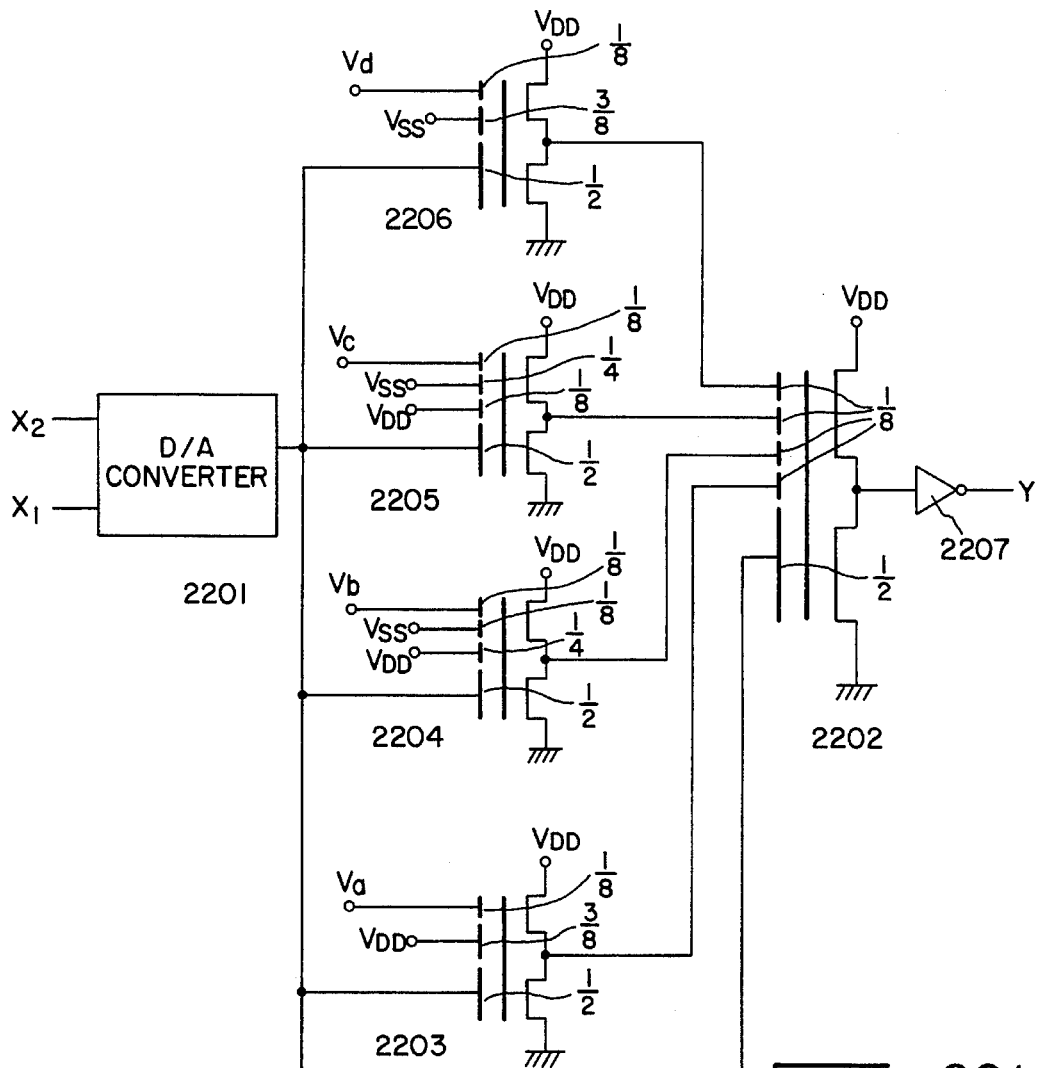
FIG. 22(a) is a circuit diagram showing the eighteenth embodiment of the present invention.

However, there are cases in which a circuit possessing no redundancy is necessary. An example of this type of circuit comprises the eighteenth embodiment of the present invention, and is shown in the circuit diagram in FIG. 22(a). The structure is similar to that shown in FIG. 10(a); reference numeral 2201 indicates an input stage D/A converter, while reference numeral 2202 indicates a νMOS inverter. Reference numerals 2203–2206 indicate variable threshold inverters, while references $V_a$, $V_b$, $V_c$, and $V_d$ indicate control signal input terminals. In the diagram, the concrete structure of the variable threshold inverter is also depicted. The fractions ½, ¼, ⅛, and the like which are shown in the diagram indicate capacitive coupling coefficients between each input gate and the floating gate, and indicate values of (½) ($C_{TOT}$–$C_0$), (¼) ($C_{TOT}$–$C_0$), (⅛) ($C_{TOT}$–$C_0$), and the like, respectively.

Figure 22B:
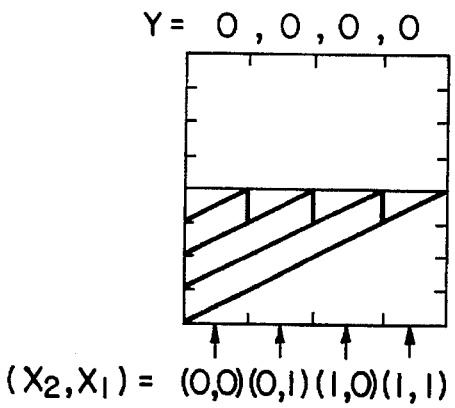
FIGS. 22(b) to 22(e) are FPDs of inverters 2202.
Figure 22C:
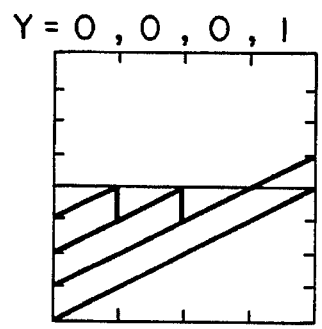
Figure 22D:
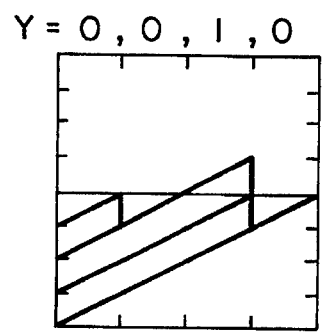
Figure 22E:
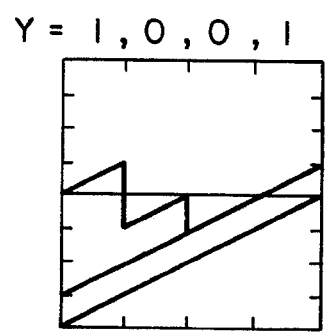

In the present circuit, a binary signal of $V_{DD}$ or 0 is inputted into $V_a$, $V_b$, $V_c$, and $V_d$. The FPD of νMOS inverter 2202 is shown in FIG. 22(b) in the case in which $V_a=V_b=V_c=V_d=1$ (=$V_{DD}$). The output has a value of 0 with respect to the value of all combinations of inputs. FPDs and examples of outputs corresponding to other combinations of $V_a$, $V_b$, $V_c$, and Vd are shown in FIGS. 22(c), (d), and (e). It can be seen that the inversion signals of the signals inputted into $V_a$, $V_b$, $V_c$, and $V_d$ is outputted in correspondence with $(X_2, X_1)$=(0, 0), (0, 1), (1, 0), and (1, 1). Since the output pattern is directed directly by means of $V_A$–$V_D$ to determine the function from, the determination of the function can be easily conducted.

If the inverter 2207 provided in the output stage is omitted, or if another stage is appended, then the circuit outputs the data sent to $V_a$, $V_b$, $V_c$, and $V_d$ in order with respect to combinations of $(X_2, X_1)$. This circuit is termed a "multiplexer" which selects one value from a group of four values. Although conventional 4:1 multiplexers required a minimum of 66 transistors, in the case of the present embodiment, such a multiplexer can be realized with only 12 transistors (in the case in which the output stage inverter is omitted).

Furthermore, in the case in which the input stage D/A converter is omitted, and the structure is similar to that shown in the eighth and ninth embodiments of the present invention, it is possible to eliminate a further 2 transistors, and thus to construct a device with only 10 transistors.

(Nineteenth Embodiment)

Figure 23A:
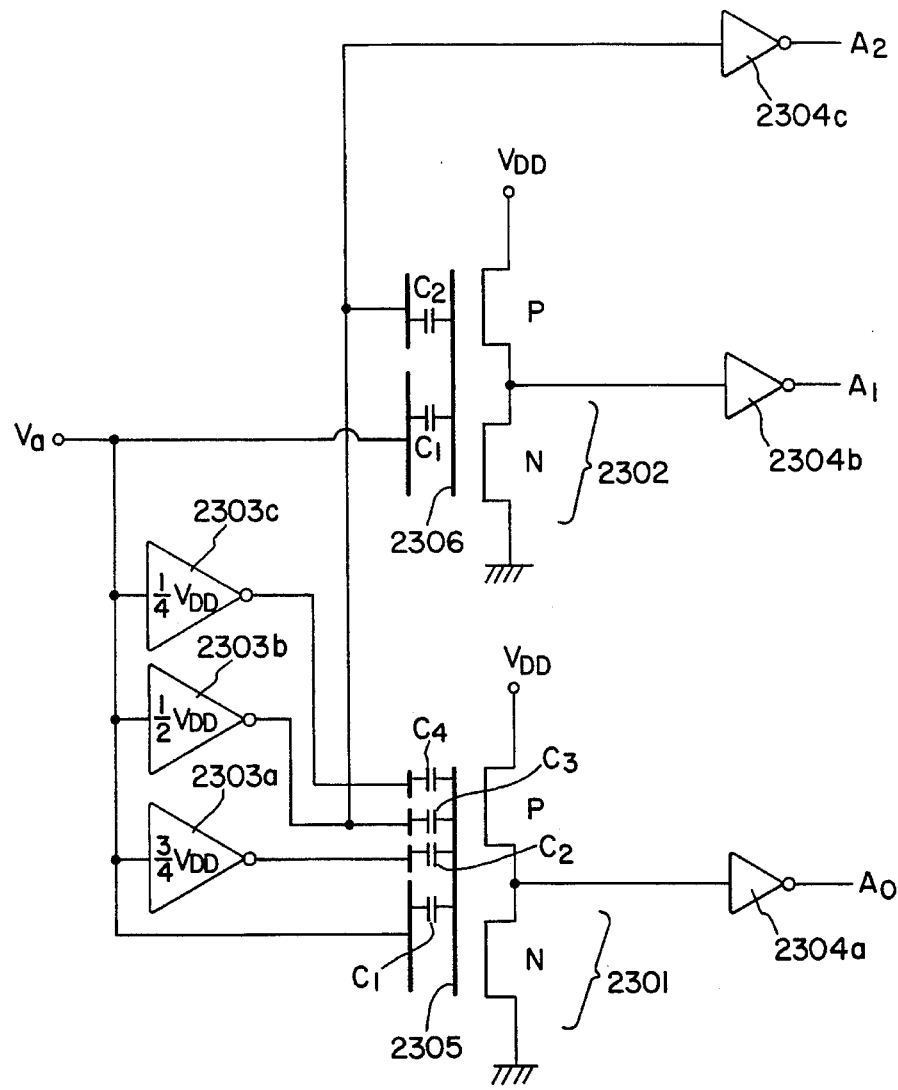
FIG. 23(a) is a circuit diagram showing the nineteenth embodiment of the present invention.
Figure 23B:
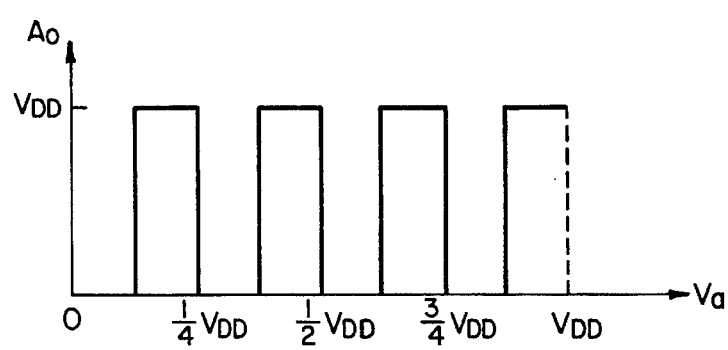
FIG. 23(b) is a diagram showing the relationship between $V_a$ and $A_0$.
Figure 23C:
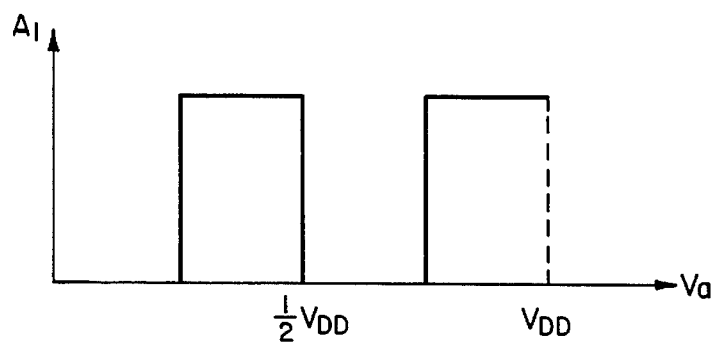
FIG. 23(c) is a diagram showing the relationship between $V_a$ and $A_1$.
Figure 23D:
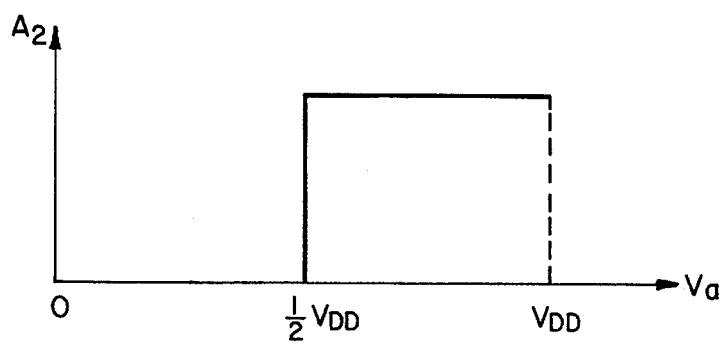
FIG. 23(d) is a diagram showing the relationship between $V_a$ and $A_2$.

The nineteenth embodiment of the present invention is shown in FIG. 23(a). The circuit of the present embodiment converts an analog signal input $V_a$ into a 3-bit digital signal with $A_0$, $A_1$, and $A_2$, and thus realizes a so-called A/D conversion circuit using νMOS transistors. The relationship between $V_a$ and $A_0$, $A_1$, and $A_2$ is as shown in FIGS. 23(b), (c), and (d).

The present circuit comprises, as main components, two groups of νMOS gates 2301 and 2302, and three inverters 2303a, 2303b, and 2303c, which have differing inversion voltages. The inversion voltages of these three inverters are set to values equaling (¾) $V_{DD}$, (½) $V_{DD}$, and (¼) $V_{DD}$, respectively, as shown in the figure, and operate as a comparator which determines the amplitude of the input signal. Reference numerals 2304a, 2304b, and 2304c, are ordinary inverters, which are provided for the purpose of the rectification of the output waveform; they may be provided in a number of stages or may be omitted. In comparison with a similar conventional 3-bit A/D converter (FIG. 38), the converter of the present embodiment is greatly simplified.

Table 4 shows the results of a comparison between the conventional flash A/D converter shown in FIG. 38, and the νMOS A/D converter in accordance with the present invention, with respect to a 3-bit A/D converter. First, the number of comparators has been reduced by more than half. In addition, the registers and complicated decoder circuitry (combination logical circuitry) are unnecessary, so that the total number of gates is only 8, in comparison with 99 gates in the conventional technology, which represents an extreme numerical reduction.

In the same way, Table 4 shows the results of a comparison in the case of 4 bits; the differences from the conventional technology are clear.

Next, the design of the circuit shown in FIG. 23 will be discussed. With respect to the structure of the N-νMOS, the P-νMOS, and the like, the structure similar to that described in, for example, the fourth, seventh, or twelfth embodiments may be adopted. In νMOS gate 2301, design may be conducted, for example, as follows:

$$C_1 = (4/7)(C_{TOT} - C_0) \tag{82}$$

$$C_2 = C_3 = C_4 = (1/7)(C_{TOT} - C_0) \tag{83}$$

Furthermore, with respect to νMOS gate 2302, design will be conducted as follows:

$$C_1 = (2/3)(C_{TOT} - C_0) \tag{84}$$

$$C_2 = (1/3)(C_{TOT} - C_0) \tag{85}$$

Figure 23E:
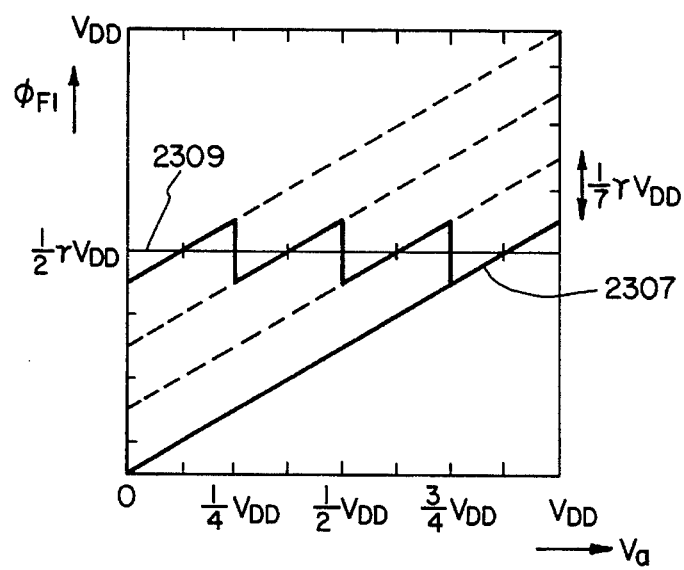
FIG. 23(e) is an FPD of a ν MOS gate 2301 in the circuit design example of FIG. 23.
Figure 23F:
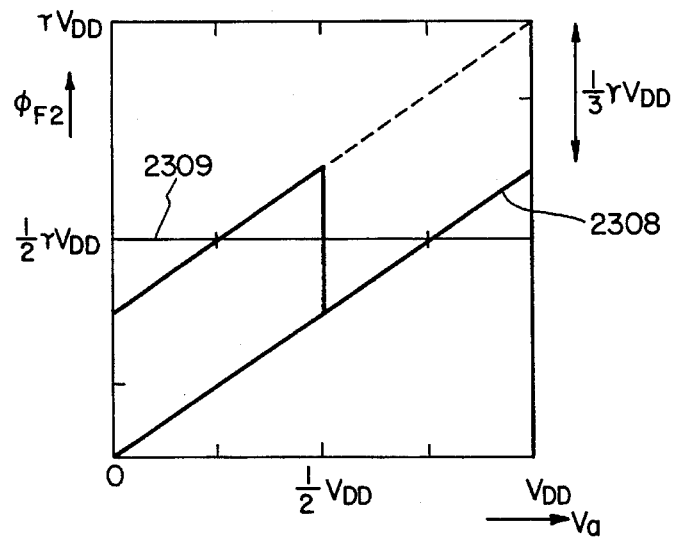
FIG. 23(f) is an FPD of a ν MOS gate 2302 in the circuit design example of FIG. 23.

It is clear that the desired characteristics are attained thereby, from the FPDs of νMOS gates 2301 and 2302, which are shown in FIGS. 23(e) and (f), respectively.

Here, $\phi_{F1}$ and $\phi_{F2}$ represent the potentials of floating gates 2305 and 2306, respectively.

The FPDs shown in FIGS. 23(e) and (f) differ slightly from the FPDs which were used previously (for example, those shown in FIGS. 3(a) and (b), or in FIG. 4(b)). This is because a portion of base lines 2307 and 2308 themselves protrude above threshold value line 2301, generating a "1" signal by themselves.

In the case in which design is conducted in such a manner, the structure of the control gates of the νMOS becomes simpler.

(Twentieth Embodiment)

Figure 24A:
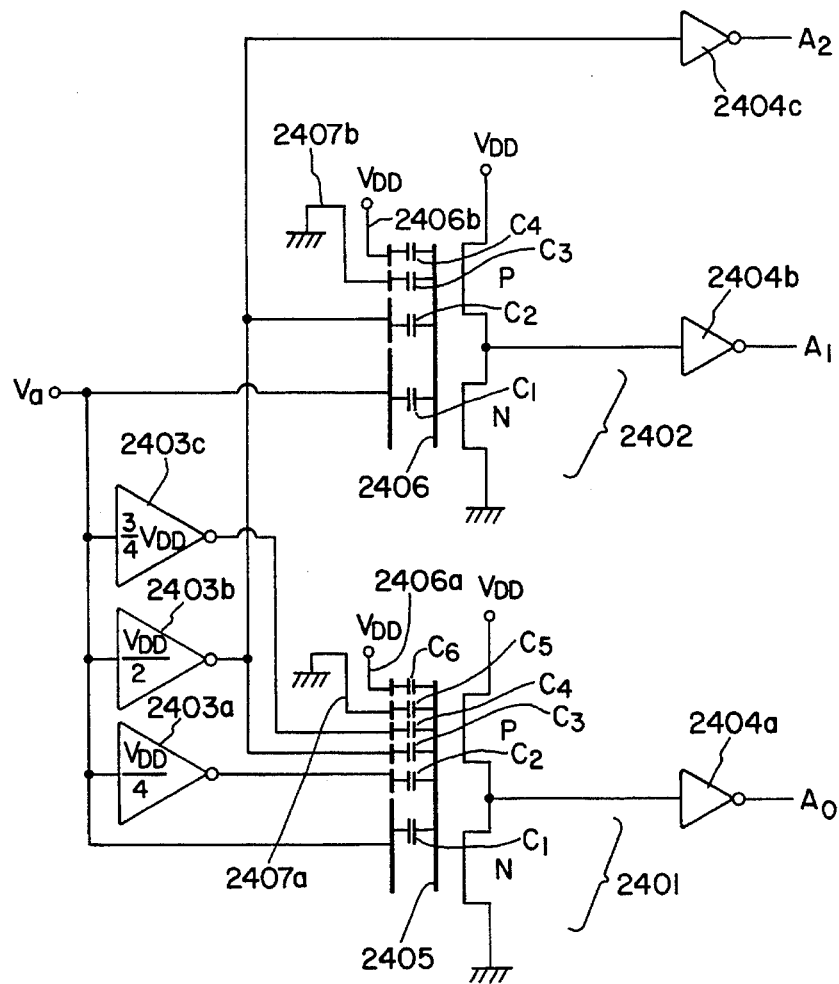
FIG. 24(a) is a circuit diagram showing the twentieth embodiment of the present invention.
Figure 24B:
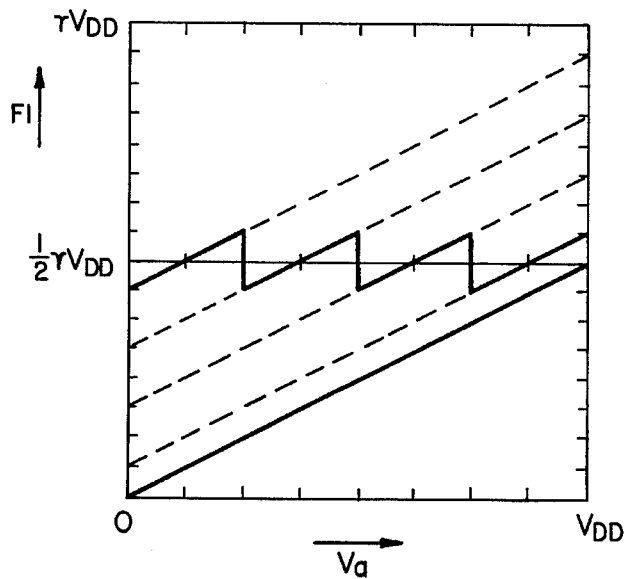
FIG. 24(b) is an FPD of a ν MOS gate 2401 in the circuit design example of FIG. 24.
Figure 24C:
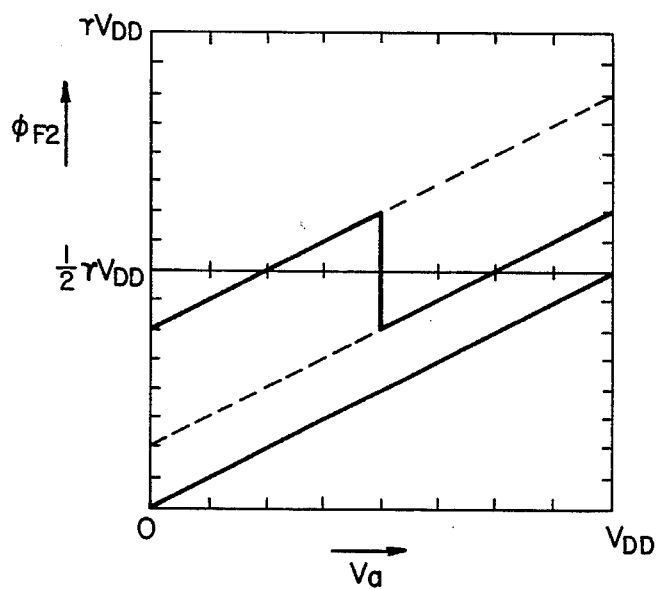
FIG. 24(c) is an FPD of a ν MOS gate 2402 in the circuit design example of FIG. 24.

FIG. 24(a) is a circuit diagram showing the twentieth embodiment of the present invention, and expresses a 3-bit A/D converter. This is an example in which design is conducted using FPDs which are identical to those used in the design of conventional νMOS logical circuits; the FPDs of νMOS gates 2401 and 2402 are shown in FIGS. 24(b) and (c), respectively. As a result of analysis of these FPDs, the inversion voltages of inverters 2403a, 2403b, and 2403c are determined to be (¼) $V_{DD}$, (½) $V_{DD}$, and (¾) $V_{DD}$, respectively.

Furthermore, the capacitive coupling coefficients are designed so as to have values of:

$$C_1 = (1/2)(C_{TOT} - C_0)$$

$$C_2 = C_3 = C_4 = (1/8)(C_{TOT} - C_0)$$

$$C_5 = C_6 = (1/16)(C_{TOT} - C_0),$$

in the case of νMOS gate 2401, and $$C_1 = (1/2)(C_{TOT} - C_0)$$

$$C_2 = (1/4)(C_{TOT} - C_0)$$

$$C_3 = C_4 = (1/8)(C_{TOT} - C_0)$$

in the case of νMOS gate 2402. In this design method, the number of control gates of the νMOS is larger than in the case of the nineteenth embodiment; for example, control gates 2406a and 2406b are connected to $V_{DD}$, while 2407a and 2407b are earthed.

It should be clear that there is no great difference between these design methods.

In FIGS. 23(a) and 24(a), the inverters 2303a~c and 2403a~c, which operate as comparators, may comprise ordinary CMOS converters. However, in such cases, in order to control the respective inversion voltages, it is necessary to conduct separate ion implantations for each transistor, to adjust the threshold values.

Figure 6B:
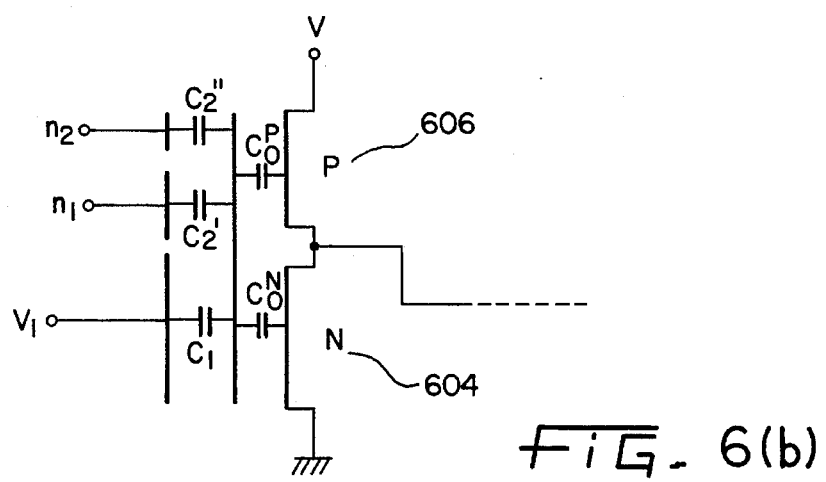
FIG. 6(b) is a block diagram of an inverter in which a control gate electrode has been divided into two.

However, if, for example, circuits such as those shown in FIG. 10(b) are used as these inverters, then it is possible to control the inversion voltages by means of the value of $V_m$. The value of $V_m$ may be determined directly within the chip by means of resistance division, and may be set to a freely selected value by means of the pattern design of the resistance elements. Alternatively, if circuits such as those shown in FIGS. 10(d), (e), or FIG. 6(b) are used, it is possible to set the inversion voltages to freely selected values by means of pattern design in a simpler manner without causing a direct current to flow. Of course, either method may be employed.

Next, the conversion of multivalued logic and binary logic will be discussed. This is present in the following four cases.

(i) a plurality of binary variables $(X_0, X_1, X_2, \ldots, X_n)$ are converted into a single multivalued variable.

(ii) a plurality of binary variables $(X_0, X_1, \ldots X_n)$ are converted into a plurality of multivalued variables $(T_0, T_1, \ldots, T_m)$.

(iii) a single multivalued variable is converted into a plurality of binary variables $(X_0, \ldots, X_n)$.

(iv) a plurality of multivalued variables $(T_0, T_1, \ldots, T_m)$ is converted into a plurality of binary variables $(X_0, \ldots, X_n)$.

Any of these conversions can be realized easily by means of the present invention.

(Twenty-first Embodiment)

Figure 25A:
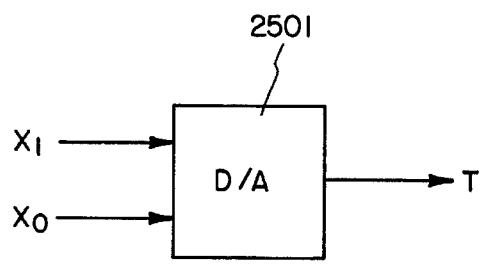
FIG. 25(a) is a block diagram showing the twenty-first embodiment of the present invention.

FIG. 25(a) is a block diagram showing the twenty-first embodiment of the present invention, which executes (i) above; it is a circuit which converts 2-bit binary signal $X_0$, $X_1$ into a single 4-value signal $T_0$.

Figure 25B:
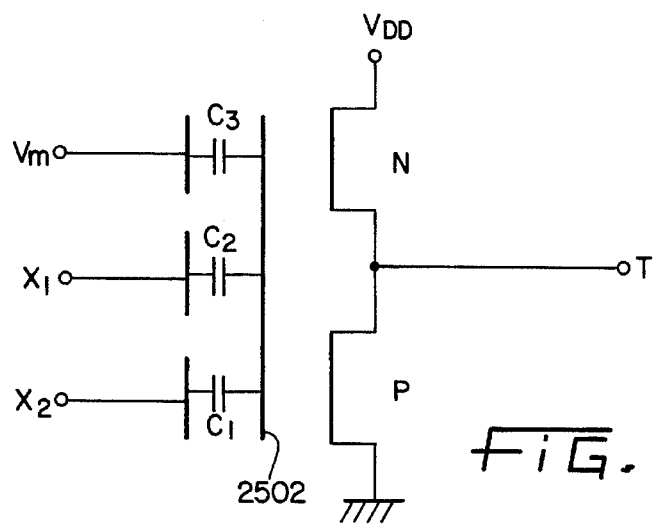
FIG. 25(b) is a circuit diagram of the D/A conversion circuit 2501 in FIG. 25(a).
Figure 25C:
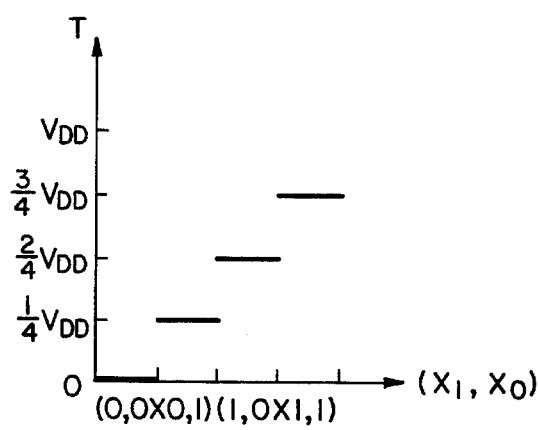
FIG. 25(c) is a diagram showing the relationship between T and ($X_1$, $X_0$).

Reference numeral 2501 indicates a D/A conversion circuit. The circuit shown in FIG. 25(b), for example, may be used. The potential $\phi_F$ of floating gate 2502 is given by the following formula:

$$\phi_F = (C_1/C_{TOT})X_1 + (C_2/C_{TOT})X_0 + (C_3/C_{TOT})V_m + (C_0/C_{TOT})V_0$$

and here, the substrate potential $V_0$ is assumed to be 0 V. If conditions are set such that $$V_m = 0, \ C_1/C_{TOT} = 1/2, \ C_2/C_{TOT} = 1/4$$

and $V_i^*$ (the inversion voltage of the inverter as seen from the floating gate) is set equal to 0, then the following formula results:

$$T = (2/4)X_1 + (1/4)X_0,$$

and the relationship between T and $(X_1, X_0)$ is as shown in FIG. 25(c). The value corresponding to T=3 is (¾) $V_{DD}$, which does not reach the power source voltage.

Figure 25D:
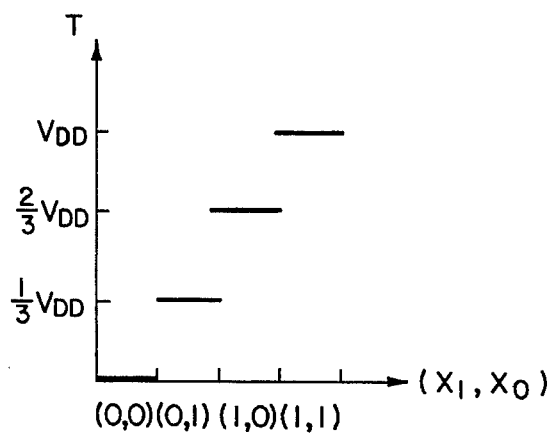
FIG. 25(d) is a diagram showing the characteristics of $V_{DD}$ when T is set equal to 3.
Figure 25E:
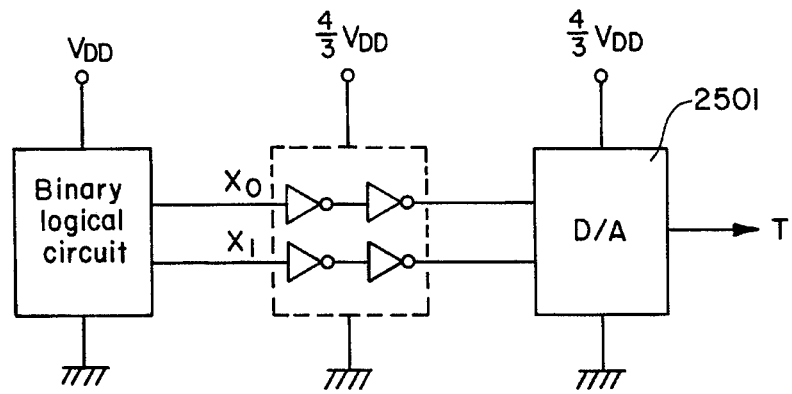
FIG. 25(e) is a circuit diagram of a circuit which obtains the characteristics of FIG. 25(d).

If the characteristics shown in FIG. 25(d), in which $V_{DD}$ is outputted when T=3, are desired, then the power source voltage of the converter of FIG. 25(b), and of the inverters of the input signals, may be set to (4/3) $V_{DD}$ (see FIG. 25(e)), or in the circuit shown in the FIG. 25(b), gate $V_m$ may be removed, and conditions set such that $C_1$ and $C_2 \gg C_0$. By proceeding in this manner, the power source voltage may be set to $V_{DD}$.

(Twenty-second Embodiment)

FIG. 26 is a block diagram showing the twenty-second embodiment of the present invention, which is an example of a circuit which realizes (ii) above. This circuit outputs two 3-value variables $T_1$ and $T_0$ with respect to 3-bit binary signals $X_2$, $X_1$, and $X_0$; after conversion to an analog signal Z in A/D converter 2601, $T_1$ and $T_0$ are outputted through circuits $T_1$ (2602) and $T_0$ (2603). The relationships between these signals are shown in Table 6. The D/A converter may be one such as that shown in FIG. 8(a), FIG. 25(b), or the like, which has a 3-bit input. The input and output characteristics of $T_1$ and $T_0$ are shown in FIG. 26(b).

Figure 26A:
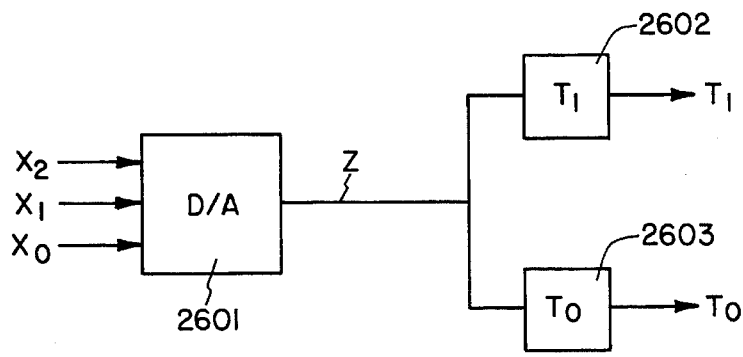
FIG. 26(a) is a diagram showing the twenty-second embodiment of the present invention.
Figure 26B:
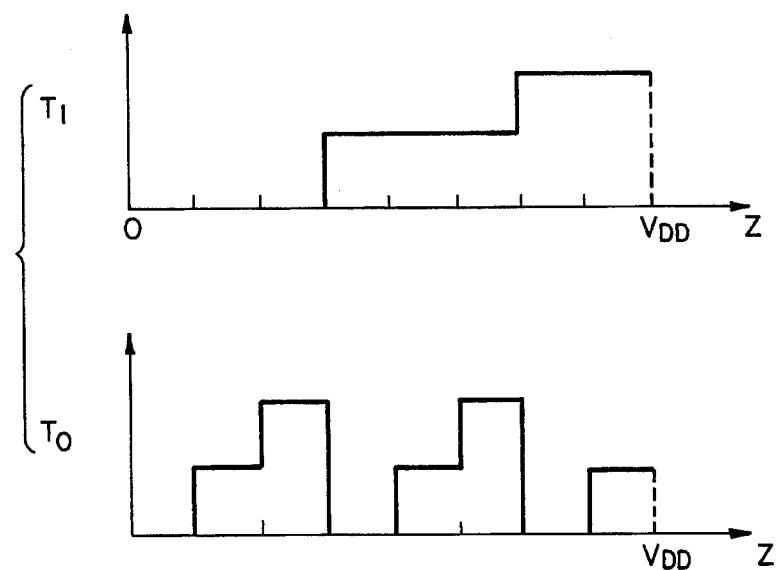
FIG. 26(b) is a diagram showing the input and output characteristics of $T_1$ and $T_2$.
Figure 26C:
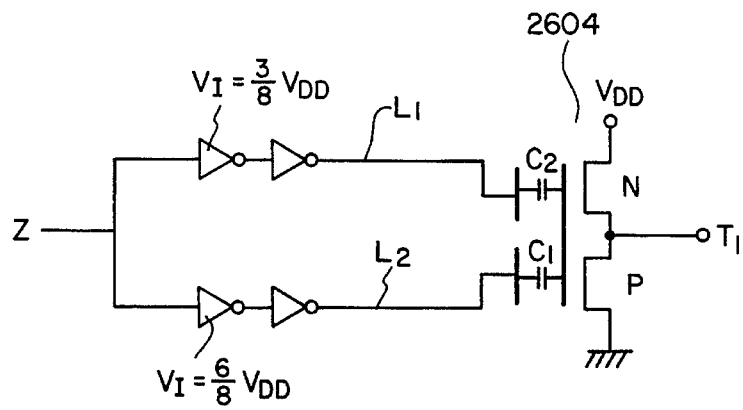
FIG. 26(c) is a block diagram for realizing $T_1$.

In order to realize $T_1$, a structure such as that shown in FIG. 26(c), for example, may be used; a reverse CMOS transfer amplification circuit such as that shown in FIG. 8(a) or FIG. 25(b) may be used as the circuit 2604 which is used in the final stage.

Figure 26D:
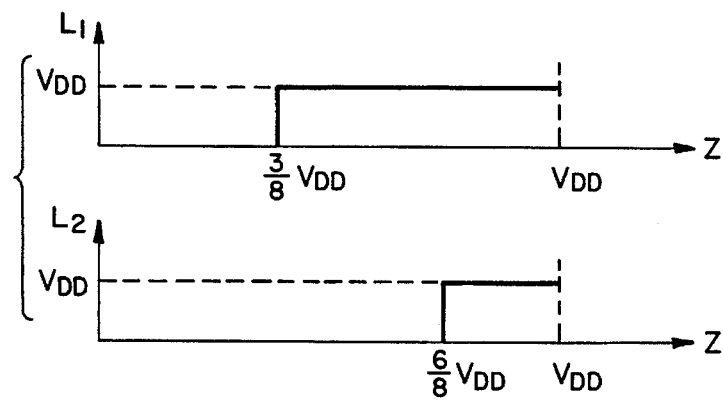
FIG. 26(d) is a diagram showing the input and output characteristics of $L_1$ and $L_2$.

The relationship between $L_1$ and $L_2$ and Z of FIG. 26(c) is shown in FIG. 26(d). The output $T_1$ of reverse CMOS transfer amplification circuit 2604 is given by the formula $T_1 = L_1 + L_2$, and the characteristics of $T_1$ of FIG. 26(b) are thus obtained. However, in this case, $C_1 = C_2$.

Figure 26E:
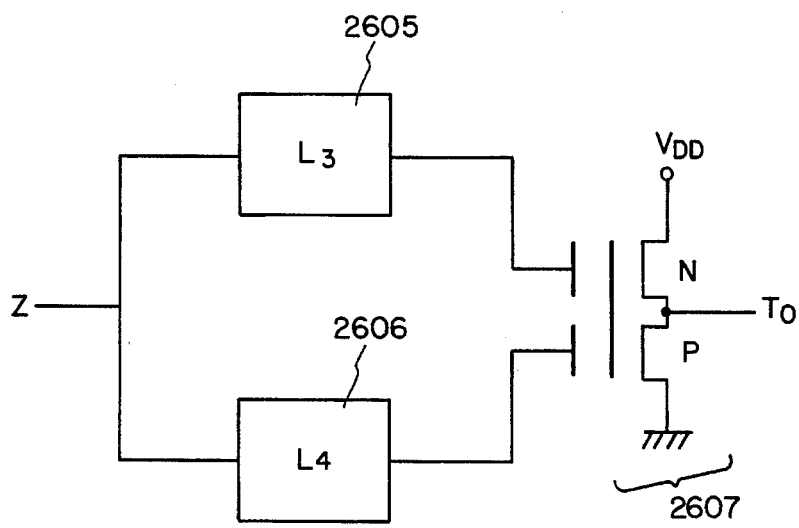
FIG. 26(e) is a circuit diagram of a circuit which outputs $T_2$.

FIG. 26(e) shows a circuit which outputs $T_0$; it comprises the subblocks of $L_3$ 2605 and $L_4$ 2606.

Figure 26F:
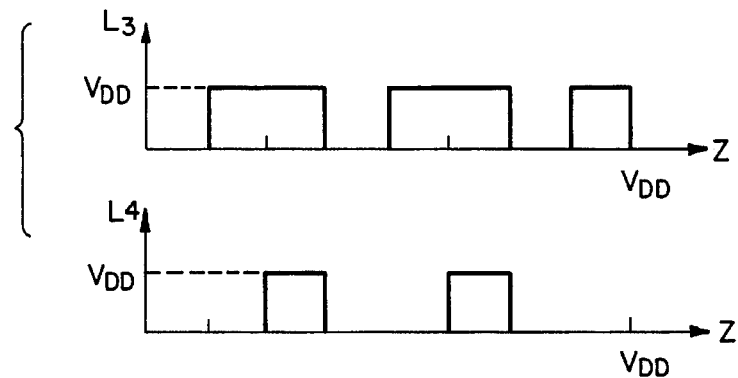
FIG. 26(f) is a diagram which shows the input and output characteristics of $L_3$ and $L_4$.

Reference numeral 2607 indicates a reverse CMOS transfer amplification circuit which is identical to that indicated by reference numeral 2604. The input and output characteristics of $L_3$ and $L_4$ are shown in FIG. 26(f); this type of circuit can be realized easily by using a circuit such as that shown in, for example, FIG. 10(a), which is the seventh embodiment of the present invention, in which D/A converter 1005 is omitted.

In order to realize (iii) above, the multivalued signal may be inputted into a A/D conversion circuit such as that described in the nineteenth and twentieth embodiments of the present invention.

(Twenty-third Embodiment)

Figure 27A:
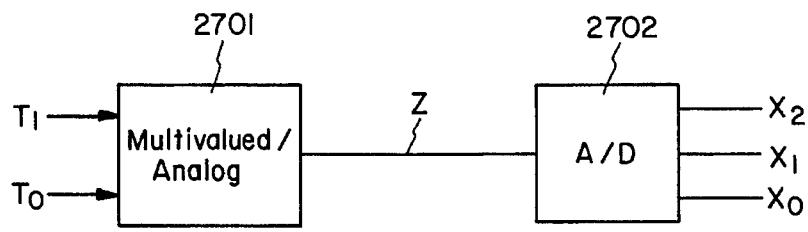
FIG. 27(a) is a block diagram showing the twenty-third embodiment of the present invention.

FIG. 27(a) shows a block diagram showing the twenty-third embodiment of the present invention which realizes (iv) above; two 3-value signals $T_0$ and $T_1$ are passed through a multivalue/analog conversion circuit 2701 to be converted to an analog signal Z, and then converted into 3-bit binary number in A/D converter 2702.

Figure 27B:
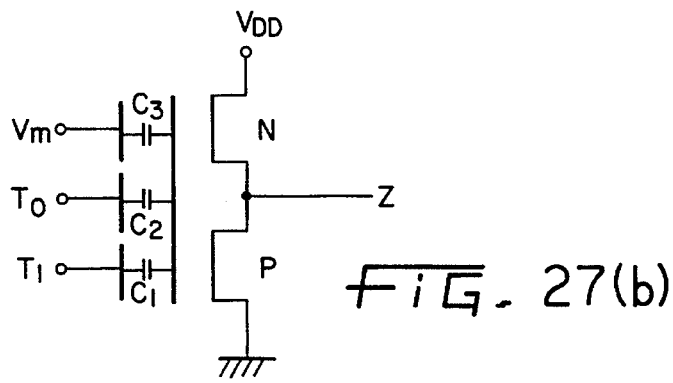
FIG. 27(b) is a circuit diagram showing an example of circuitry which realizes a multivalued/analog conversion circuit 2301.

Reference numeral 2702 is a circuit such as that described in the nineteenth and twentieth embodiments of the present invention. An example of the realization of 2701 is shown in FIG. 27(b). If, for example, conditions are such that $C_1 = (\%) C_{TOT}$, $C_2 = (\%) C_{TOT}$, and $V_m = 0$, then the value of Z is given by the following formula:

$$Z = (\%) T_1 + (\%) T_0;$$

and if the voltage values of $T_0$ and $T_1$, that is, 0, (⅓) $V_{DD}$, (⅔) $V_{DD}$, and $V_{DD}$ are made to correspond to values 0, 1, 2, and 3 of $T_0$ and $T_1$, respectively, then $Z = (\%) V_{DD} (3T_1 + T_0)$, and it is possible to convert two 3-value signals to an analog amount.

As explained above, by means of the present invention, it is possible to freely carry out a multivalue/binary conversion. It is of course the case that a multivalue/multivalue conversion may be simultaneously carried out.

(Twenty-fourth Embodiment)

Figure 28B:
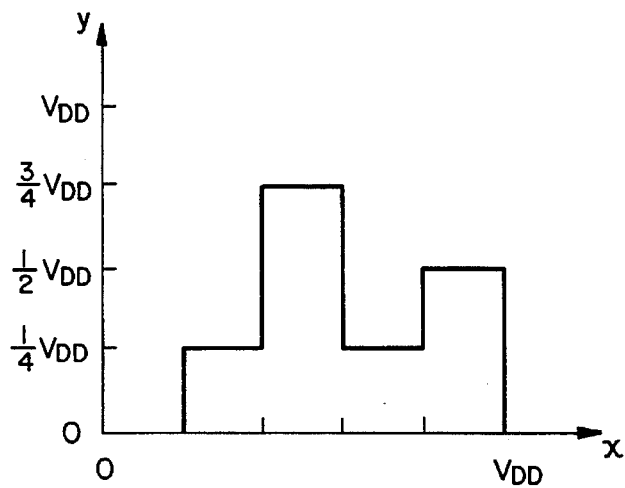
FIG. 28(b) is a diagram showing the characteristics of the multivalued multiple threshold function of the twenty-fourth embodiment.
Figure 28A:
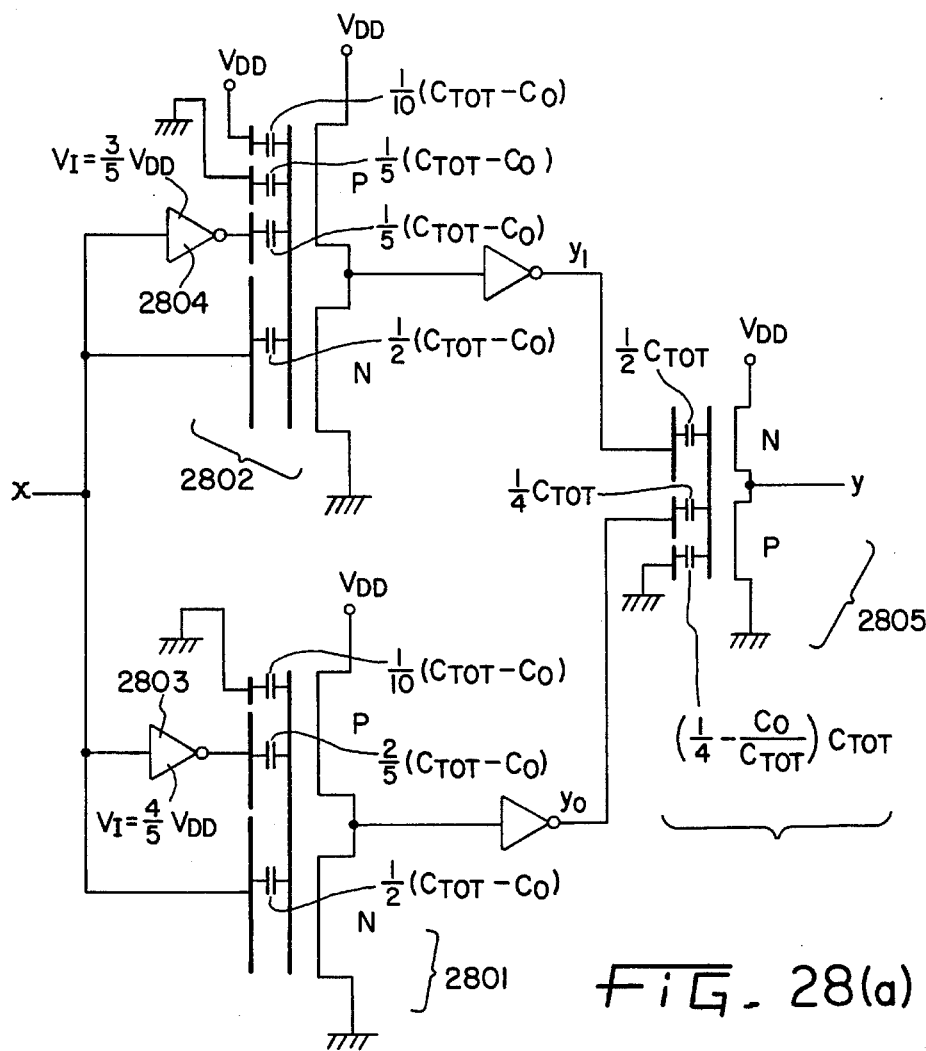
FIG. 28(a) is a circuit diagram showing the twenty-fourth embodiment of the present invention.

FIG. 28(a) is a circuit diagram showing the twenty-fourth embodiment of the present invention; this circuit generates a multivalued multiple-threshold function such as that shown in FIG. 28(b) with respect to an analog signal input x. Reference numerals 2801 and 2802 indicate vMOS gates, while reference numeral 2805 indicates a D/A converter.

The design values of the capacitive coupling coefficients are all as shown in the figure. Reference numerals 2803 and 2804 indicate inverters; the respective inversion voltages thereof are as shown in the figure. With respect to 2801 and 2802, $\beta_R = 1$, and $V_{TN}^* + V_{TP}^* = -(C_0/C_{TOT}) V_{DD}$, which are identical to the previous embodiments of the present invention.

With respect to D/A converter 2805, setting is conducted such that $\beta_R = 1$ and $V_{TN}^* + V_{TP}^* = 0$.

By proceeding in this manner, the following formula results:

$$y = (2y_1 + y_0)/4 \tag{86}$$

Next, the design process of the present circuit will be discussed. Table 7 shows the functions of FIG. 28(b).

Figure 28C:
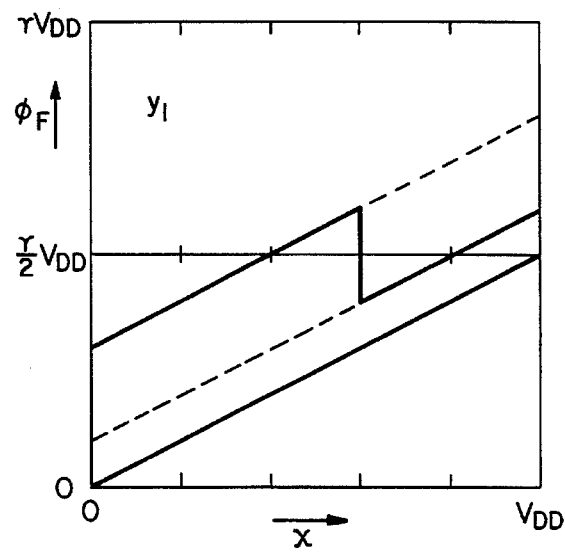
FIG. 28(c) is an FPD diagram of a circuit which outputs $y_1$ as a function of X.
Figure 28D:
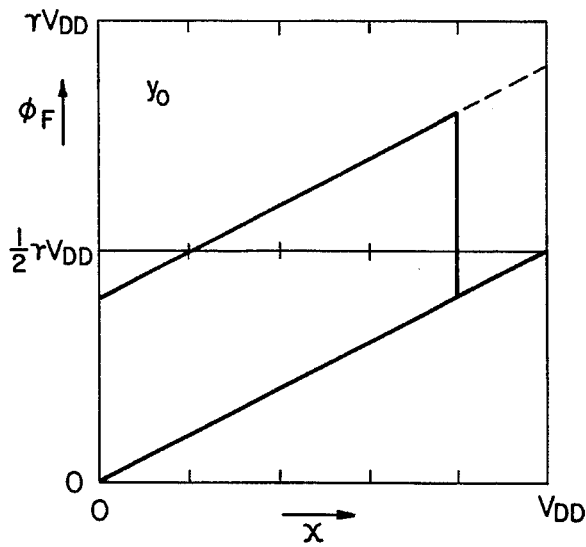
FIG. 28(d) is an FPD diagram of a circuit which outputs $y_0$ as a function of X.

With respect to each range of x, y has a value within a range of 0~3. The results of expressing these values of y as 2-bit binary numbers $y_1$ and $y_0$ are shown in that same table. The FPDs of circuits which output $y_1$ and $y_0$ as a function of x are shown in FIGS. 28(c) and (d). From these FPDs, FIG. 28(a) is designed. If the values of $y_1$ and $y_0$ from Table 7 are substituted into Formula (86), then the characteristics of FIG. 28(b) can be obtained.

The twenty-fourth embodiment of the present invention is a circuit which realizes multivalued multiple-threshold logic, and is a circuit possessing the most powerful calculation functions among multivalued logical circuits. It is clear that by means of identical processes, all functions can be expressed. Furthermore, by making the inversion voltages of inverters 2803 and 2804 variable, it is of course possible to change the functions without changing the hardware. As described above, the present invention can be used extremely effectively in the construction of multivalued logical circuits, and by means of this invention, multivalued logical circuits can be put into practical use for the first time.

(Twenty-fifth Embodiment)

Figure 29A:
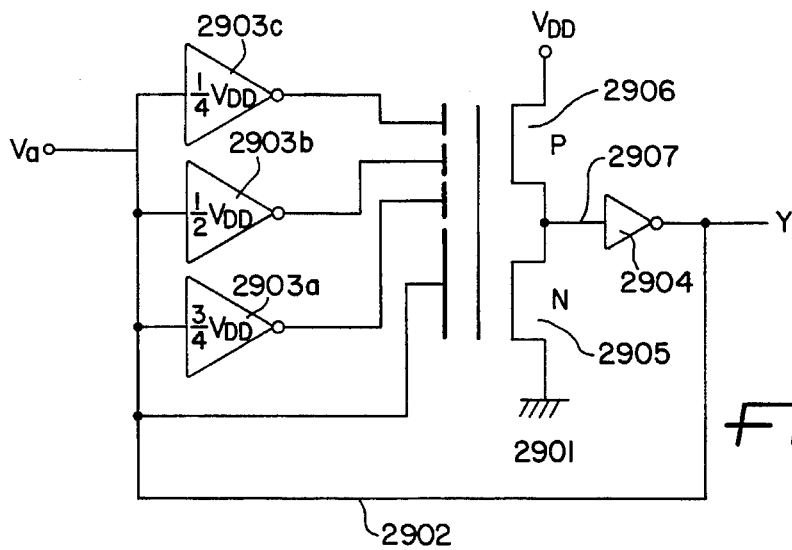
FIG. 29(a) is a circuit diagram showing a twenty-fifth embodiment of the present invention.

Furthermore, using vMOS, it is possible to construct multivalued flipflops which will store multivalued data. An example thereof is shown in FIG. 29(a). This represents the twenty-fifth embodiment of the present invention.

The vMOS inverter 2901, and the inverters 2903a, 2903b, 2903c, and 2904 all have circuitry which is identical to that in the case of the A/D converter shown in FIG. 23 (2301, 2303a, 2303b, 2303c, 2304a). The difference lies in the fact that output signal Y is subjected to feedback to the input side ($V_a$) by means of connection 2902.

Figure 29B:
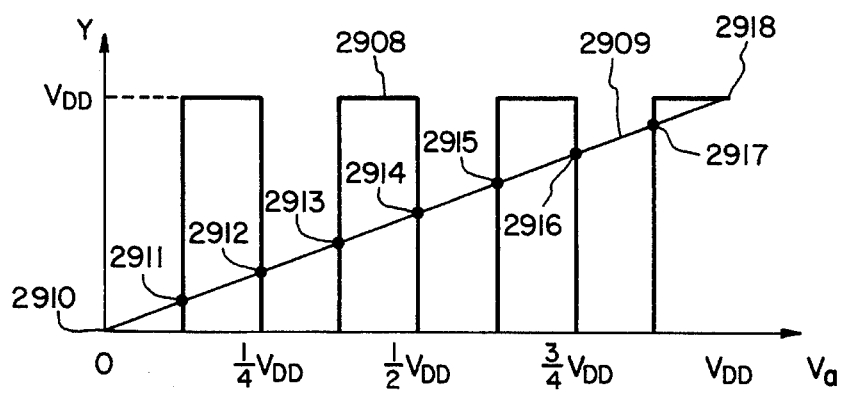
FIG. 29(b) is a diagram showing the relationship between $V_a$ and Y.

The signal Y which is subjected to feedback is a signal after inverter 2904; that is, since the potential of the drain 2907 of the N channel vMOS 2905 and the P channel vMOS 2906 is passed through the inverter 2904 and outputted, the signal is uniquely determined by means of the drain voltage of the N-vMOS and the P-vMOS. The relationship between $V_a$ and Y is shown as characteristic 2908 in FIG. 29(b). This characteristic is identical to that shown in FIG. 23(b). In the circuit shown in FIG. 29(a), feedback is employed so that $Y = V_a$, so that the relationship between Y and $V_a$ must lie on straight line 2909. That is to say, the points of intersection 2910–2918 between characteristics 2908 and 2909 indicate the obtainable values of Y and $V_a$.

However, points of intersection 2911, 2913, 2915, and 2917 are unstable, and in states corresponding to these points, the circuit cannot exist stably. The only points at which the circuits can be in a stable state are points 2910, 2912, 2914, 2916, and 2918.

That is to say, this circuit is capable of storing the 5 values of $V_a$: 0, (¼)$V_{DD}$, (½) $V_{DD}$, (¾) $V_{DD}$, and $V_{DD}$. It is thus possible to construct flipflops which will store 5 values.

(Twenty-sixth Embodiment)

Figure 30A:
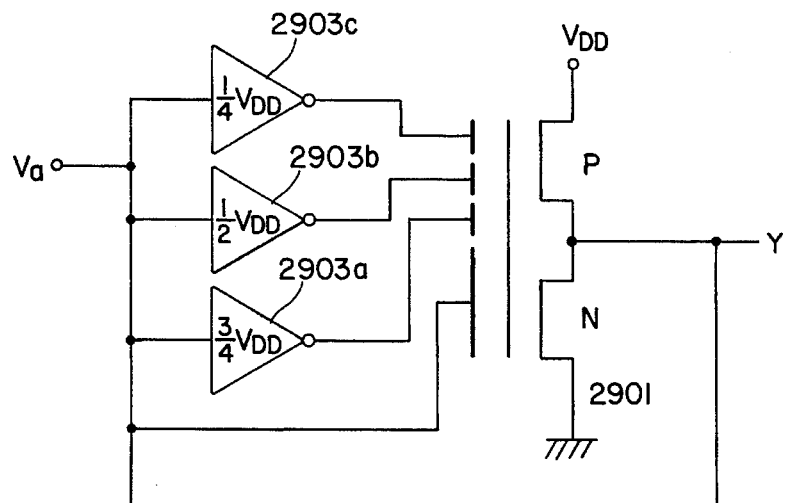
FIG. 30(a) is a circuit diagram showing the twenty-sixth embodiment of the present invention.
Figure 30B:
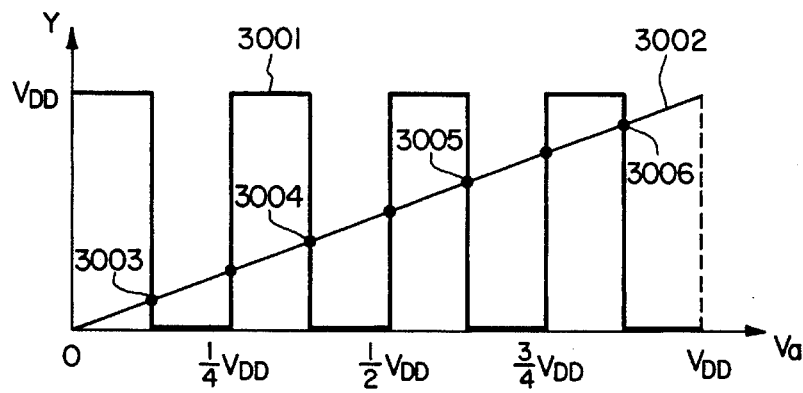
FIG. 30(b) is a diagram showing the relationship between $V_a$ and Y.

FIG. 30(a) is a circuit diagram showing the twenty-sixth embodiment of the present invention. The differences between this embodiment and the twenty-fifth embodiment lie in the fact that the post-output inverter 2904 is omitted in FIG. 30(a); all other points are identical. Accordingly, the numbering of the various parts is identical to that of FIG. 29. Characteristics 3001 and 3002 shown in FIG. 30(b) show the relationship between Y and $V_a$, and the crossing points thereof show the obtainable states of the circuit. The stable points are the points of intersection 3003, 3004, 3005, and 3006; and this circuit is a multivalued flipflop capable of storing the 4 values (⅛) $V_{DD}$, (⅜) $V_{DD}$, (⅝) $V_{DD}$, and (⅞) $V_{DD}$.

As described above, by means of feadbacking the output of the vMOS inverter into the input side of the vMOS, it is possible to realize a function which stores the states.

This feedback may be conducted by means of direct feedback, as described in the twenty-sixth embodiment, or may be carried out by means of feedback via a single stage inverter, as described in the twenty-fifth embodiment. Furthermore, it is of course the case that feedback may be carried out via a vMOS inverter or the like. Since it is clear that it is possible to construct binary digital circuits such as binary flipflops, RS flipflops, JK flipflops, monostable multivibrators, bistable multivibrators, and the like, detailed circuit diagrams thereof will be omitted here.

Figure 31A:
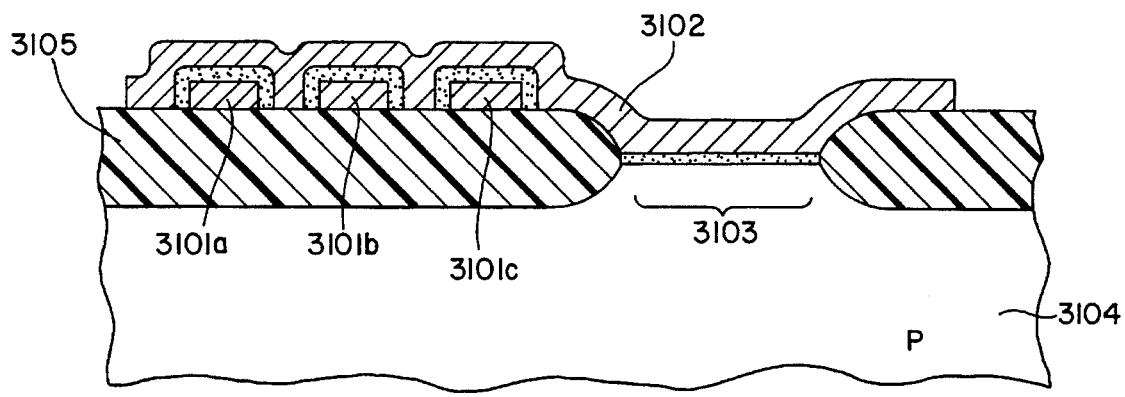
FIG. 31 is a cross-sectional drawing showing the structure of a ν MOS transistor.
Figure 31B:
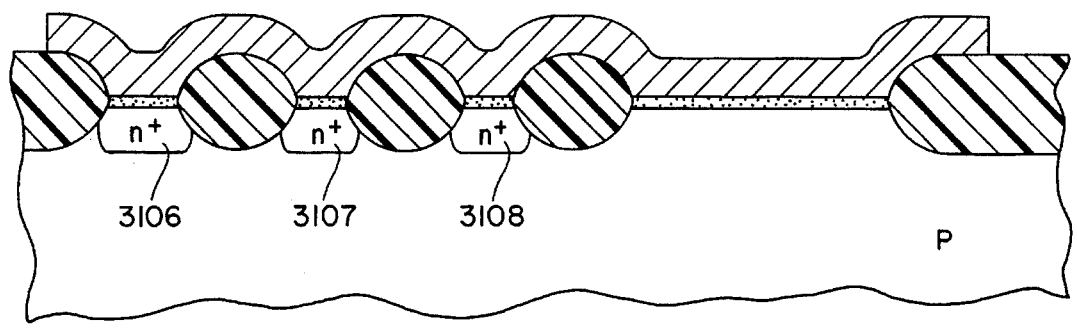

Furthermore, with respect to the construction method of the vMOS, in FIGS. 7, 8(c), and 14, the floating gate is formed by means of a first layer polycrystal silicon 705, and input gates are provided by means of a second layer polycrystal silicon over the floating gate via an insulation layer 708. This may, for example, be undertaken in reverse, as shown in FIG. 31(a). That is to say, the input gates may be formed by means of first layer polycrystal silicon 3101a, 3101b, and 3101c, and above this, a floating gate may be formed by means of a second layer polycrystal silicon 3102. Reference numeral 3103 indicates a N-channel vMOS; a cross sectional view is shown in the direction of the channel width. With this type of structure, it is possible to reduce the capacitive coupling between the floating gate and the silicon 3104 via field oxide film 3105. That is to say, it is possible to reduce the value of $C_0$ to this extent, and to increase g. In other words, it is possible to increase the noise margin. Furthermore, as shown in FIG. 31(b), the input gates may utilize $N^+$ diffusion layers 3106, 3107, and 3108. It is possible to construct the device using a single polycrystal silicon layer, and thus the processing is simplified. In this case, a case was shown in which the $N^+$ diffusion layers were provided within the P substrate; however, it is of course the case that $P^+$ diffusion layers may be employed within N wells.

It is possible to utilize materials other than polycrystal silicon, for example, silicide or metals, in any of the embodiments of the present invention.

(Twenty-seventh, Twenty-eighth, and Twenty-ninth Embodiments)

Figure 32A:
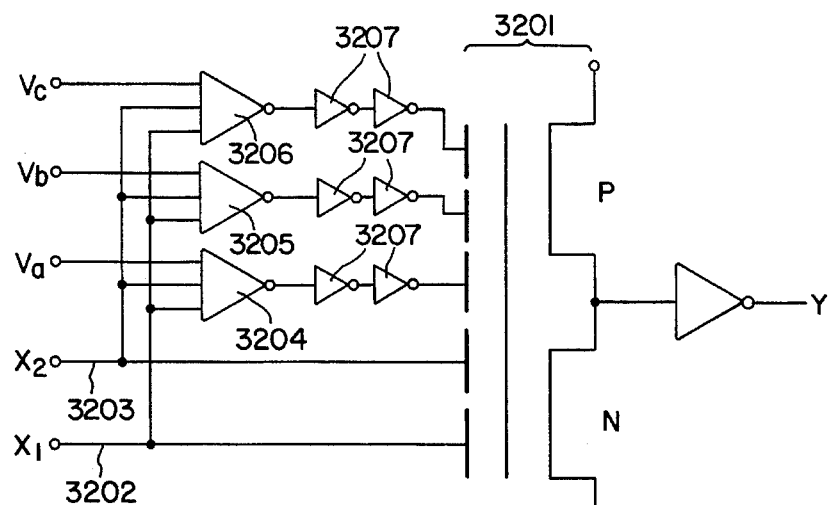
FIG. 32(a) is a circuit diagram showing the twenty-seventh embodiment of the present invention.

FIGS. 32(a), (b), and (c) are circuit diagrams showing, respectively, twenty-seventh, twenty-eighth, and twenty-ninth embodiments of the present invention. These circuits possess functions which are identical to those of the ninth embodiment of the present invention (FIG. 13(a)); the details of the design thereof are omitted here.

In FIG. 32(a), reference numeral 3201 indicates a vMOS inverter, reference numerals 3202 and 3203 indicate input signal lines of binary digital signals $X_1$ and $X_2$, while reference numerals 3204, 3205, and 3206 indicate variable threshold inverters constructed by means of vMOS. The points of difference from the ninth embodiment lie in the fact that the ordinary inverter 3207 is appended in 2 stages. This ordinary inverter is an inverter which inverts a signal 0 and 1, and the threshold value thereof is set to an appropriate value within a range of 0~$V_{DD}$. In this manner, the ordinary inverters rectity the output waveform of inverters 3204~3206 and have the effect of enabling an increase in the noise margin.

Figure 32B:
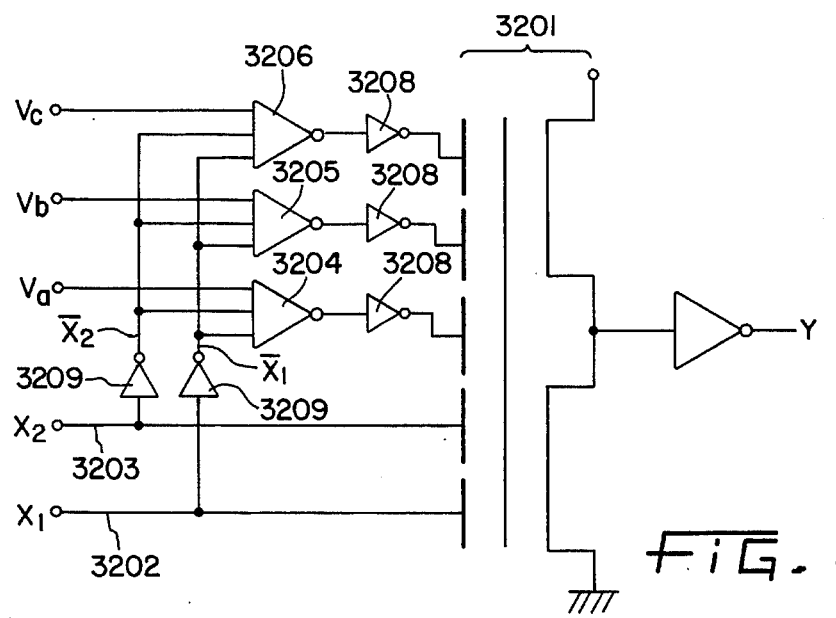
FIG. 32(b) is a circuit diagram showing the twenty-eighth embodiment of the present invention.

The appending of ordinary inverters in order to increase the noise margin can be conducted, for example, as shown in FIG. 32(b). That is to say, a single stage ordinary inverter 3208 is inserted after the variable threshold inverters, and another single stage inverter 3209 is placed before the input. That is to say, the signals $X_1$ and $X_2$ are inputted as inverted signals:

$$\bar{X}_1, \bar{X}_2$$

It is possible to obtain identical results by proceeding in this manner.

Figure 32C:
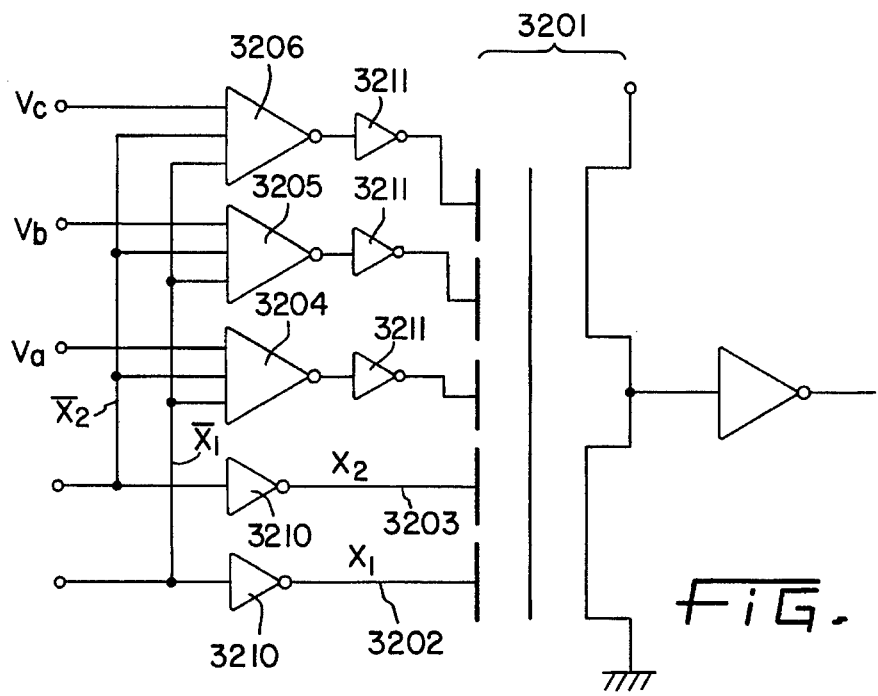
FIG. 32(c) is a circuit diagram showing the twenty-ninth embodiment of the present invention.

Furthermore, the structure shown in FIG. 32(c) may be adopted. That is to say, signals which have passed through single stage inverters 3210 are inputted into the vMOS inverter 3201 as inputs $X_1$ and $X_2$. The values prior to passing through these inverters 3210 are also passed through variable threshold inverters 3204~3206 and ordinary inverters 3207, and then inputted into vMOS inverter 3201. Signals in which the signals $X_1$ and $X_2$ have been effectively passed through a 3-stage inverter are inputted into the vMOS inverter. It is of course the case that the appending of inverters which is discussed here may be conducted where appropriate in all other embodiments of the present invention. In any embodiment, the effect of an increase in the noise margin will be obtainable.

(Thirtieth Embodiment)

Figure 33A:
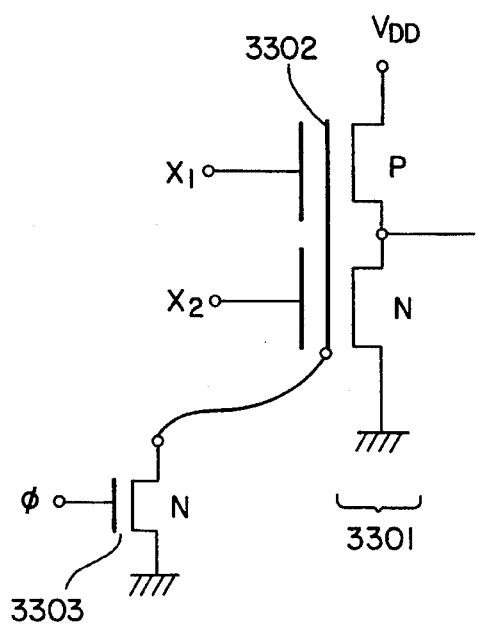
FIG. 33(a) is a circuit diagram showing the thirtieth embodiment of the present invention.
Figure 33B:
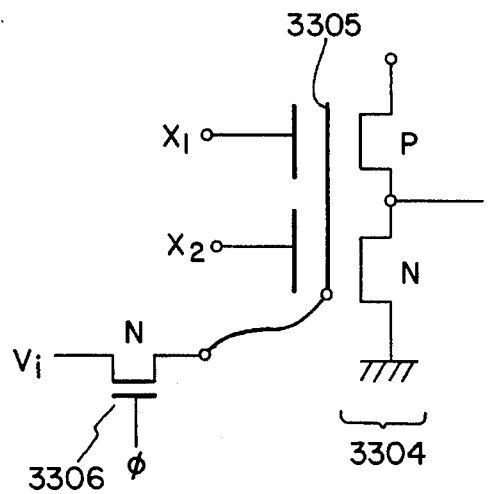
FIG. 33(b) is a circuit diagram showing the thirty-first embodiment of the present invention.

A thirtieth embodiment of the present invention is shown in FIG. 33(a).

Reference numeral 3301 indicates a 2-input vMOS inverter; it is depicted as a representation of a portion of the circuitry of the present invention. The floating gate 3302 is connected to the earth potential via N-MOS transistor 3303. Reference φ indicates a control signal; when the circuit is conducting logical calculations, the value thereof is 0, and floating gate 3302 is cut off from the earth, and is maintained in a potentially floating state. Accordingly, the circuit operations in the case in which φ=0 are identical to those of the other embodiments. When the circuit is conducting calculations, where necessary, φ=$V_{DD}$. At this time, the floating gate is connected to the earth, and $\phi_F$=0. That is to say, the charge within the floating gate is completely discharged. Normally, the discharge of the charge within the floating gate by means of this type of transistor is unnecessary. The reason for this is that normally the floating gate is completely insulated, and there is no entry or exit of charge. However, as a result of the hot electron injection phenomenon and the like, if a small increase or decrease in charge is generated, the inversion voltage of the vMOS inverter varies over time, and faulty circuit operations may occur. In such cases, discharge is necessary. For example, in cases in which the vMOS is subjected to high voltage operation, or in which a vMOS transistor having a short channel for high-speed operation is driven by a large current, the injection of charge is likely to occur. In such a case, the charge may be discharged where necessary by using control signal f as in the present embodiment.

Furthermore, it is also possible to reset the floating gate potential $\phi_F$ to 0 by synchronizing $\phi$ with the system clock and setting $\phi$ to $V_{DD}$ at the conclusion of each calculation cycle. By proceeding in this manner, the respective vMOS inverters will all be placed in an OFF state, so that it is possible to prevent the continuous flow of current, and to bring about a reduction in power dissipation. Because the vMOS can have a variety of potentials, $\phi_F$ having values within a range of 0 to $V_{DD}$, there are cases in which current continues to flow as a result of the method of circuit design. The present embodiment is extremely effective in such cases.

(Thirty-first Embodiments)

FIG. 339(b) shows the thirty-first embodiment of the present invention. In this circuit, floating gate 3305 is connected to signal input Vi via N-MOS 3306. When control signal $\phi$ has a value of $V_{DD}$, then the floating gate potential $\phi_F$ is fixed at Vi. During logical calculations, $\phi$ is set to 0, and the floating gate is placed in a potentially floating state; because the inversion voltage of the vMOS inverter can be altered as a result of the value of Vi, it is possible to vary the circuit operations where necessary. This may be applied to soft-hardware circuits, and thus a new application can be found for vMOS. The value of Vi may be conducted using, for example, the D/A converter circuit of the present invention. By proceeding in this manner, it is possible to easily conduct the setting of various values.

(Thirty-second and Thirty-third Embodiments)

Figure 34A:
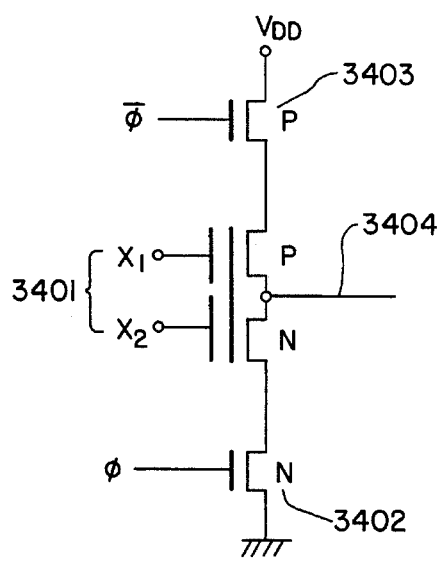
FIG. 34(a) is a circuit diagram showing the thirty-second embodiment of the present invention.

Thirty-second and thirty-third embodiments of the present invention are shown in FIGS. 34(a) and (b), respectively. In the present embodiments, as was discussed with respect to the thirtieth embodiment, a method is provided in which the current flowing through the vMOS inverter is cut off, and the power dissipation is reduced.

FIG. 34(a) shows a circuit in which a N-MOS 3402 and a P-MOS 3403 are connected in series to a vMOS inverter 3401 having a CMOS structure, and switching may be conducted by means of a clock signal $\phi$ and the inverse signal $\bar{\phi}$ thereof, respectively. When the vMOS is conducting logical calculations, $\phi=V_{DD}$, and both the N-MOS and the P-MOS are in a conductive state; however, when calculations are completed, $\phi$ is set equal to 0, and both are placed in an OFF state, so that the vMOS is cut off. The current can be cut, and the data of output terminal 3404 can be maintained. That is to say, it is possible to latch the data.

Figure 34B:
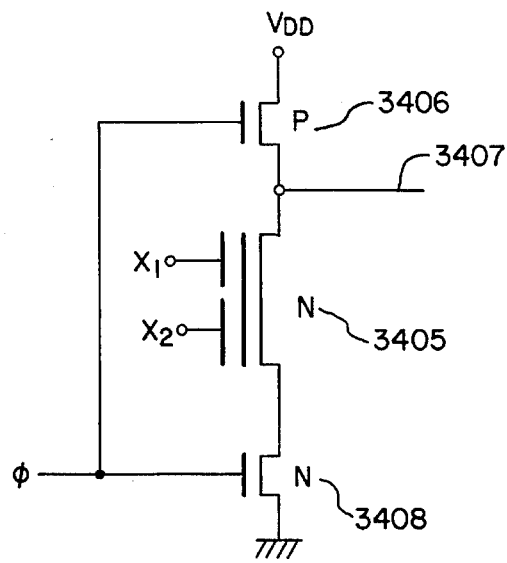
FIG. 34(b) is a circuit diagram showing the thirty-third embodiment of the present invention.

FIG. 34(b) shows the case in which logical calculations are carried out only by an N-channel vMOS 3405. When $\phi=0$, P-MOS 3406 is in an ON state, and output terminal 3407 is subjected to precharge. After the logical inputs $X_1$ and $X_2$ are determined, if $\phi=V_{DD}$, the P-MOS is placed in an OFF state, and the N-MOS 3408 is placed in an ON state. At this time, in accordance with the ON/OFF state of vMOS 3405, a low or high logical level of output 3407 is determined.

By using the circuit of the present embodiment, it is possible to construct, in an extremely simple manner, a so-called domino logical circuit with vMOS.

In the design of the vMOS circuit described above, all design takes place on the basis of $C_{TOT}$ and $C_{TOT}-C_0$. $C_0$ represents the capacity between the floating gate and the silicon substrate, and in the case of a CMOS structure, it is given by the following formula:

$$C_0 = C_0^n + C_0^p \quad (87)$$

Here, $C_0^n$ and $C_0^p$ represent the capacities between the floating gate and the substrate of the N-vMOS and the P-vMOS.

If the potential of the control gates is represented by $V_1$, $V_2, \ldots V_n$, the potential $\phi_F$ of the floating gate is given by the following formula:

$$\phi_F = \frac{C_0}{C_{TOT}} + \sum_{i=1}^{n} \frac{C_i}{C_{TOT}} V_i \quad (88)$$

In the explanations of the present specification, in order to simplify the description, $C_0$ was treated as a fixed value, and $V_0$ (the potential of the substrate) was set equal to 0 in all cases. However, this is not necessarily correct. As a result of operational conditions, $C_0$ itself varies slightly. In the case in which the vMOS transistor is in an ON state, $C_0$ is approximately equal to $C_{O\,X}$ (gate oxide film capacitance). Furthermore, the potential of the channel varies from the source in the direction of the drain; however, if this is seen as being approximately equal to the source potential, large discrepancies will not be generated. Accordingly, in the N-vMOS, it is acceptable to set $V_0$ equal to 0.

However, in cases in which the N-vMOS is used as a source follower, as in reference 107 of FIG. 1 or reference 108 of FIG. 8, the source potential is no longer 0. Furthermore, in the P-channel vMOS, $V_0$ is approximately equal to $V_{DD}$. Even given these effects, the results described above change very little; however, in order to conduct more accurate design, it is possible to compensate in a simple manner by means of slightly adjusting the values of, for example, $V_{Tn}^*$, $V_{Tp}^*$, or $\beta_R$.

Furthermore, if conditions are set such that $C_0/C_{TOT} \ll 1$, then the effects of $C_0$ need not be taken into account. Alternatively, it is possible to take the following countermeasures. For example, the nth control gate may be made a special adjustment gate.

From Formula 88, the following formula results:

$$\phi_F = \frac{1}{C_{TOT}} (C_0 V_0 + C_n V_n) + \sum_{i=1}^{n-1} E_i V_i \quad (89)$$

The variant value of $C_0 V_0$ is represented by $\Delta (C_0 V_0)$. This indicates that variation occurs as a result of changes in $V_0$ and changes in $C_0$; however, if this is set in agreement with the following formula:

$$C_n V_n \gg \Delta(C_0 V_0) \quad (90)$$

this variance will not become a problem. In this case, if conditions are set such that $C_0 + C_n \to C_0$, all expressions may be used in an unchanged manner.

The value of $V_n$ may be set to 0 V, or to $V_{DD}$. Alternatively, other values may be used. By adjusting the value of $V_n$ to a predetermined value, it is possible to finely adjust the characteristics of the vMOS gate.

Industrial Applicability

As described above, in accordance with the present invention, complex logical circuits can be constructed by means of an extremely small number of elements in comparison with conventional technology, and this is extremely advantageous in the move to ultra-largescale integration of logical circuits.

Furthermore, the number of interconnections can be kept to an extremely small number, so that it is possible to greatly increase the operational speed of the circuit. Furthermore, the design of logical circuits can be conducted in a systematic and extremely simple manner, so that the amount of time used for design can be reduced enormously, and fully automated design by means of computers becomes possible. In the present invention, the functions may be changed completely by means of control signals, so that so-called soft hardware circuits can be realized, and this represents a completely new result. Furthermore, it is possible to freely conduct multivalued/binary logical conversion, and moreover, function blocks which are important in multivalued logical circuits can be realized easily, so that the present invention exhibits a number of superior effects.

We claim:

1. A semiconductor device, comprising;
a first neuron MOS transistor having a first semiconductor region of one conductivity type disposed on a substrate, a first source region and a first drain region of a conductivity type opposite to said first semiconductor region provided within said first semiconductor region, a first floating gate electrode having a floating potential and isolated from said first source region and said first drain region, said first floating gate electrode capacitively coupled to said first semiconductor region by means of a first insulation film, a plurality of control gate electrodes capacitively coupled to said first floating gate electrode by means of a second insulation film;
a means for inputting a first signal into said first neuron MOS transistor connected to a first control gate electrode; and
a first inverter comprising at least one stage and having an input and an output, said input connected to said means for inputting a first signal and said output connected to a second control gate electrode.

2. A semiconductor device in accordance with claim 1, further comprising a second neuron MOS transistor having a second source region, a second drain region, and a second semiconductor region of conductivity types opposite to said first source region, said first drain region, and said first semiconductor region, respectively, and a second floating gate electrode electrically connected to said first floating gate electrode.

3. A semiconductor device in accordance with claim 1, wherein said second control gate electrode comprises a plurality of second control gate electrodes, said first inverter comprises a plurality of first inverters, each said first inverter respectively having a predetermined inversion voltage at which an input signal is inverted, each said first inverter having an input connected to said means for inputting a first signal and each one of said plurality of first inverters having an output respectively connected to one of said second control gate electrodes.

4. A semiconductor device in accordance with claim 1, wherein said second control gate electrode comprises a plurality of second control gate electrodes, said first inverter comprises a plurality of first inverters, said first inverters respectively having a predetermined inversion voltage at which an input signal is inverted, each said first inverter having an input connected to said means for inputting a first signal, and each said first inverter having an output respectively connected to one of said second control gate electrodes through second stage inverters.

5. A semiconductor device in accordance with claim 1, wherein said first neuron MOS transistor further comprises a third control gate electrode, said third control gate electrode connected to a means for inputting a second signal which is independent of said first signal.

6. A semiconductor device in accordance with claim 5, wherein said second signal is a direct current voltage of a predetermined level.

7. A semiconductor device in accordance with claim 1, wherein the capacitive coupling coefficient between said first control gate electrode and said first floating gate electrode is substantially equal to the sum of the respective capacitive coupling coefficients between control gate electrodes other than said first control gate electrode and said first floating gate electrode.

8. A semiconductor device in accordance with claim 1, wherein said first inverter comprises a third neuron MOS transistor having a third source region, a third drain region, a third semiconductor region, a third floating gate electrode, and a fourth control gate electrode connected to said means for inputting a first signal.

9. A semiconductor device in accordance with claim 8, wherein said means for inputting a first signal comprises a plurality of means for respectively inputting a plurality of signals, said first control gate electrode comprises a plurality of first control gate electrodes, and said fourth control gate electrode comprises a plurality of fourth control gate electrodes, said plurality of first control gate electrodes respectively connected to said plurality of means for inputting a signal, said plurality of fourth control gate electrodes respectively connected to said plurality of means for inputting a signal.

10. A semiconductor device in accordance with claim 9, wherein the respective capacitive coupling coefficients between each said first control gate electrode and said first floating gate electrode are approximately equal.

11. A semiconductor device in accordance with claim 8, wherein said first inverter further comprises a fourth neuron MOS transistor having a fourth source region, a fourth drain region, and a fourth semiconductor region of conductivity types opposite to said third source region, said third drain region, and said third semiconductor region, respectively, and a fourth floating gate electrode electrically connected to said third floating gate electrode.

12. A semiconductor device in accordance with claim 1, wherein said first inverter comprises a third neuron MOS transistor having a third source region, a third drain region, a third semiconductor region, a third floating gate electrode, a fourth control gate electrode connected to said means for inputting a first signal, and a fifth control gate electrode connected to a means for inputting a third signal, said third signal independent of said first signal.

13. A semiconductor device in accordance with claim 12, wherein the capacitive coupling coefficient between said fifth control gate electrode and said third floating gate electrode is approximately equal to the capacitive coupling coefficient between said fourth control gate electrode and said third floating gate electrode.

14. A semiconductor device in accordance with claim 12, wherein said fifth control gate electrode comprises a plurality of fifth control gate electrodes, and the capacitive coupling coefficient between said fourth control gate electrode and said third floating gate electrode is approximately equal to the sum of the respective capacitive coupling coefficients between each said fifth control gate electrode and said third floating gate electrode.

15. A semiconductor device in accordance with claim 14, further comprising a flipflop, wherein a said fifth control gate is connected to an output of said flipflop.

16. A semiconductor device in accordance with claim 8, further comprising a fifth neuron MOS transistor comprising a fifth source region, a fifth drain region, and a fifth semiconductor region, wherein a load element is connected to said fifth source region and said fifth source region is connected to said means for inputting a first signal.

17. A semiconductor device in accordance with claim 16, wherein said fifth neuron MOS transistor further comprises n control gate electrodes.

18. A semiconductor device in accordance with claim 17, wherein said fifth neuron MOS transistor further comprises a fifth floating gate electrode, and the respective capacitive coupling coefficients between each one of said n control gate electrodes and said fifth floating gate electrode are approximately equal.

19. A semiconductor device in accordance with claim 17, wherein if the respective capacitive coupling coefficients between each one of said n control gate electrodes and said fifth floating gate electrode are represented by $C_1, C_2, C_3, \ldots C_n$, then $C_2=2\times C_1$, $C_3=2^2\times C_1$, $C_4=2^3\times C_1, \ldots, C_n=2^{n-1}\times C_1$.

20. A semiconductor device in accordance with claim 16, wherein said fifth neuron MOS transistor further comprises a sixth control gate electrode connected to a means for inputting a fixed direct current voltage into said fifth neuron MOS transistor.

21. A semiconductor device in accordance with claim 16, wherein said load element comprises a sixth neuron MOS transistor having a sixth source region, a sixth drain region and a sixth semiconductor region of conductivity types opposite to said fifth source region, said fifth drain region and said fifth semiconductor region, respectively.

22. A semiconductor device in accordance with claim 21, wherein said sixth neuron MOS transistor further comprises a sixth floating gate electrode, if $V_{Tn}^*$ equals the threshold voltage as seen from said fifth floating gate electrode, and $V_{Tp}^*$ equals the threshold voltage as seen from said sixth floating gate, then $V_{Tp}^*$ is set to one of a value equal to and a value larger than $V_{Tn}^*$.

23. A semiconductor device in accordance with claim 21, including an N type inversion layer between said fifth source region and said fifth drain region when said fifth floating gate electrode has a negative potential with respect to said fifth source region potential.

24. A semiconductor device in accordance with claim 1, wherein a control gate electrode is connected to a means for inputting a signal which is determined by the potential of said first drain region.

25. A semiconductor device in accordance with claim 12, wherein one of said fourth control gate electrode and said fifth control gate electrode is connected to a means for inputting a signal which is determined by the potential of said first drain region.

26. A semiconductor device in accordance with claim 12, wherein said first floating gate electrode is connected to one of a source region and a drain region.

27. A semiconductor device in accordance with claim 2, wherein said second control gate electrode comprises a plurality of second control gate electrodes, said first inverter comprises a plurality of first inverters, each said first inverter respectively having a predetermined inversion voltage at which an input signal is inverted, each said first inverter having an input connected to said means for inputting a first signal and each one of said plurality of first inverters having an output respectively connected to one of said second control gate electrodes.

28. A semiconductor device in accordance with claim 2, wherein said second control gate electrode comprises a plurality of second control gate electrodes, said first inverter comprises a plurality of first inverters, said first inverters respectively having a predetermined inversion voltage at which an input signal is inverted, each said first inverter having an input connected to said means for inputting a first signal, and each said first inverter having an output respectively connected to one of said second control gate electrodes through second stage inverters.

29. A semiconductor device in accordance with claim 2, wherein said first inverter comprises a third neuron MOS transistor having a third source region, a third drain region, a third semiconductor region, a third floating gate electrode and a fourth control gate electrode connected to said means for inputting a first signal.

30. A semiconductor device in accordance with claim 2, wherein said first inverter comprises a third neuron MOS transistor having a third source region, a third drain region, a third semiconductor region, a third floating gate electrode, a fourth control gate electrode connected to said means for inputting a first signal, and a fifth control gate electrode connected to a means for inputting a third signal, said third signal independent of said first signal.

31. A semiconductor device in accordance with claim 29, wherein said means for inputting a first signal comprises a plurality of means for respectively inputting a plurality of signals, said first control gate electrode comprises a plurality of first control gate electrodes, and said fourth control gate electrode comprises a plurality of fourth control gate electrodes, said plurality of first control gate electrodes respectively connected to said plurality of means for inputting a signal, said plurality of fourth control gate electrodes respectively connected to said plurality of means for inputting a signal.

32. A semiconductor device in accordance with claim 31, wherein the respective capacitive coupling coefficients between each said first control gate electrode and said first floating gate electrode are approximately equal.

33. A semiconductor device in accordance with claim 30, wherein said first inverter further comprises a fourth neuron MOS transistor having a fourth source region, a fourth drain region, and a fourth semiconductor region of conductivity types opposite to said third source region, said third drain region, and said third semiconductor region, respectively, and a fourth floating gate electrode electrically connected to said third floating gate electrode.

34. A semiconductor device in accordance with claim 30, wherein the capacitive coupling coefficient between said fifth control gate electrode and said third floating gate electrode is approximately equal to the capacitive coupling coefficient between said fourth control gate electrode and said third floating gate electrode.

35. A semiconductor device in accordance with claim 30, wherein said fifth control gate electrode comprises a plurality of fifth control gate electrodes, and the capacitive coupling coefficient between said fourth control gate electrode and said third floating gate electrode is approximately equal to the sum of the respective capacitive coupling coefficients between each said fifth control gate electrode and said third floating gate electrode.

36. A semiconductor device in accordance with claim 35, further comprising a flipflop, wherein a said fifth control gate is connected to an output of said flipflop.

* * * * *

UNITED STATES PATENT AND TRADEMARK OFFICE
CERTIFICATE OF CORRECTION

PATENT NO. : 5,587,668
DATED : December 24, 1996
INVENTOR(S) : Tadashi Shibata and Tadahiro Ohmi It is certified that error appears in the above-indentified patent and that said Letters Patent is hereby corrected as shown below:

On the title page, under section [22], change "Mar. 21, 1993" to --Mar. 21, 1992--.

Signed and Sealed this

Eighteenth Day of March, 1997

*Attest:*

BRUCE LEHMAN

*Attesting Officer*   *Commissioner of Patents and Trademarks*